(12) United States Patent
Fallon

(10) Patent No.: US 7,378,992 B2
(45) Date of Patent: *May 27, 2008

(54) CONTENT INDEPENDENT DATA COMPRESSION METHOD AND SYSTEM

(75) Inventor: James J. Fallon, Armonk, NY (US)

(73) Assignee: Realtime Data LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/400,533

(22) Filed: Apr. 8, 2006

(65) Prior Publication Data

US 2006/0181442 A1    Aug. 17, 2006

Related U.S. Application Data

(63) Continuation of application No. 10/668,768, filed on Sep. 22, 2003, now Pat. No. 7,161,506, which is a continuation of application No. 10/016,355, filed on Oct. 29, 2001, now Pat. No. 6,624,761, which is a continuation-in-part of application No. 09/705,446, filed on Nov. 3, 2000, now Pat. No. 6,309,424, which is a continuation of application No. 09/210,491, filed on Dec. 11, 1998, now Pat. No. 6,195,024.

(51) Int. Cl.
*H03M 7/34* (2006.01)
(52) U.S. Cl. ............................ 341/51; 341/65; 341/67; 341/87
(58) Field of Classification Search .................. 341/50, 341/51, 67, 75, 79
See application file for complete search history.

(56) References Cited

U.S. PATENT DOCUMENTS

| 4,302,775 | A | 11/1981 | Widergren et al. |
| 4,394,774 | A | 7/1983 | Widergren et al. |
| 4,574,351 | A | 3/1986 | Dang et al. |
| 4,593,324 | A | 6/1986 | Ohkubo et al. |
| 4,682,150 | A | 7/1987 | Mathes et al. |
| 4,730,348 | A | 3/1988 | MacCrisken |

(Continued)

FOREIGN PATENT DOCUMENTS

DE    4127518    2/1992

(Continued)

OTHER PUBLICATIONS

"Operating System Platform Abstraction Method", IBM Technical Disclosure Bulletin, Feb. 1995, vol. 38, Issue No. 2, pp. 343-344.

(Continued)

*Primary Examiner*—Linh V Nguyen
(74) *Attorney, Agent, or Firm*—Ropes & Gray LLP

(57) ABSTRACT

Systems and methods for providing fast and efficient data compression using a combination of content independent data compression and content dependent data compression. In one aspect, a method for compressing data comprises the steps of: analyzing a data block of an input data stream to identify a data type of the data block, the input data stream comprising a plurality of disparate data types; performing content dependent data compression on the data block, if the data type of the data block is identified; performing content independent data compression on the data block, if the data type of the data block is not identified.

45 Claims, 34 Drawing Sheets

U.S. PATENT DOCUMENTS

| | | |
|---|---|---|
| 4,804,959 A | 2/1989 | Makansi et al. |
| 4,870,415 A | 9/1989 | Van Maren et al. |
| 4,872,009 A | 10/1989 | Tsukiyama et al. |
| 4,876,541 A | 10/1989 | Storer |
| 4,888,812 A | 12/1989 | Dinan et al. |
| 4,906,995 A | 3/1990 | Swanson |
| 4,929,946 A | 5/1990 | O'Brien et al. |
| 4,965,675 A | 10/1990 | Hori et al. |
| 4,988,998 A | 1/1991 | O'Brien |
| 5,028,922 A | 7/1991 | Huang |
| 5,045,848 A | 9/1991 | Fascenda |
| 5,045,852 A | 9/1991 | Mitchell et al. |
| 5,046,027 A | 9/1991 | Taaffe et al. |
| 5,049,881 A | 9/1991 | Gibson et al. |
| 5,091,782 A | 2/1992 | Krause et al. |
| 5,097,261 A | 3/1992 | Langdon, Jr. et al. |
| 5,113,522 A | 5/1992 | Dinwiddie, Jr. et al. |
| 5,121,342 A | 6/1992 | Szymborski |
| 5,150,430 A | 9/1992 | Chu |
| 5,159,336 A | 10/1992 | Rabin et al. |
| 5,175,543 A | 12/1992 | Lantz |
| 5,179,651 A | 1/1993 | Taaffe et al. |
| 5,187,793 A | 2/1993 | Keith et al. |
| 5,191,431 A | 3/1993 | Hasegawa et al. |
| 5,204,756 A | 4/1993 | Chevion et al. |
| 5,209,220 A | 5/1993 | Hiyama et al. |
| 5,212,742 A | 5/1993 | Normile et al. |
| 5,226,176 A | 7/1993 | Westaway et al. |
| 5,227,893 A | 7/1993 | Ett |
| 5,231,492 A | 7/1993 | Dangi et al. |
| 5,237,460 A | 8/1993 | Miller et al. |
| 5,237,675 A * | 8/1993 | Hannon, Jr. .............. 710/68 |
| 5,243,341 A | 9/1993 | Seroussi et al. |
| 5,243,348 A | 9/1993 | Jackson |
| 5,247,638 A | 9/1993 | O'Brien et al. |
| 5,247,646 A | 9/1993 | Osterlund et al. |
| 5,263,168 A | 11/1993 | Toms et al. |
| 5,270,832 A | 12/1993 | Balkanski et al. |
| 5,287,420 A | 2/1994 | Barrett |
| 5,293,379 A | 3/1994 | Carr |
| 5,307,497 A | 4/1994 | Feigenbaum et al. |
| 5,309,555 A | 5/1994 | Akins et al. |
| 5,355,498 A | 10/1994 | Provino et al. |
| 5,357,614 A | 10/1994 | Pattisam et al. |
| 5,379,036 A | 1/1995 | Storer |
| 5,379,757 A | 1/1995 | Hiyama et al. |
| 5,381,145 A | 1/1995 | Allen et al. |
| 5,394,534 A | 2/1995 | Kulakowski et al. |
| 5,396,228 A | 3/1995 | Garahi |
| 5,400,401 A | 3/1995 | Wasilewski et al. |
| 5,403,639 A | 4/1995 | Belsan et al. |
| 5,406,278 A | 4/1995 | Graybill et al. |
| 5,406,279 A | 4/1995 | Anderson et al. |
| 5,412,384 A | 5/1995 | Chang et al. |
| 5,414,850 A | 5/1995 | Whiting |
| 5,420,639 A | 5/1995 | Perkins |
| 5,434,983 A | 7/1995 | Yaso et al. |
| 5,452,287 A | 9/1995 | Dicecco |
| 5,461,679 A | 10/1995 | Normile et al. |
| 5,467,087 A | 11/1995 | Chu |
| 5,471,206 A | 11/1995 | Allen et al. |
| 5,479,587 A | 12/1995 | Campbell et al. |
| 5,483,470 A | 1/1996 | Alur et al. |
| 5,486,826 A | 1/1996 | Remillard |
| 5,495,244 A | 2/1996 | Je-chang et al. |
| 5,506,844 A | 4/1996 | Rao |
| 5,506,872 A | 4/1996 | Mohler |
| 5,530,845 A | 6/1996 | Hiatt |
| 5,533,051 A | 7/1996 | James |
| 5,535,356 A | 7/1996 | Kim et al. |
| 5,537,658 A | 7/1996 | Bakke et al. |
| 5,557,551 A | 9/1996 | Craft |
| 5,557,668 A | 9/1996 | Brady |
| 5,557,749 A | 9/1996 | Norris |
| 5,561,824 A | 10/1996 | Carreiro et al. |
| 5,563,961 A | 10/1996 | Rynderman et al. |
| 5,574,952 A | 11/1996 | Brady et al. |
| 5,574,953 A | 11/1996 | Rust et al. |
| 5,583,500 A | 12/1996 | Allen et al. |
| 5,590,306 A | 12/1996 | Watanabe et al. |
| 5,596,674 A | 1/1997 | Bhandari et al. |
| 5,604,824 A | 2/1997 | Chui et al. |
| 5,606,706 A | 2/1997 | Takamoto et al. |
| 5,611,024 A | 3/1997 | Campbell et al. |
| 5,612,788 A | 3/1997 | Stone |
| 5,613,069 A | 3/1997 | Walker |
| 5,615,017 A | 3/1997 | Choi et al. |
| 5,621,820 A | 4/1997 | Rynderman et al. |
| 5,623,623 A | 4/1997 | Kim et al. |
| 5,623,701 A | 4/1997 | Bakke et al. |
| 5,627,534 A | 5/1997 | Craft |
| 5,627,995 A | 5/1997 | Miller et al. |
| 5,629,732 A | 5/1997 | Moskowitz et al. |
| 5,630,092 A | 5/1997 | Carreiro et al. |
| 5,635,632 A | 6/1997 | Fay et al. |
| 5,635,932 A | 6/1997 | Shinagawa et al. |
| 5,638,498 A | 6/1997 | Tyler et al. |
| 5,640,158 A | 6/1997 | Okayama et al. |
| 5,642,506 A | 6/1997 | Lee |
| 5,649,032 A | 7/1997 | Burt et al. |
| 5,652,795 A | 7/1997 | Dillon et al. |
| 5,652,857 A | 7/1997 | Shimoi et al. |
| 5,652,917 A | 7/1997 | Maupin et al. |
| 5,654,703 A | 8/1997 | Clark, II |
| 5,655,138 A | 8/1997 | Kikinis |
| 5,666,560 A | 9/1997 | Moertl et al. |
| 5,668,737 A | 9/1997 | Iler |
| 5,671,389 A | 9/1997 | Saliba |
| 5,675,333 A | 10/1997 | Boursier et al. |
| 5,686,916 A | 11/1997 | Bakhmutsky |
| 5,694,619 A | 12/1997 | Konno |
| 5,696,927 A | 12/1997 | MacDonald et al. |
| 5,703,793 A | 12/1997 | Wise et al. |
| 5,715,477 A | 2/1998 | Kikinis |
| 5,717,393 A | 2/1998 | Nakano et al. |
| 5,717,394 A | 2/1998 | Schwartz et al. |
| 5,719,862 A | 2/1998 | Lee et al. |
| 5,721,958 A | 2/1998 | Kikinis |
| 5,724,475 A | 3/1998 | Kirsten |
| 5,729,228 A | 3/1998 | Franaszek et al. |
| 5,748,904 A | 5/1998 | Huang et al. |
| 5,757,852 A | 5/1998 | Kericevic et al. |
| 5,771,340 A | 6/1998 | Nakazato et al. |
| 5,778,411 A | 7/1998 | DeMoss et al. |
| 5,781,767 A | 7/1998 | Inoue et al. |
| 5,784,572 A | 7/1998 | Rostoker et al. |
| 5,787,487 A | 7/1998 | Hashimoto et al. |
| 5,796,864 A | 8/1998 | Callahan |
| 5,799,110 A | 8/1998 | Israelsen et al. |
| 5,805,932 A | 9/1998 | Kawashima et al. |
| 5,808,660 A | 9/1998 | Sekine et al. |
| 5,809,176 A | 9/1998 | Yajima |
| 5,809,337 A | 9/1998 | Hannah et al. |
| 5,812,789 A | 9/1998 | Diaz et al. |
| 5,818,368 A | 10/1998 | Langley |
| 5,818,369 A * | 10/1998 | Withers .................. 341/107 |
| 5,818,530 A | 10/1998 | Canfield et al. |
| 5,819,215 A | 10/1998 | Dobson et al. |
| 5,825,424 A | 10/1998 | Canfield et al. |
| 5,825,830 A * | 10/1998 | Kopf ........................ 375/340 |
| 5,832,037 A | 11/1998 | Park |
| 5,832,126 A | 11/1998 | Tanaka |
| 5,836,003 A * | 11/1998 | Sadeh ........................ 341/51 |
| 5,838,996 A | 11/1998 | deCarmo |

| | | |
|---|---|---|
| 5,839,100 A | 11/1998 | Wegener |
| 5,841,979 A | 11/1998 | Schulhof et al. |
| 5,847,762 A | 12/1998 | Canfield et al. |
| 5,861,824 A | 1/1999 | Ryu et al. |
| 5,861,920 A | 1/1999 | Mead et al. |
| 5,864,342 A | 1/1999 | Kajiya et al. |
| 5,867,167 A | 2/1999 | Deering |
| 5,867,602 A | 2/1999 | Zandi et al. |
| 5,870,036 A | 2/1999 | Franaszek et al. |
| 5,870,087 A | 2/1999 | Chau |
| 5,872,530 A | 2/1999 | Domyo et al. |
| 5,883,975 A | 3/1999 | Narita et al. |
| 5,886,655 A | 3/1999 | Rust |
| 5,889,961 A | 3/1999 | Dobbek |
| 5,915,079 A | 6/1999 | Vondran, Jr. et al. |
| 5,917,438 A | 6/1999 | Ando |
| 5,920,326 A | 7/1999 | Rentschler et al. |
| 5,936,616 A | 8/1999 | Torborg, Jr. et al. |
| 5,949,355 A | 9/1999 | Panaoussis |
| 5,955,976 A | 9/1999 | Heath |
| 5,960,465 A | 9/1999 | Adams |
| 5,964,842 A | 10/1999 | Packard |
| 5,968,149 A | 10/1999 | Jaquette et al. |
| 5,973,630 A * | 10/1999 | Heath .......................... 341/87 |
| 5,974,235 A | 10/1999 | Nunally et al. |
| 5,974,471 A | 10/1999 | Belt |
| 5,978,483 A | 11/1999 | Thompson, Jr. et al. |
| 5,982,723 A | 11/1999 | Kamatani |
| 5,991,515 A | 11/1999 | Fall et al. |
| 5,996,033 A | 11/1999 | Chiu-Hao |
| 6,000,009 A | 12/1999 | Brady |
| 6,002,411 A | 12/1999 | Dye |
| 6,003,115 A | 12/1999 | Spear et al. |
| 6,008,743 A | 12/1999 | Jaquette |
| 6,011,901 A | 1/2000 | Kirsten |
| 6,014,694 A | 1/2000 | Aharoni et al. |
| 6,026,217 A | 2/2000 | Adiletta |
| 6,028,725 A | 2/2000 | Blumenau |
| 6,031,939 A | 2/2000 | Gilbert et al. |
| 6,032,148 A | 2/2000 | Wilkes |
| 6,061,398 A | 5/2000 | Satoh et al. |
| 6,073,232 A | 6/2000 | Kroeker et al. |
| 6,075,470 A | 6/2000 | Little et al. |
| 6,091,777 A | 7/2000 | Guetz et al. |
| 6,094,634 A | 7/2000 | Yahagi et al. |
| 6,097,520 A | 8/2000 | Kadnier |
| 6,104,389 A | 8/2000 | Ando |
| 6,105,130 A | 8/2000 | Wu et al. |
| 6,128,412 A | 10/2000 | Satoh |
| 6,141,053 A | 10/2000 | Saukkonen |
| 6,145,069 A | 11/2000 | Dye |
| 6,169,241 B1 | 1/2001 | Shimizu |
| 6,172,936 B1 | 1/2001 | Kitazaki |
| 6,173,381 B1 | 1/2001 | Dye |
| 6,182,125 B1 | 1/2001 | Borella et al. |
| 6,192,082 B1 | 2/2001 | Moriarty et al. |
| 6,195,024 B1 | 2/2001 | Fallon |
| 6,195,465 B1 | 2/2001 | Zandi et al. |
| 6,222,886 B1 | 4/2001 | Yogeshwar |
| 6,225,922 B1 | 5/2001 | Norton |
| 6,226,667 B1 | 5/2001 | Matthews et al. |
| 6,226,740 B1 | 5/2001 | Iga |
| 6,253,264 B1 | 6/2001 | Sebastian |
| 6,272,178 B1 * | 8/2001 | Nieweglowski et al. .......................... 375/240.03 |
| 6,272,627 B1 | 8/2001 | Mann |
| 6,272,628 B1 | 8/2001 | Aguilar et al. |
| 6,282,641 B1 | 8/2001 | Christensen |
| 6,308,311 B1 | 10/2001 | Carmichael et al. |
| 6,309,424 B1 | 10/2001 | Fallon |
| 6,317,714 B1 | 11/2001 | Del Castillo et al. |
| 6,330,622 B1 | 12/2001 | Schaefer |
| 6,345,307 B1 | 2/2002 | Booth |
| 6,392,567 B2 * | 5/2002 | Satoh .......................... 341/51 |
| 6,404,931 B1 | 6/2002 | Chen et al. |
| 6,421,387 B1 | 7/2002 | Rhee |
| 6,434,168 B1 | 8/2002 | Kari |
| 6,434,695 B1 | 8/2002 | Esfahani et al. |
| 6,442,659 B1 | 8/2002 | Blumenau |
| 6,449,682 B1 | 9/2002 | Toorians |
| 6,452,602 B1 | 9/2002 | Morein |
| 6,463,509 B1 | 10/2002 | Teoman et al. |
| 6,487,640 B1 | 11/2002 | Lipasti |
| 6,489,902 B2 | 12/2002 | Heath |
| 6,513,113 B1 | 1/2003 | Kobayashi |
| 6,529,633 B1 | 3/2003 | Easwar et al. |
| 6,532,121 B1 | 3/2003 | Rust et al. |
| 6,539,456 B2 | 3/2003 | Stewart |
| 6,542,644 B1 | 4/2003 | Satoh |
| 6,577,254 B2 | 6/2003 | Rasmussen |
| 6,590,609 B1 | 7/2003 | Kitade et al. |
| 6,601,104 B1 | 7/2003 | Fallon |
| 6,604,040 B2 | 8/2003 | Kawasaki et al. |
| 6,604,158 B1 | 8/2003 | Fallon |
| 6,606,040 B2 * | 8/2003 | Abdat .......................... 341/87 |
| 6,606,413 B1 | 8/2003 | Zeineh |
| 6,609,223 B1 | 8/2003 | Wolfgang |
| 6,618,728 B1 | 9/2003 | Rail |
| 6,624,761 B2 | 9/2003 | Fallon |
| 6,650,261 B2 * | 11/2003 | Nelson et al. .............. 341/106 |
| 6,661,839 B1 | 12/2003 | Ishida et al. |
| 6,661,845 B1 | 12/2003 | Herath |
| 6,704,840 B2 | 3/2004 | Nalawadi et al. |
| 6,711,709 B1 | 3/2004 | York |
| 6,717,534 B2 | 4/2004 | Yokose |
| 6,731,814 B2 | 5/2004 | Zeck et al. |
| 6,745,282 B2 | 6/2004 | Okada et al. |
| 6,748,457 B2 | 6/2004 | Fallon et al. |
| 6,756,922 B2 | 6/2004 | Ossia |
| 6,810,434 B2 | 10/2004 | Muthujumaraswathy et al. |
| 6,885,316 B2 | 4/2005 | Mehring |
| 6,885,319 B2 * | 4/2005 | Geiger et al. .................. 341/51 |
| 6,909,383 B2 | 6/2005 | Shokrollahi et al. |
| 6,944,740 B2 | 9/2005 | Abali et al. |
| 7,102,544 B1 | 9/2006 | Liu |
| 7,130,913 B2 | 10/2006 | Fallon |
| 7,161,506 B2 * | 1/2007 | Fallon .......................... 341/51 |
| 7,190,284 B1 | 3/2007 | Dye et al. |
| 2001/0031092 A1 * | 10/2001 | Zeck et al. .................. 382/239 |
| 2001/0032128 A1 | 10/2001 | Kepecs |
| 2001/0052038 A1 * | 12/2001 | Fallon et al. .................. 710/68 |
| 2002/0037035 A1 | 3/2002 | Singh |
| 2002/0101367 A1 | 8/2002 | Geiger et al. |
| 2002/0104891 A1 | 8/2002 | Otto |
| 2002/0126755 A1 | 9/2002 | Li et al. |
| 2003/0030575 A1 | 2/2003 | Frachtenberg et al. |
| 2003/0034905 A1 | 2/2003 | Anton et al. |
| 2003/0084238 A1 | 5/2003 | Okada et al. |
| 2003/0142874 A1 | 7/2003 | Schwartz |

FOREIGN PATENT DOCUMENTS

| | | |
|---|---|---|
| EP | 0164677 | 12/1985 |
| EP | 0185098 | 6/1986 |
| EP | 0283798 | 9/1988 |
| EP | 0405572 A2 | 1/1991 |
| EP | 04055572 A3 | 3/1991 |
| EP | 0493130 | 7/1992 |
| EP | 0587437 | 3/1994 |
| EP | 0595406 | 5/1994 |
| EP | 0718751 A2 | 6/1996 |
| EP | 0718751 A3 | 2/1997 |
| GB | 2162025 | 1/1986 |
| JP | 6051989 | 2/1994 |
| JP | 9188009 | 7/1997 |
| JP | 11149376 | 6/1999 |

| WO | WO 9414273 | 6/1994 |
| WO | WO 9429852 | 12/1994 |
| WO | WO 9502873 | 1/1995 |
| WO | WO 9748212 | 12/1997 |

OTHER PUBLICATIONS

Jack Venbrux, *A VLSI Chip Set for High-Speed Lossless Data Compression*, IEEE Trans. On Circuits and Systems for Video Technology, vol. 2, No. 4, Dec. 1992, pp. 381-391.

Pen-Shu Yeh, *The CCSDS Lossless Data Compression Recommendation for Space Applications*, Chapter 16, Lossless Compression Handbook, Elsevier Science (USA), 2003, pp. 311-326.

Robert F. Rice, *Some Practical Universal Noiseless Coding Techniques*, Jet Propulsion Laboratory, Pasadena, California, JPL Publication 79-22, Mar. 15, 1979.

K. Murashita et al., High-Speed Statistical Compression using Self-organized Rules and Predetermined Code Tables, IEEE, 1996 Data Compression conference.

IBM, Fast Dos Soft Boot, Feb. 1, 1994, vol. 37, Issue 28, pp. 185-186.

J. Anderson et al. Codec squeezes color teleconferencing through digital telephone lines, Electronics 1984, pp. 13-15.

Robert Rice, "Lossless Coding Standards For Space Data Systems", IEEE 1058-6393/97, pp. 577-585.

Coene, W et al. "A Fast Route For Application of Rate-distortion Optimal Quantization in an MPEG Video Encoder" Proceedings of the International Conference on Image Processing, US., New York, IEEE, Sep. 16, 1996, pp. 825-828.

Millman, Howard, "Image and video compression", Computerworld, vol. 33, Issue No. 3, Jan. 18, 1999, pp. 78.

"IBM boosts your memory", Geek.com [online], Jun. 26, 2000 [retrieved on Jul. 6, 2007], <URL: http://www.geek.com/ibm-boosts-your-memory/>.

"IBM Research Breakthrough Doubles Computer Memory Capacity", IBM Press Release [online], Jun. 26, 2000 [retrieved on Jul. 6, 2007], <URL: http://www-03.ibm.com/press/us/en/pressrelease/1653.wss>.

"ServerWorks To Deliver IBM's Memory eXpansion Technology in Next-Generation Core Logic for Servers", ServerWorks Press Release [online], Jun. 27, 2000 [retrieved on Jul. 14, 2000], <URL: http://www.serverworks.com/news/press/ 000627.html>.

Abali, B., et al., "Memory Expansion Technology (MXT) Software support and performance", IBM Journal of Research and Development, vol. 45, Issue No. 2, Mar. 2001, pp. 287-301.

Franaszek, P. A., et al., "Algorithms and data structures for compressed-memory machines", IBM Journal of Research and Development, vol. 45, Issue No. 2, Mar. 2001, pp. 245-258.

Franaszek, P. A., et al., "On internal organization in compressed random-access memories", IBM Journal of Research and Development, vol. 45, Issue No. 2, Mar. 2001, pp. 259-270.

Smith, T.B., et al., "Memory Expansion Technology (MXT) Competitive impact", IBM Journal of Research and Development, Vo. 45, Issue No. 2, Mar. 2001, pp. 303-309.

Tremaine, R. B., et al., "IBM Memory Expansion Technology (MXT)", IBM Journal of Research and Development, vol. 45, Issue No. 2, Mar. 2001, pp. 271-285.

\* cited by examiner

CONTENT INDEPENDENT DATA COMPRESSION METHOD AND SYSTEM

CROSS-REFERENCE TO RELATED APPLICATIONS

This application is a Continuation of U.S. patent application Ser. No. 10/668,768, filed on Sep. 22, 2003, now U.S. Pat. No. 7,161,506 which is fully incorporated herein by reference, and which is a Continuation of U.S. patent application Ser. No. 10/016,355, filed on Oct. 29, 2001, now U.S. Pat. No. 6,624,761 which is a Continuation-In-Part of U.S. patent application Ser. No. 09/705,446, filed on Nov. 3, 2000, now U.S. Pat. No. 6,309,424, issued on Oct. 30, 2001, which is a Continuation of U.S. patent application Ser. No. 09/210,491, filed on Dec. 11, 1998, which is now U.S. Pat. No. 6,195,024, issued on Feb. 27, 2001.

BACKGROUND

1. Technical Field

The present invention relates generally to a data compression and decompression and, more particularly, to systems and methods for data compression using content independent and content dependent data compression and decompression.

2. Description of Related Art

Information may be represented in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video, frequently exists in the natural world as analog information. As is well known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

There are many advantages associated with digital data representation. For instance, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossless and lossy data compression.

Lossy data compression techniques provide for an inexact representation of the original uncompressed data such that the decoded (or reconstructed) data differs from the original unencoded/uncompressed data. Lossy data compression is also known as irreversible or noisy compression. Entropy is defined as the quantity of information in a given set of data. Thus, one obvious advantage of lossy data compression is that the compression ratios can be larger than the entropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the entropy of a given data set.

There are various problems associated with the use of lossless compression techniques. One fundamental problem encountered with most lossless data compression techniques are their content sensitive behavior. This is often referred to as data dependency. Data dependency implies that the compression ratio achieved is highly contingent upon the content of the data being compressed. For example, database files often have large unused fields and high data redundancies, offering the opportunity to losslessly compress data at ratios of 5 to 1 or more. In contrast, concise software programs have little to no data redundancy and, typically, will not losslessly compress better than 2 to 1.

Another problem with lossless compression is that there are significant variations in the compression ratio obtained when using a single lossless data compression technique for data streams having different data content and data size. This process is known as natural variation.

A further problem is that negative compression may occur when certain data compression techniques act upon many types of highly compressed data. Highly compressed data appears random and many data compression techniques will substantially expand, not compress this type of data.

For a given application, there are many factors that govern the applicability of various data compression techniques. These factors include compression ratio, encoding and decoding processing requirements, encoding and decoding time delays, compatibility with existing standards, and implementation complexity and cost, along with the adaptability and robustness to variations in input data. A direct relationship exists in the current art between compression ratio and the amount and complexity of processing required. One of the limiting factors in most existing prior art lossless data compression techniques is the rate at which the encoding and decoding processes are performed. Hardware and software implementation tradeoffs are often dictated by encoder and decoder complexity along with cost.

Another problem associated with lossless compression methods is determining the optimal compression technique for a given set of input data and intended application. To combat this problem, there are many conventional content dependent techniques that may be utilized. For instance, file type descriptors are typically appended to file names to describe the application programs that normally act upon the data contained within the file. In this manner data types, data structures, and formats within a given file may be ascertained. Fundamental limitations with this content dependent technique include:

(1) the extremely large number of application programs, some of which do not possess published or documented file formats, data structures, or data type descriptors;

(2) the ability for any data compression supplier or consortium to acquire, store, and access the vast amounts of data required to identify known file descriptors and associated data types, data structures, and formats; and (3) the rate at which new application programs are developed and the need to update file format data descriptions accordingly.

An alternative technique that approaches the problem of selecting an appropriate lossless data compression technique is disclosed, for example, in U.S. Pat. No. 5,467,087 to Chu entitled "High Speed Lossless Data Compression System" ("Chu"). FIG. 1 illustrates an embodiment of this data compression and decompression technique. Data compression 1 comprises two phases, a data pre-compression phase 2 and a data compression phase 3. Data decompression 4 of a compressed input data stream is also comprised of two phases, a data type retrieval phase 5 and a data decompression phase 6. During the data compression process 1, the data pre-compressor 2 accepts an uncompressed data stream, identifies the data type of the input stream, and generates a data type identification signal. The data compressor 3 selects a data compression method from a preselected set of methods to compress the input data stream, with the intention of producing the best available compression ratio for that particular data type.

There are several limitations associated with the Chu method. One such limitation is the need to unambiguously identify various data types. While these might include such common data types as ASCII, binary, or unicode, there, in fact, exists a broad universe of data types that fall outside the three most common data types. Examples of these alternate data types include: signed and unsigned integers of various lengths, differing types and precision of floating point numbers, pointers, other forms of character text, and a multitude of user defined data types. Additionally, data types may be interspersed or partially compressed, making data type recognition difficult and/or impractical. Another limitation is that given a known data type, or mix of data types within a specific set or subset of input data, it may be difficult and/or impractical to predict which data encoding technique yields the highest compression ratio.

Accordingly, there is a need for a data compression system and method that would address limitations in conventional data compression techniques as described above.

SUMMARY OF THE INVENTION

The present invention is directed to systems and methods for providing fast and efficient data compression using a combination of content independent data compression and content dependent data compression. In one aspect of the invention, a method for compressing data comprises the steps of:

analyzing a data block of an input data stream to identify a data type of the data block, the input data stream comprising a plurality of disparate data types;

performing content dependent data compression on the data block, if the data type of the data block is identified;

performing content independent data compression on the data block, if the data type of the data block is not identified.

In another aspect, the step of performing content independent data compression comprises: encoding the data block with a plurality of encoders to provide a plurality of encoded data blocks; determining a compression ratio obtained for each of the encoders; comparing each of the determined compression ratios with a first compression threshold; selecting for output the input data block and appending a null compression descriptor to the input data block, if all of the encoder compression ratios do not meet the first compression threshold; and selecting for output the encoded data block having the highest compression ratio and appending a corresponding compression type descriptor to the selected encoded data block, if at least one of the compression ratios meet the first compression threshold.

In another aspect, the step of performing content dependent compression comprises the steps of: selecting one or more encoders associated with the identified data type and encoding the data block with the selected encoders to provide a plurality of encoded data blocks; determining a compression ratio obtained for each of the selected encoders; comparing each of the determined compression ratios with a second compression threshold; selecting for output the input data block and appending a null compression descriptor to the input data block, if all of the encoder compression do not meet the second compression threshold; and selecting for output the encoded data block having the highest compression ratio and appending a corresponding compression type descriptor to the selected encoded data block, if at least one of the compression ratios meet the second compression threshold.

In yet another aspect, the step of performing content independent data compression on the data block, if the data type of the data block is not identified, comprises the steps of: estimating a desirability of using of one or more encoder types based one characteristics of the data block; and compressing the data block using one or more desirable encoders.

In another aspect, the step of performing content dependent data compression on the data block, if the data type of the data block is identified, comprises the steps of: estimating a desirability of using of one or more encoder types based on characteristics of the data block; and compressing the data block using one or more desirable encoders.

In another aspect, the step of analyzing the data block comprises analyzing the data block to recognize one of a data type, data structure, data block format, file substructure, and/or file types. A further step comprises maintaining an association between encoder types and data types, data structures, data block formats, file substructure, and/or file types.

In yet another aspect of the invention, a method for compressing data comprises the steps of:

analyzing a data block of an input data stream to identify a data type of the data block, the input data stream comprising a plurality of disparate data types;

performing content dependent data compression on the data block, if the data type of the data block is identified;

determining a compression ratio of the compressed data block obtained using the content dependent compression and comparing the compression ratio with a first compression threshold; and performing content independent data compression on the data block, if the data type of the data block is not identified or if the compression ratio of the compressed data block obtained using the content dependent compression does not meet the first compression threshold.

Advantageously, the present invention employs a plurality of encoders applying a plurality of compression techniques on an input data stream so as to achieve maximum compression in accordance with the real-time or pseudo real-time data rate constraint. Thus, the output bit rate is not fixed and the amount, if any, of permissible data quality degradation is user or data specified.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
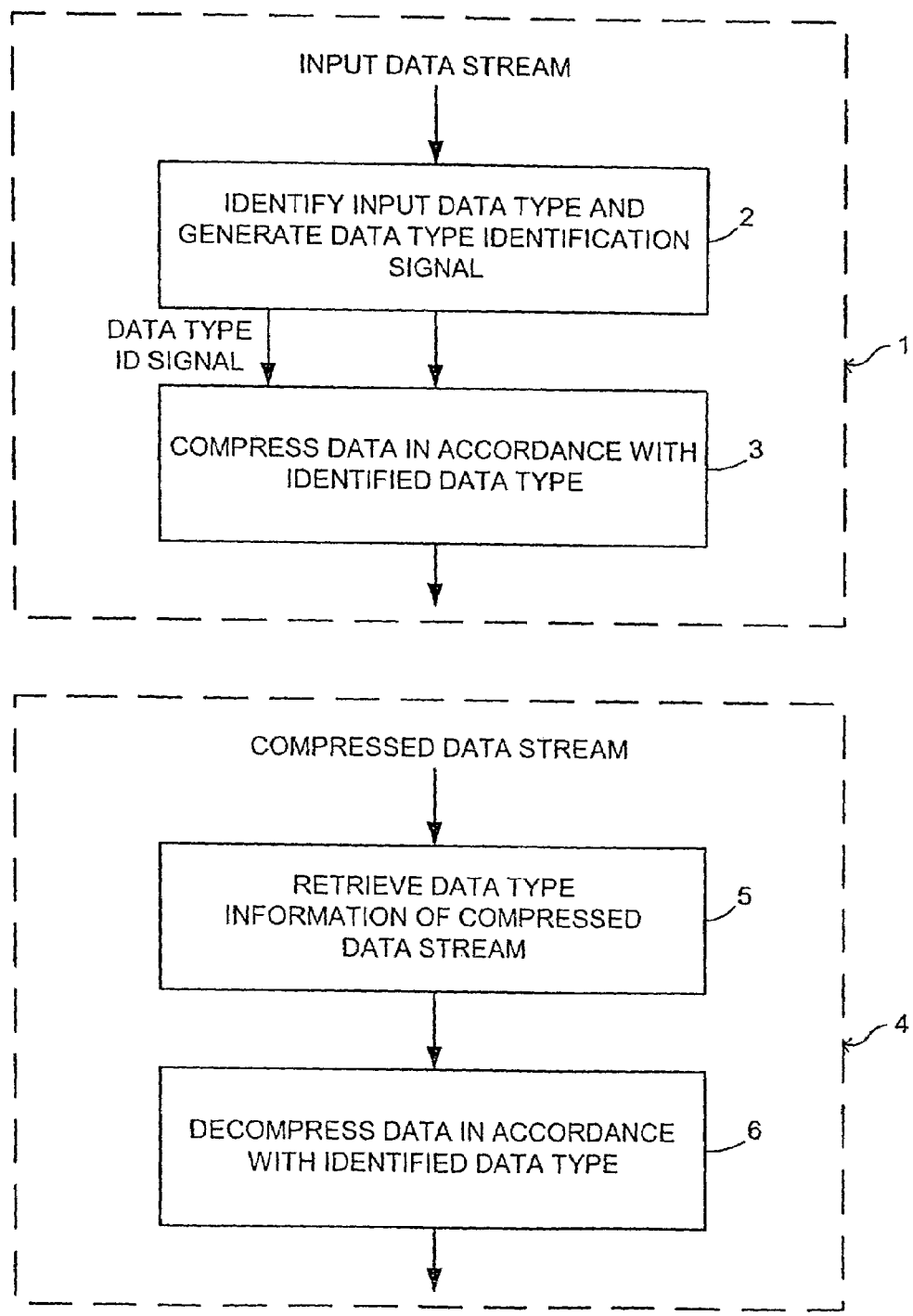
FIG. 1 is a block/flow diagram of a content dependent high-speed lossless data compression and decompression system/method according to the prior art.

The present invention is directed to systems and methods for providing data compression and decompression using content independent and content dependent data compression and decompression. In the following description, it is to be understood that system elements having equivalent or similar functionality are designated with the same reference numerals in the Figures. It is to be further understood that the present invention may be implemented in various forms of hardware, software, firmware, or a combination thereof. In particular, the system modules described herein are preferably implemented in software as an application program that is executable by, e.g., a general purpose computer or any machine or device having any suitable and preferred microprocessor architecture. Preferably, the present invention is implemented on a computer platform including hardware such as one or more central processing units (CPU), a random access memory (RAM), and input/output (I/O) interface(s). The computer platform also includes an operating system and microinstruction code. The various processes and functions described herein may be either part of the microinstruction code or application programs which are executed via the operating system. In addition, various other peripheral devices may be connected to the computer platform such as an additional data storage device and a printing device.

It is to be further understood that, because some of the constituent system components described herein are preferably implemented as software modules, the actual system connections shown in the Figures may differ depending upon the manner in which the systems are programmed. It is to be appreciated that special purpose microprocessors may be employed to implement the present invention. Given the teachings herein, one of ordinary skill in the related art will be able to contemplate these and similar implementations or configurations of the present invention.

Figure 2:
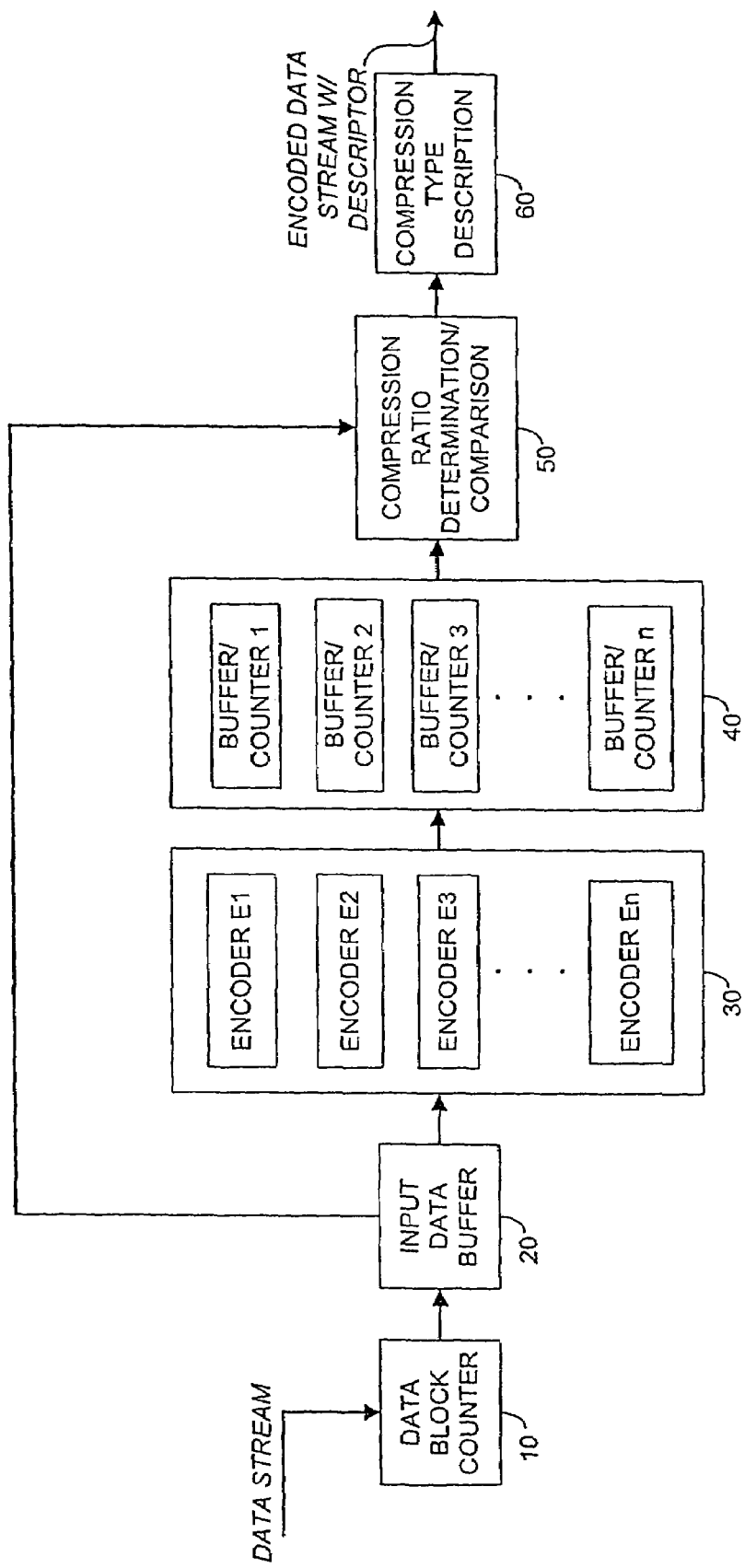
FIG. 2 is a block diagram of a content independent data compression system according to one embodiment of the present invention.

Referring now to FIG. 2 a block diagram illustrates a content independent data compression system according to one embodiment of the present invention. The data compression system includes a counter module 10 that receives as input an uncompressed or compressed data stream. It is to be understood that the system processes the input data stream in data blocks that may range in size from individual bits through complete files or collections of multiple files. Additionally, the data block size may be fixed or variable. The counter module 10 counts the size of each input data block (i.e., the data block size is counted in bits, bytes, words, any convenient data multiple or metric, or any combination thereof).

An input data buffer 20, operatively connected to the counter module 10, may be provided for buffering the input data stream in order to output an uncompressed data stream in the event that, as discussed in further detail below, every encoder fails to achieve a level of compression that exceeds an a priori specified minimum compression ratio threshold. It is to be understood that the input data buffer 20 is not required for implementing the present invention.

An encoder module 30 is operatively connected to the buffer 20 and comprises a set of encoders E1, E2, E3 . . . En. The encoder set E1, E2, E3 . . . En may include any number "n" of those lossless encoding techniques currently well known within the art such as run length, Huffmnan, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders are preferably selected to provide a broad coverage of existing and future data types.

The encoder module 30 successively receives as input each of the buffered input data blocks (or unbuffered input data blocks from the counter module 10). Data compression is performed by the encoder module 30 wherein each of the encoders E1 . . . . En processes a given input data block and outputs a corresponding set of encoded data blocks. It is to be appreciated that the system affords a user the option to enable/disable any one or more of the encoders E1. . . . En prior to operation. As is understood by those skilled in the art, such feature allows the user to tailor the operation of the data compression system for specific applications. It is to be further appreciated that the encoding process may be performed either in parallel or sequentially. In particular, the encoders E1 through En of encoder module 30 may operate in parallel (i.e., simultaneously processing a given input data block by utilizing task multiplexing on a single central processor, via dedicated hardware, by executing on a plurality of processor or dedicated hardware systems, or any combination thereof). In addition, encoders E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block.

A buffer/counter module 40 is operatively connected to the encoding module 30 for buffering and counting the size of each of the encoded data blocks output from encoder module 30. Specifically, the buffer/counter 30 comprises a plurality of buffer/counters BC1, BC2, BC3 . . . BCn, each operatively associated with a corresponding one of the encoders E1 . . . En. A compression ratio module 50, operatively connected to the output buffer/counter 40, determines the compression ratio obtained for each of the enabled encoders E1 . . . En by taking the ratio of the size of the input data block to the size of the output data block stored in the corresponding buffer/counters BC1 . . . BCn. In addition, the compression ratio module 50 compares each compression ratio with an a priori-specified compression ratio threshold limit to determine if at least one of the encoded data blocks output from the enabled encoders E1 . . . En achieves a compression that exceeds an a priori-specified threshold. As is understood by those skilled in the art, the threshold limit may be specified as any value inclusive of data expansion, no data compression or expansion, or any arbitrarily desired compression limit. A description module 60, operatively coupled to the compression ratio module 50, appends a corresponding compression type descriptor to each encoded data block which is selected for output so as to indicate the type of compression format of the encoded data block.

Figure 3A:
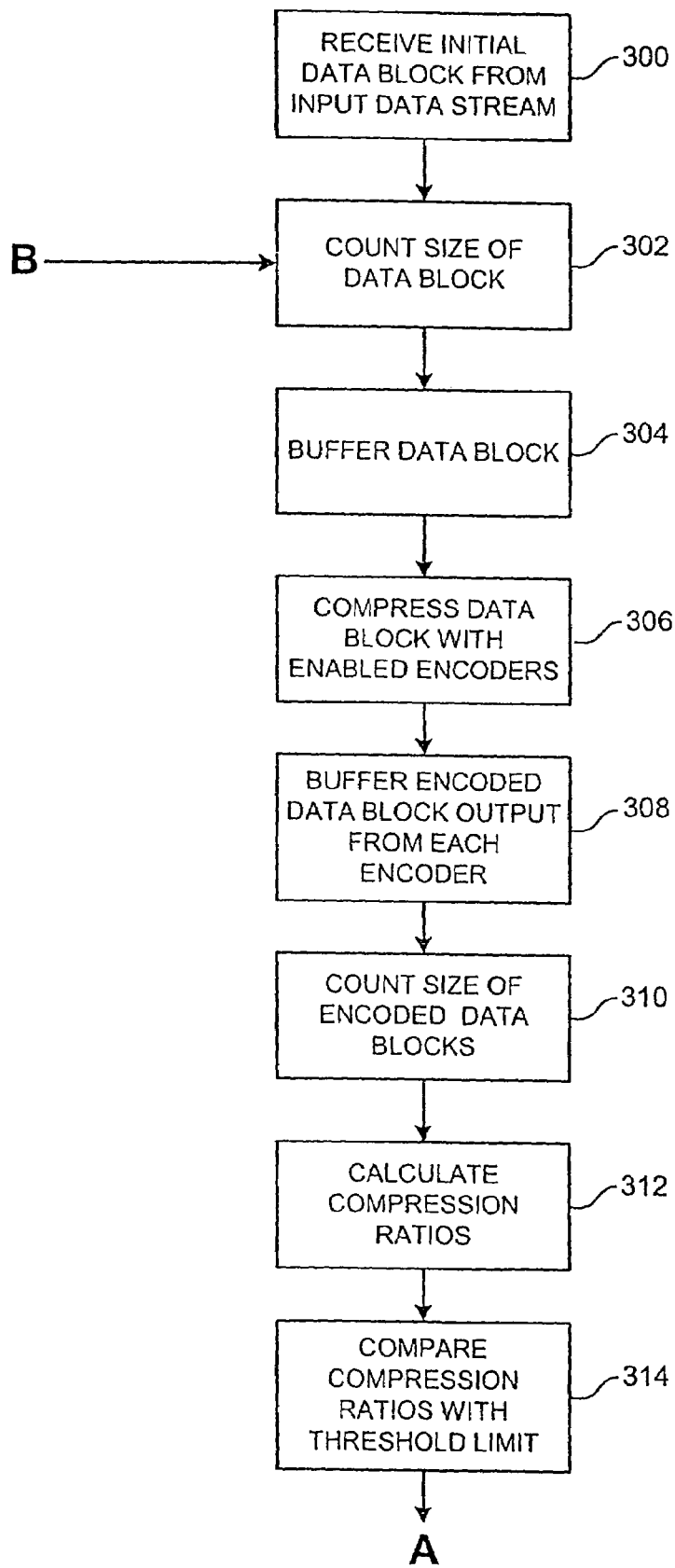
FIGS. 3a and 3b comprise a flow diagram of a data compression method according to one aspect of the present invention, which illustrates the operation of the data compression system of FIG. 2.
Figure 3B:
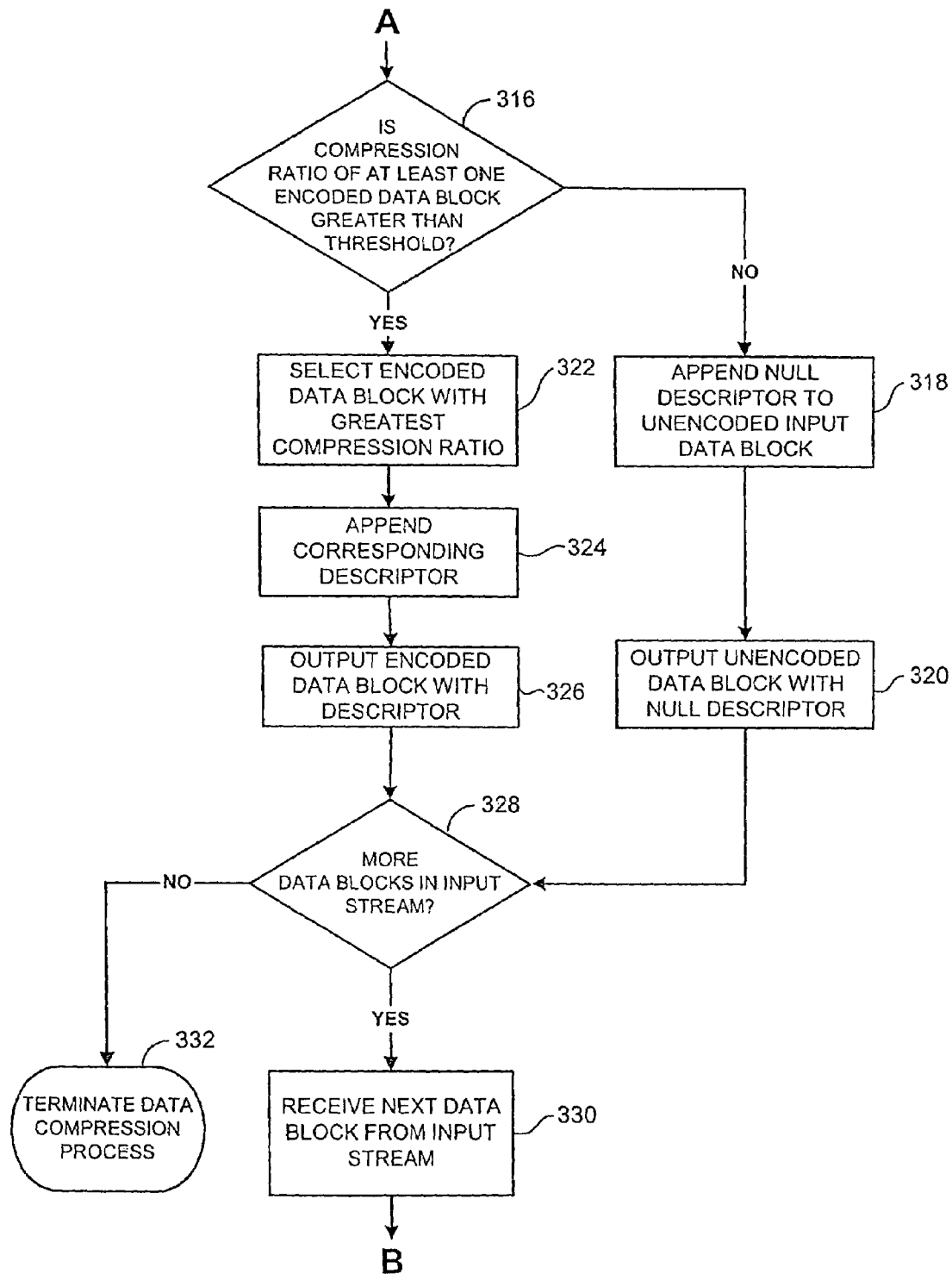

The operation of the data compression system of FIG. 2 will now be discussed in further detail with reference to the flow diagram of FIGS. 3a and 3b. A data stream comprising one or more data blocks is input into the data compression system and the first data block in the stream is received (step 300). As stated above, data compression is performed on a per data block basis. Accordingly, the first input data block in the input data stream is input into the counter module 10 that counts the size of the data block (step 302). The data block is then stored in the buffer 20 (step 304). The data block is then sent to the encoder module 30 and compressed by each (enabled) encoder E1 . . . En (step 306). Upon completion of the encoding of the input data block, an encoded data block is output from each (enabled) encoder E1 . . . En and maintained in a corresponding buffer (step 308), and the encoded data block size is counted (step 310).

Next, a compression ratio is calculated for each encoded data block by taking the ratio of the size of the input data block (as determined by the input counter 10) to the size of each encoded data block output from the enabled encoders (step 312). Each compression ratio is then compared with an a priori-specified compression ratio threshold (step 314). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art.

After the compression ratios are compared with the threshold, a determination is made as to whether the compression ratio of at least one of the encoded data blocks exceeds the threshold limit (step 316). If there are no encoded data blocks having a compression ratio that exceeds the compression ratio threshold limit (negative determination in step 316), then the original unencoded input data block is selected for output and a null data compression type descriptor is appended thereto (step 318). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 320).

On the other hand, if one or more of the encoded data blocks possess a compression ratio greater than the compression ratio threshold limit (affirmative result in step 316), then the encoded data block having the greatest compression ratio is selected (step 322). An appropriate data compression type descriptor is then appended (step 324). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 326).

After the encoded data block or the unencoded data input data block is output (steps 326 and 320), a determination is made as to whether the input data stream contains additional data blocks to be processed (step 328). If the input data stream includes additional data blocks (affirmative result in step 328), the next successive data block is received (step 330), its block size is counted (return to step 302) and the data compression process in repeated. This process is iterated for each data block in the input data stream. Once the final input data block is processed (negative result in step 328), data compression of the input data stream is finished (step 322).

Since a multitude of data types may be present within a given input data block, it is often difficult and/or impractical to predict the level of compression that will be achieved by a specific encoder. Consequently, by processing the input data blocks with a plurality of encoding techniques and comparing the compression results, content free data compression is advantageously achieved. It is to be appreciated that this approach is scalable through future generations of processors, dedicated hardware, and software. As processing capacity increases and costs reduce, the benefits provided by the present invention will continue to increase. It should again be noted that the present invention may employ any lossless data encoding technique.

Figure 4:
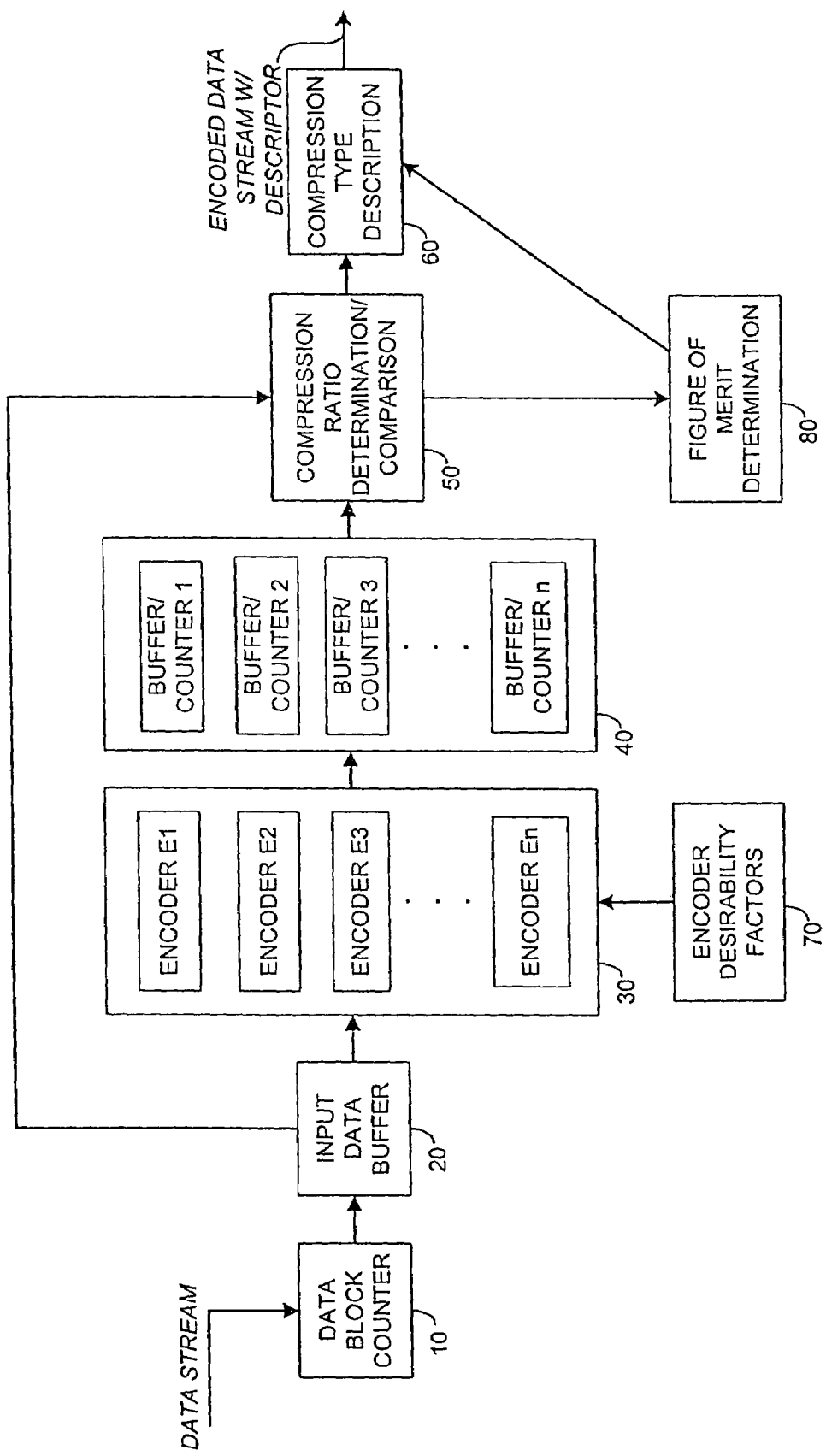
FIG. 4 is a block diagram of a content independent data compression system according to another embodiment of the present invention having an enhanced metric for selecting an optimal encoding technique.

Referring now to FIG. 4, a block diagram illustrates a content independent data compression system according to another embodiment of the present invention. The data compression system depicted in FIG. 4 is similar to the data compression system of FIG. 2 except that the embodiment of FIG. 4 includes an enhanced metric functionality for selecting an optimal encoding technique. In particular, each of the encoders E1 . . . En in the encoder module 30 is tagged with a corresponding one of user-selected encoder desirability factors 70. Encoder desirability is defined as an a priori user specified factor that takes into account any number of user considerations including, but not limited to, compatibility of the encoded data with existing standards, data error robustness, or any other aggregation of factors that the user wishes to consider for a particular application. Each encoded data block output from the encoder module 30 has a corresponding desirability factor appended thereto. A figure of merit module 80, operatively coupled to the compression ratio module 50 and the descriptor module 60, is provided for calculating a figure of merit for each of the encoded data blocks which possess a compression ratio greater than the compression ratio threshold limit. The figure of merit for each encoded data block is comprised of a weighted average of the a priori user specified threshold and the corresponding encoder desirability factor. As discussed below in further detail with reference to FIGS. 5a and 5b, the figure of merit substitutes the a priori user compression threshold limit for selecting and outputting encoded data blocks.

Figure 5A:
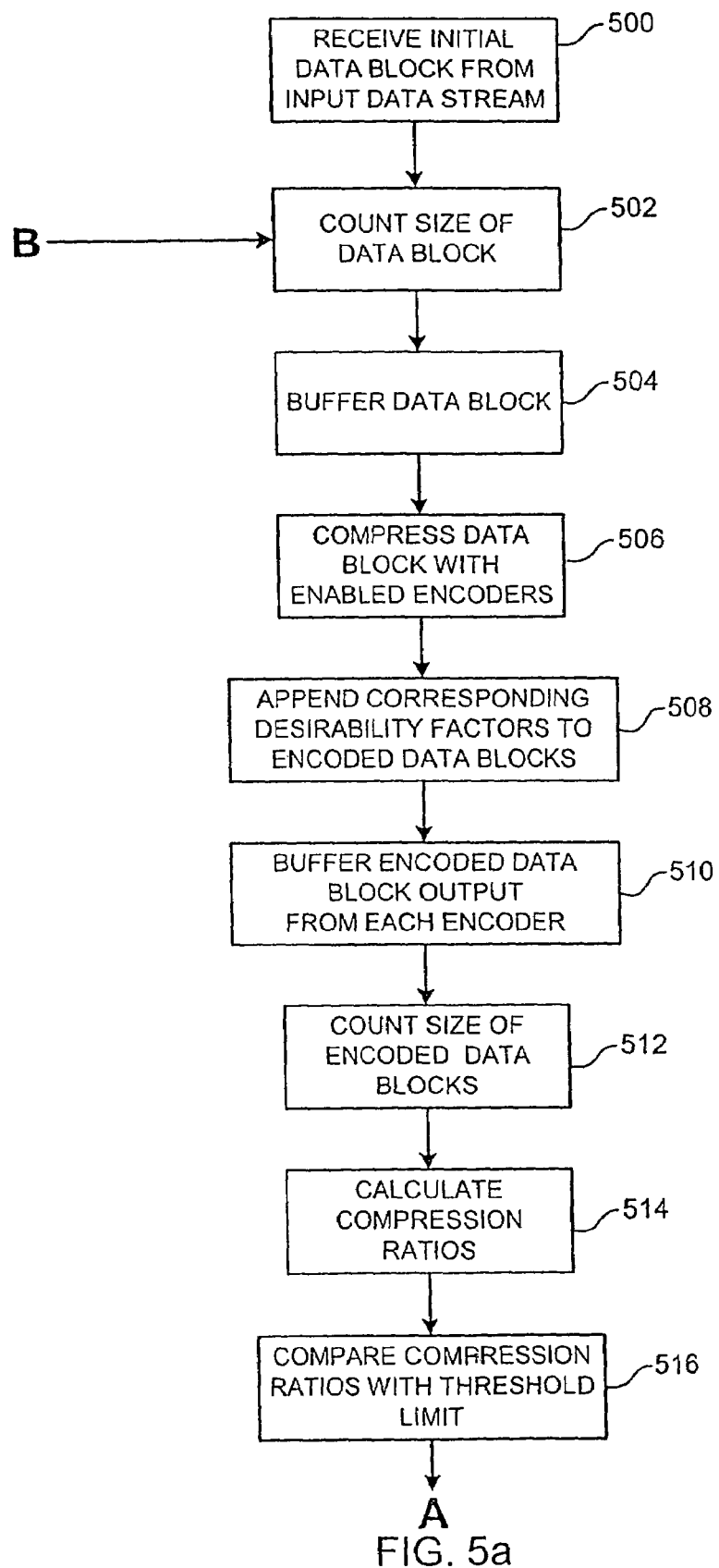
FIGS. 5a and 5b comprise a flow diagram of a data compression method according to another aspect of the present invention, which illustrates the operation of the data compression system of FIG. 4.
Figure 5B:
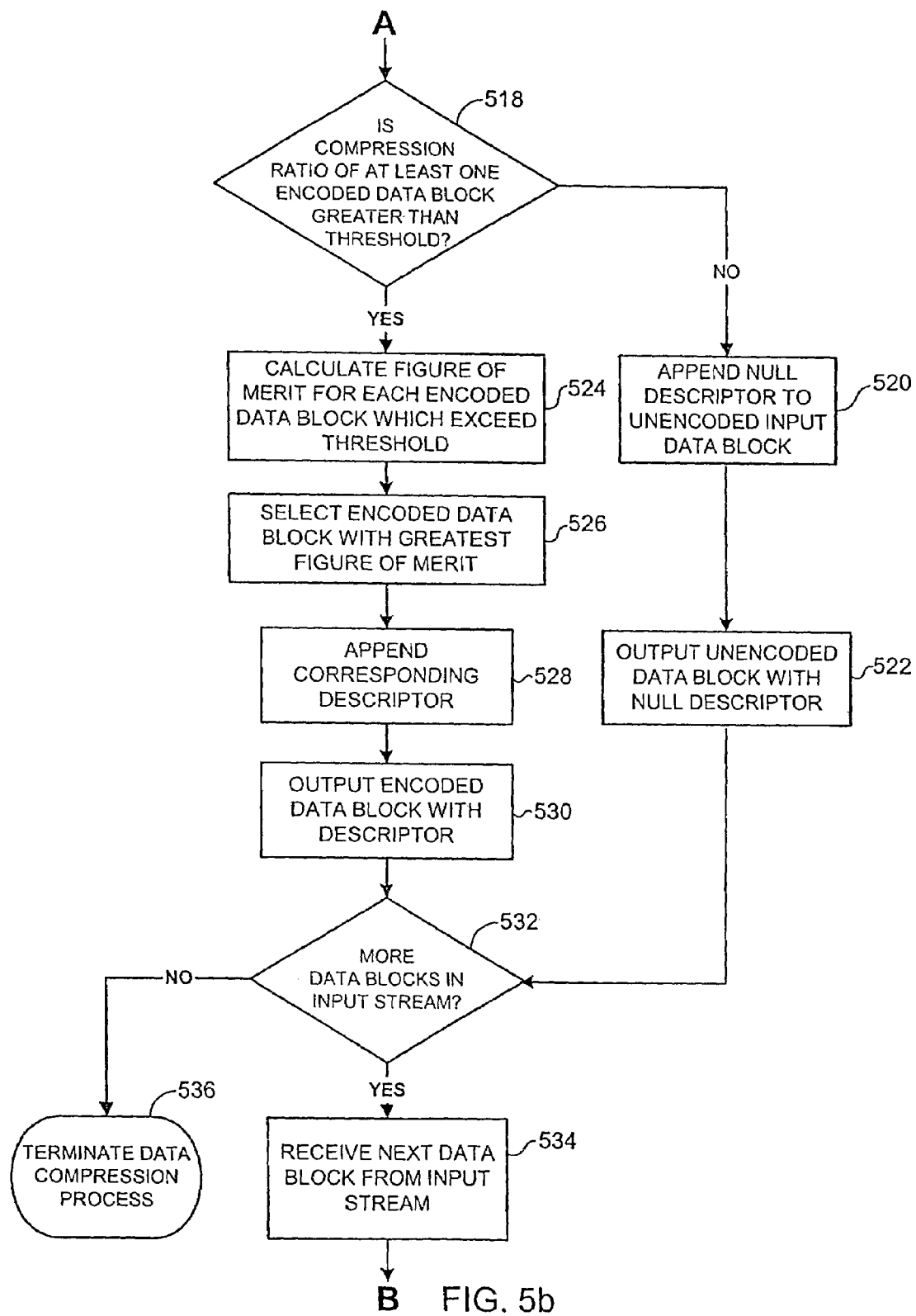

The operation of the data compression system of FIG. 4 will now be discussed in further detail with reference to the flow diagram of FIGS. 5a and 5b. A data stream comprising one or more data blocks is input into the data compression system and the first data block in the stream is received (step 500). The size of the first data block is then determined by the counter module 10 (step 502). The data block is then stored in the buffer 20 (step 504). The data block is then sent to the encoder module 30 and compressed by each (enabled) encoder in the encoder set E1 . . . En (step 506). Each encoded data block processed in the encoder module 30 is tagged with an encoder desirability factor that corresponds the particular encoding technique applied to the encoded data block (step 508). Upon completion of the encoding of the input data block, an encoded data block with its corresponding desirability factor is output from each (enabled) encoder E1 . . . En and maintained in a corresponding buffer (step 510), and the encoded data block size is counted (step 512).

Next, a compression ratio obtained by each enabled encoder is calculated by taking the ratio of the size of the input data block (as determined by the input counter 10) to the size of the encoded data block output from each enabled encoder (step 514). Each compression ratio is then compared with an a priori-specified compression ratio threshold (step 516). A determination is made as to whether the compression ratio of at least one of the encoded data blocks exceeds the threshold limit (step 518). If there are no encoded data blocks having a compression ratio that exceeds the compression ratio threshold limit (negative determination in step 518), then the original unencoded input data block is selected for output and a null data compression type descriptor (as discussed above) is appended thereto (step 520). Accordingly, the original unencoded input data block with its corresponding null data compression type descriptor is then output for subsequent data processing, storage, or transmittal (step 522).

On the other hand, if one or more of the encoded data blocks possess a compression ratio greater than the compression ratio threshold limit (affirmative result in step 518), then a figure of merit is calculated for each encoded data block having a compression ratio which exceeds the compression ratio threshold limit (step 524). Again, the figure of merit for a given encoded data block is comprised of a weighted average of the a priori user specified threshold and the corresponding encoder desirability factor associated with the encoded data block. Next, the encoded data block having the greatest figure of merit is selected for output (step 526). An appropriate data compression type descriptor is then appended (step 528) to indicate the data encoding technique applied to the encoded data block. The encoded data block (which has the greatest figure of merit) along with its corresponding data compression type descriptor is then output for subsequent data processing, storage, or transmittal (step 530).

After the encoded data block or the unencoded input data block is output (steps 530 and 522), a determination is made as to whether the input data stream contains additional data blocks to be processed (step 532). If the input data stream includes additional data blocks (affirmative result in step 532), then the next successive data block is received (step 534), its block size is counted (return to step 502) and the data compression process is iterated for each successive data block in the input data stream. Once the final input data block is processed (negative result in step 532), data compression of the input data stream is finished (step 536).

Figure 6:
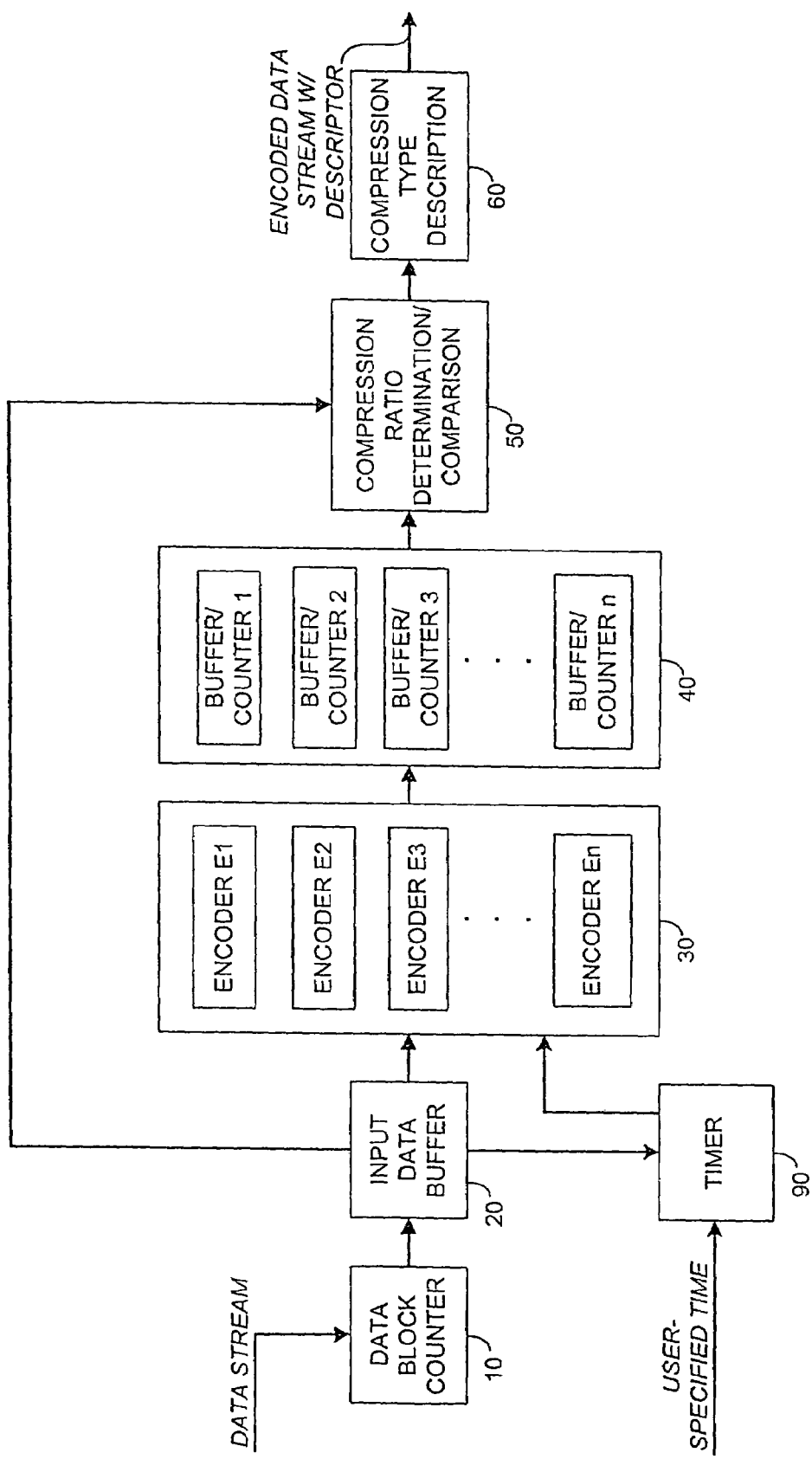
FIG. 6 is a block diagram of a content independent data compression system according to another embodiment of the present invention having an a priori specified timer that provides real-time or pseudo real-time of output data.

Referring now to FIG. 6, a block diagram illustrates a data compression system according to another embodiment of the present invention. The data compression system depicted in FIG. 6 is similar to the data compression system discussed in detail above with reference to FIG. 2 except that the embodiment of FIG. 6 includes an a priori specified timer that provides real-time or pseudo real-time output data. In particular, an interval timer 90, operatively coupled to the encoder module 30, is preloaded with a user specified time value. The role of the interval timer (as will be explained in greater detail below with reference to FIGS. 7a and 7b) is to limit the processing time for each input data block processed by the encoder module 30 so as to ensure that the real-time, pseudo real-time, or other time critical nature of the data compression processes is preserved.

Figure 7A:
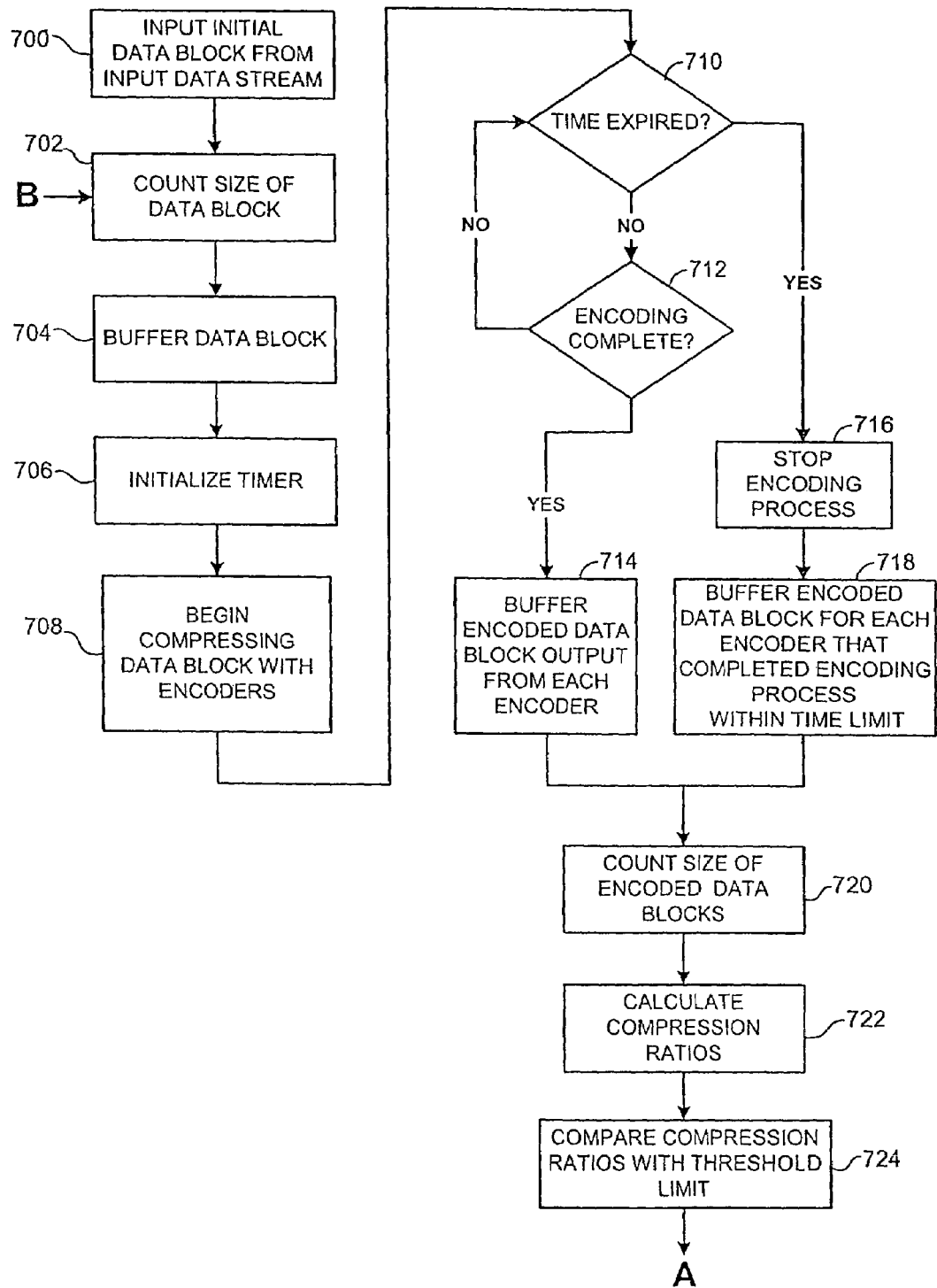
FIGS. 7a and 7b comprise a flow diagram of a data compression method according to another aspect of the present invention, which illustrates the operation of the data compression system of FIG. 6.
Figure 7B:
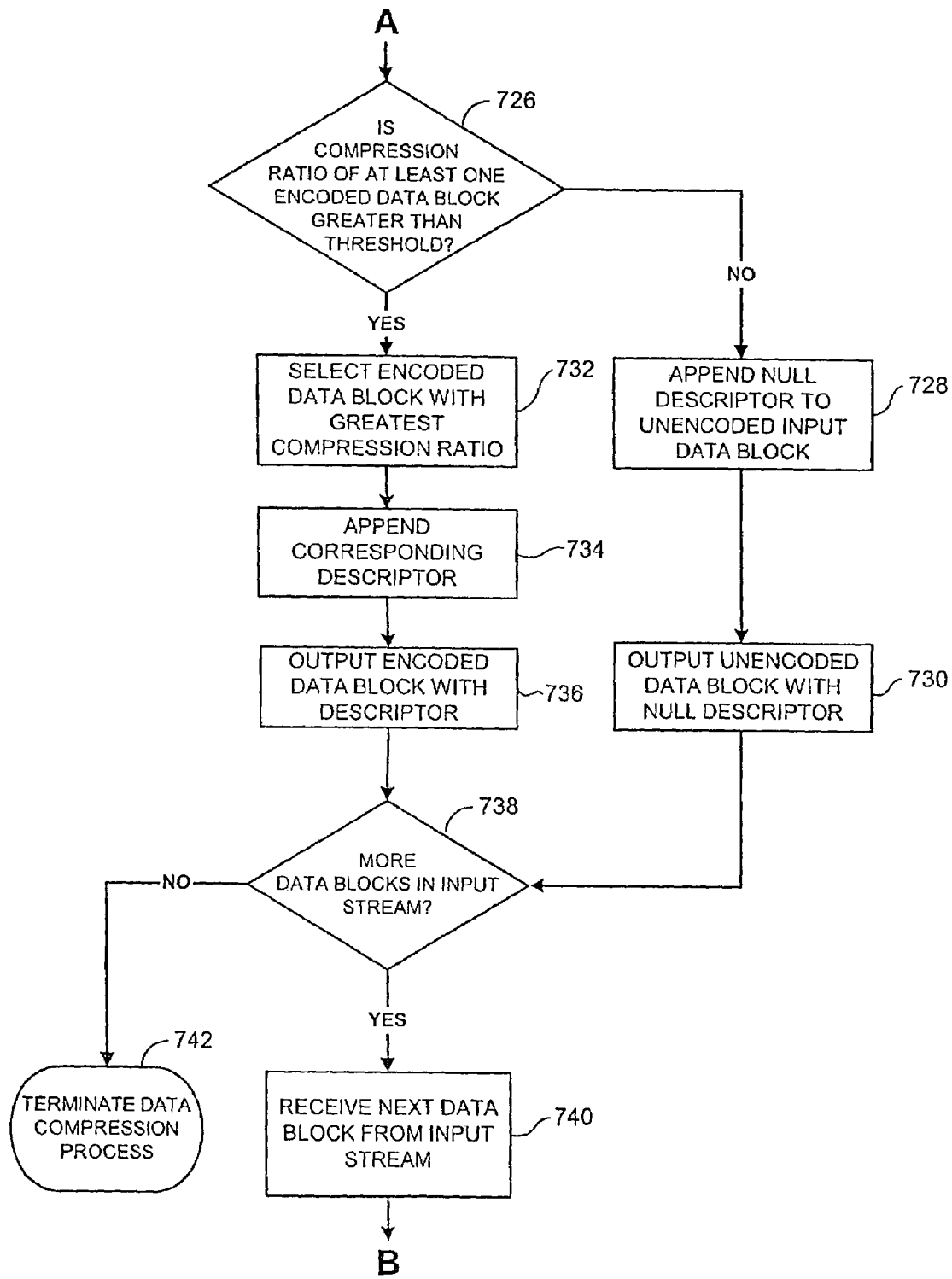

The operation of the data compression system of FIG. 6 will now be discussed in further detail with reference to the flow diagram of FIGS. 7a and 7b. A data stream comprising one or more data blocks is input into the data compression system and the first data block in the data stream is received (step 700), and its size is determined by the counter module 10 (step 702). The data block is then stored in buffer 20 (step 704).

Next, concurrent with the completion of the receipt and counting of the first data block, the interval timer 90 is initialized (step 706) and starts counting towards a user-specified time limit. The input data block is then sent to the encoder module 30 wherein data compression of the data block by each (enabled) encoder E1 . . . En commences (step 708). Next, a determination is made as to whether the user specified time expires before the completion of the encoding process (steps 710 and 712). If the encoding process is completed before or at the expiration of the timer, i.e., each encoder (E1 through En) completes its respective encoding process (negative result in step 710 and affirmative result in step 712), then an encoded data block is output from each (enabled) encoder E1 . . . En and maintained in a corresponding buffer (step 714).

On the other hand, if the timer expires (affirmative result in 710), the encoding process is halted (step 716). Then, encoded data blocks from only those enabled encoders E1 . . . En that have completed the encoding process are selected and maintained in buffers (step 718). It is to be appreciated that it is not necessary (or in some cases desirable) that some or all of the encoders complete the encoding process before the interval timer expires. Specifically, due to encoder data dependency and natural variation, it is possible that certain encoders may not operate quickly enough and, therefore, do not comply with the timing constraints of the end use. Accordingly, the time limit ensures that the real-time or pseudo real-time nature of the data encoding is preserved.

After the encoded data blocks are buffered (step 714 or 718), the size of each encoded data block is counted (step 720). Next, a compression ratio is calculated for each encoded data block by taking the ratio of the size of the input data block (as determined by the input counter 10) to the size of the encoded data block output from each enabled encoder (step 722). Each compression ratio is then compared with an a priori-specified compression ratio threshold (step 724). A determination is made as to whether the compression ratio of at least one of the encoded data blocks exceeds the threshold limit (step 726). If there are no encoded data blocks having a compression ratio that exceeds the compression ratio threshold limit (negative determination in step 726), then the original unencoded input data block is selected for output and a null data compression type descriptor is appended thereto (step 728). The original unencoded input data block with its corresponding null data compression type descriptor is then output for subsequent data processing, storage, or transmittal (step 730).

On the other hand, if one or more of the encoded data blocks possess a compression ratio greater than the compression ratio threshold limit (affirmative result in step 726), then the encoded data block having the greatest compression ratio is selected (step 732). An appropriate data compression type descriptor is then appended (step 734). The encoded data block having the greatest compression ratio along with its corresponding data compression type descriptor is then output for subsequent data processing, storage, or transmittal (step 736).

After the encoded data block or the unencoded input data block is output (steps 730 or 736), a determination is made as to whether the input data stream contains additional data blocks to be processed (step 738). If the input data stream includes additional data blocks (affirmative result in step 738), the next successive data block is received (step 740), its block size is counted (return to step 702) and the data compression process in repeated. This process is iterated for each data block in the input data stream, with each data block being processed within the user-specified time limit as discussed above. Once the final input data block is processed (negative result in step 738), data compression of the input data stream is complete (step 742).

Figure 8:
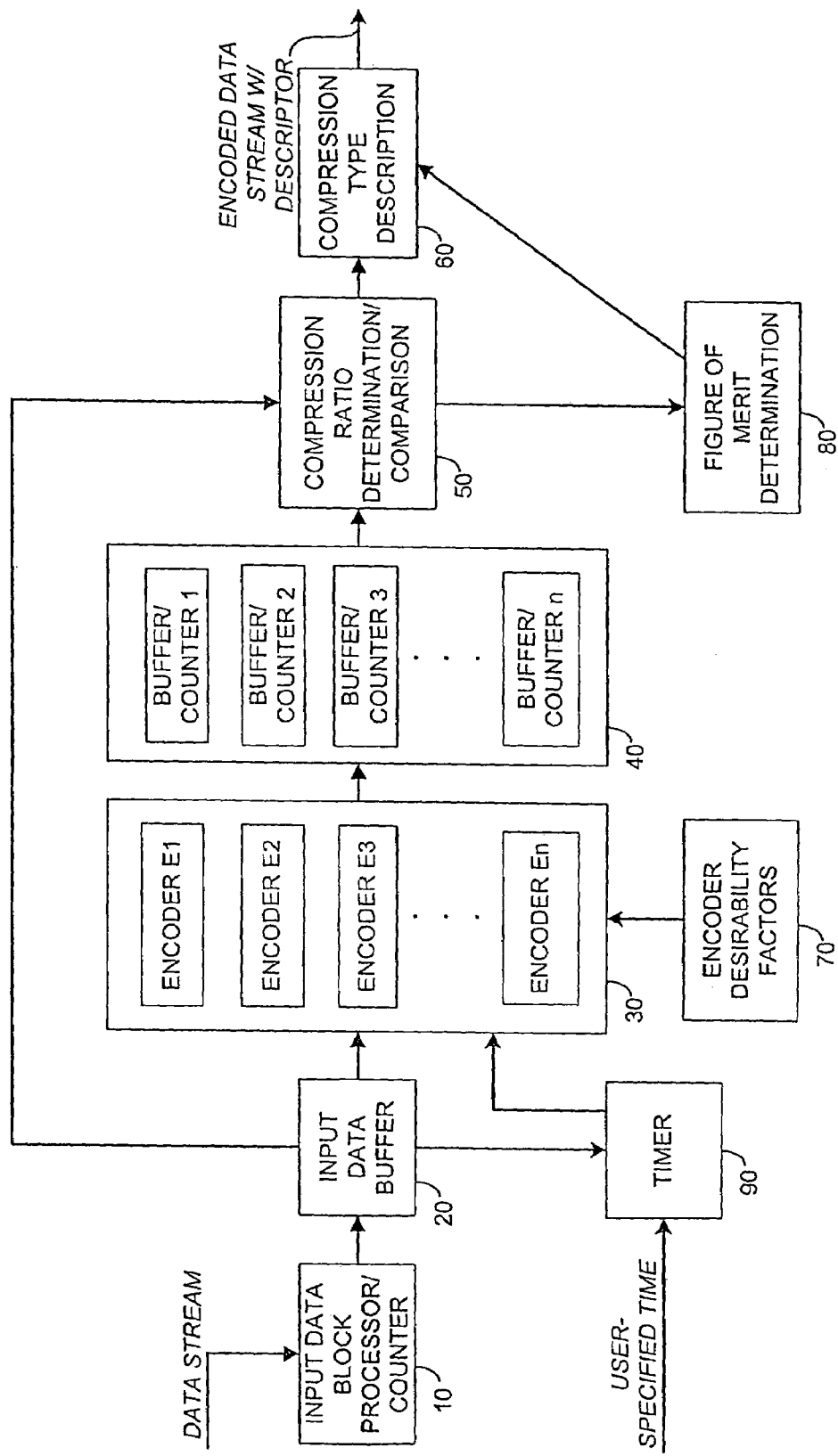
FIG. 8 is a block diagram of a content independent data compression system according to another embodiment having an a priori specified timer that provides real-time or pseudo real-time of output data and an enhanced metric for selecting an optimal encoding technique.

Referring now to FIG. 8, a block diagram illustrates a content independent data compression system according to another embodiment of the present system. The data compression system of FIG. 8 incorporates all of the features discussed above in connection with the system embodiments of FIGS. 2, 4, and 6. For example, the system of FIG. 8 incorporates both the a priori specified timer for providing real-time or pseudo real-time of output data, as well as the enhanced metric for selecting an optimal encoding technique. Based on the foregoing discussion, the operation of the system of FIG. 8 is understood by those skilled in the art.

Figure 9:
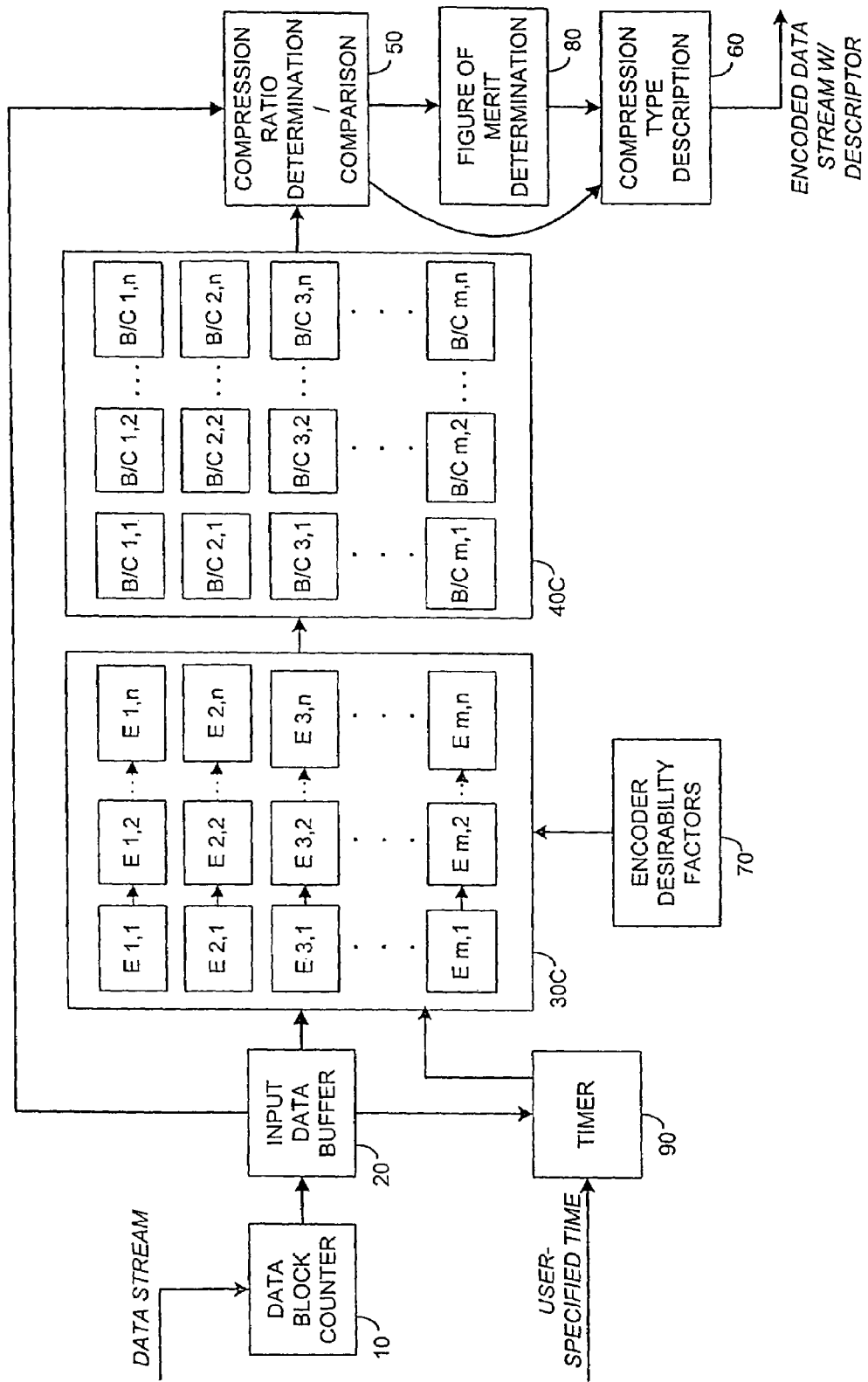
FIG. 9 is a block diagram of a content independent data compression system according to another embodiment of the present invention having an encoding architecture comprising a plurality of sets of serially cascaded encoders.

Referring now to FIG. 9, a block diagram illustrates a data compression system according to a preferred embodiment of the present invention. The system of FIG. 9 contains many of the features of the previous embodiments discussed above. However, this embodiment advantageously includes a cascaded encoder module 30c having an encoding architecture comprising a plurality of sets of serially-cascaded encoders Em,n, where "m" refers to the encoding path (i.e., the encoder set) and where "n" refers to the number of encoders in the respective path. It is to be understood that each set of serially cascaded encoders can include any number of disparate and/or similar encoders (i.e., n can be any value for a given path m).

The system of FIG. 9 also includes a output buffer module 40c which comprises a plurality of buffer/counters B/C m,n, each associated with a corresponding one of the encoders Em,n. In this embodiment, an input data block is sequentially applied to successive encoders (encoder stages) in the encoder path so as to increase the data compression ratio. For example, the output data block from a first encoder E1,1, is buffered and counted in B/C1,1, for subsequent processing by a second encoder E1,2. Advantageously, these parallel sets of sequential encoders are applied to the input data stream to effect content free lossless data compression. This embodiment provides for multi-stage sequential encoding of data with the maximum number of encoding steps subject to the available real-time, pseudo real-time, or other timing constraints.

As with each previously discussed embodiment, the encoders Em,n may include those lossless encoding techniques currently well known within the art, including: run length, Huffman, Lempel-Ziv Dictionary Compression, arithmetic coding, data compaction, and data null suppression. Encoding techniques are selected based upon their ability to effectively encode different types of input data. A full complement of encoders provides for broad coverage of existing and future data types. The input data blocks may be applied simultaneously to the encoder paths (i.e., the encoder paths may operate in parallel, utilizing task multiplexing on a single central processor, or via dedicated hardware, or by executing on a plurality of processor or dedicated hardware systems, or any combination thereof). In addition, an input data block may be sequentially applied to the encoder paths. Moreover, each serially cascaded encoder path may comprise a fixed (predetermined) sequence of encoders or a random sequence of encoders. Advantageously, by simultaneously or sequentially processing input data blocks via a plurality of sets of serially cascaded encoders, content free data compression is achieved.

Figure 10A:
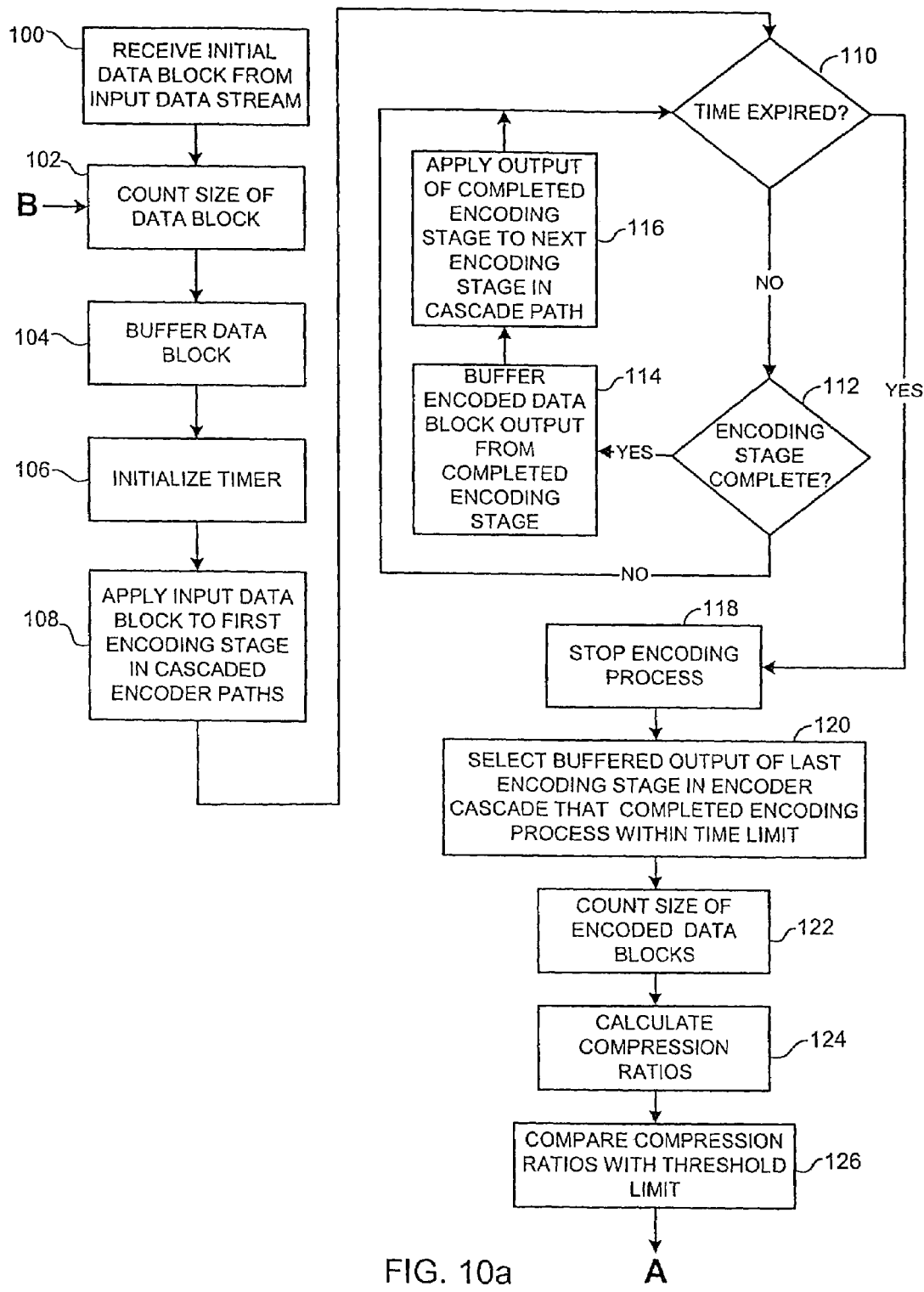
FIGS. 10a and 10b comprise a flow diagram of a data compression method according to another aspect of the present invention, which illustrates the operation of the data compression system of FIG. 9.
Figure 10B:
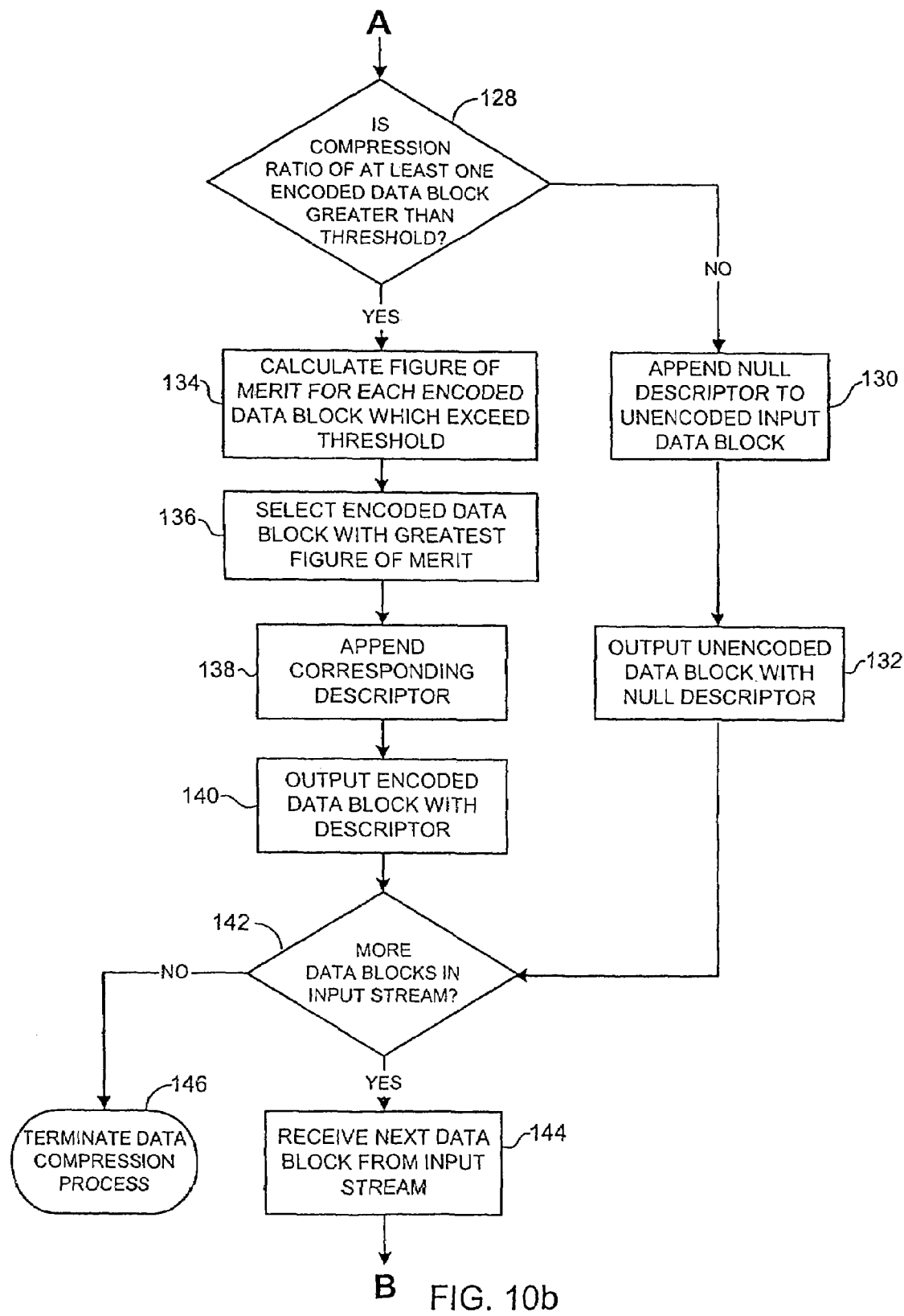

The operation of the data compression system of FIG. 9 will now be discussed in further detail with reference to the flow diagram of FIGS. 10a and 10b. A data stream comprising one or more data blocks is input into the data compression system and the first data block in the data stream is received (step 100), and its size is determined by the counter module 10 (step 102). The data block is then stored in buffer 20 (step 104).

Next, concurrent with the completion of the receipt and counting of the first data block, the interval timer 90 is initialized (step 106) and starts counting towards a user-specified time limit. The input data block is then sent to the cascade encoder module 30C wherein the input data block is applied to the first encoder (i.e., first encoding stage) in each of the cascaded encoder paths E1, 1 . . . Em,1 (step 108). Next, a determination is made as to whether the user specified time expires before the completion of the first stage encoding process (steps 110 and 112). If the first stage encoding process is completed before the expiration of the timer, i.e., each encoder (E1, 1 . . . Em, 1) completes its respective encoding process (negative result in step 110 and affirmative result in step 112), then an encoded data block is output from each encoder E1,1 . . . Em,1 and maintained in a corresponding buffer (step 114). Then for each cascade encoder path, the output of the completed encoding stage is applied to the next successive encoding stage in the cascade path (step 116). This process (steps 110, 112, 114, and 116) is repeated until the earlier of the timer expiration (affirmative result in step 110) or the completion of encoding by each encoder stage in the serially cascaded paths, at which time the encoding process is halted (step 118).

Then, for each cascade encoder path, the buffered encoded data block output by the last encoder stage that completes the encoding process before the expiration of the timer is selected for further processing (step 120). Advantageously, the interim stages of the multi-stage data encoding process are preserved. For example, the results of encoder E1, 1 are preserved even after encoder E1,2 begins encoding the output of encoder E1,1. If the interval timer expires after encoder E1,1 completes its respective encoding process but before encoder E1,2 completes its respective encoding process, the encoded data block from encoder E1,1 is complete and is utilized for calculating the compression ratio for the corresponding encoder path. The incomplete encoded data block from encoder E1,2 is either discarded or ignored.

It is to be appreciated that it is not necessary (or in some cases desirable) that some or all of the encoders in the cascade encoder paths complete the encoding process before the interval timer expires. Specifically, due to encoder data dependency, natural variation and the sequential application of the cascaded encoders, it is possible that certain encoders may not operate quickly enough and therefore do not comply with the timing constraints of the end use. Accordingly, the time limit ensures that the real-time or pseudo real-time nature of the data encoding is preserved.

After the encoded data blocks are selected (step 120), the size of each encoded data block is counted (step 122). Next, a compression ratio is calculated for each encoded data block by taking the ratio of the size of the input data block (as determined by the input counter 10) to the size of the encoded data block output from each encoder (step 124). Each compression ratio is then compared with an a priori-specified compression ratio threshold (step 126). A determination is made as to whether the compression ratio of at least one of the encoded data blocks exceeds the threshold limit (step 128). If there are no encoded data blocks having a compression ratio that exceeds the compression ratio threshold limit (negative determination in step 128), then the original unencoded input data block is selected for output and a null data compression type descriptor is appended thereto (step 130). The original unencoded data block and its corresponding null data compression type descriptor is then output for subsequent data processing, storage, or transmittal (step 132).

On the other hand, if one or more of the encoded data blocks possess a compression ratio greater than the compression ratio threshold limit (affirmative result in step 128), then a figure of merit is calculated for each encoded data block having a compression ratio which exceeds the compression ratio threshold limit (step 134). Again, the figure of merit for a given encoded data block is comprised of a weighted average of the a priori user specified threshold and the corresponding encoder desirability factor associated with the encoded data block. Next, the encoded data block having the greatest figure of merit is selected (step 136). An appropriate data compression type descriptor is then appended (step 138) to indicate the data encoding technique applied to the encoded data block. For instance, the data type compression descriptor can indicate that the encoded data block was processed by either a single encoding type, a plurality of sequential encoding types, and a plurality of random encoding types. The encoded data block (which has the greatest figure of merit) along with its corresponding data compression type descriptor is then output for subsequent data processing, storage, or transmittal (step 140).

After the unencoded data block or the encoded data input data block is output (steps 132 and 140), a determination is made as to whether the input data stream contains additional data blocks to be processed (step 142). If the input data stream includes additional data blocks (affirmative result in step 142), then the next successive data block is received (step 144), its block size is counted (return to step 102) and the data compression process is iterated for each successive data block in the input data stream. Once the final input data block is processed (negative result in step 142), data compression of the input data stream is finished (step 146).

Figure 11:
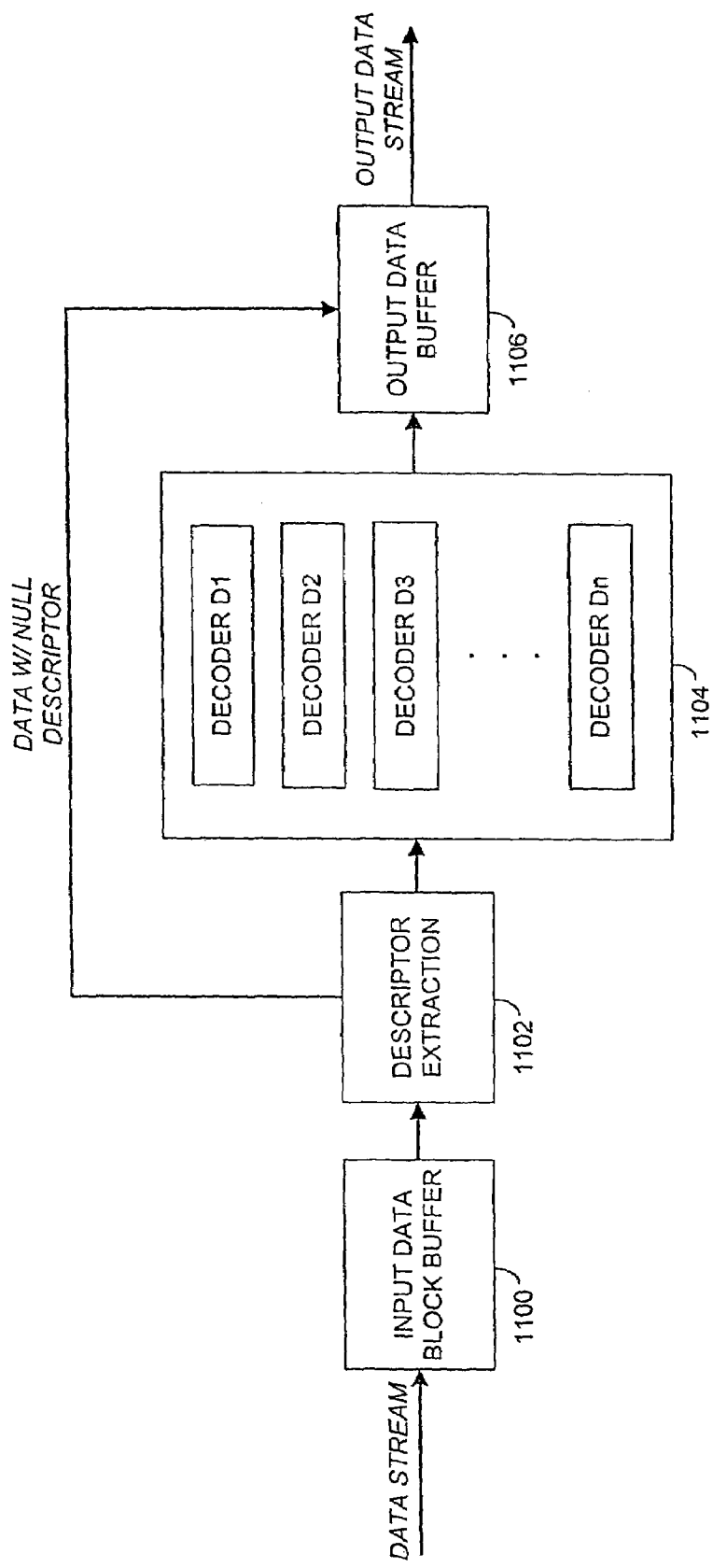
FIG. 11 is block diagram of a content independent data decompression system according to one embodiment of the present invention.

Referring now to FIG. 11, a block diagram illustrates a data decompression system according to one embodiment of the present invention. The data decompression system preferably includes an input buffer 1100 that receives as input an uncompressed or compressed data stream comprising one or more data blocks. The data blocks may range in size from individual bits through complete files or collections of multiple files. Additionally, the data block size may be fixed or variable. The input data buffer 1100 is preferably included (not required) to provide storage of input data for various hardware implementations. A descriptor extraction module 1102 receives the buffered (or unbuffered) input data block and then parses, lexically, syntactically, or otherwise analyzes the input data block using methods known by those skilled in the art to extract the data compression type descriptor associated with the data block. The data compression type descriptor may possess values corresponding to null (no encoding applied), a single applied encoding technique, or multiple encoding techniques applied in a specific or random order (in accordance with the data compression system embodiments and methods discussed above).

A decoder module 1104 includes a plurality of decoders D1 . . . Dn for decoding the input data block using a decoder, set of decoders, or a sequential set of decoders corresponding to the extracted compression type descriptor. The decoders D1 . . . Dn may include those lossless encoding techniques currently well known within the art, including: run length, Huffman, Lempel-Ziv Dictionary Compression, arithmetic coding, data compaction, and data null suppression. Decoding techniques are selected based upon their ability to effectively decode the various different types of encoded input data generated by the data compression systems described above or originating from any other desired source. As with the data compression systems discussed above, the decoder module 1104 may include multiple decoders of the same type applied in parallel so as to reduce the data decoding time.

The data decompression system also includes an output data buffer 1106 for buffering the decoded data block output from the decoder module 1104.

Figure 12:
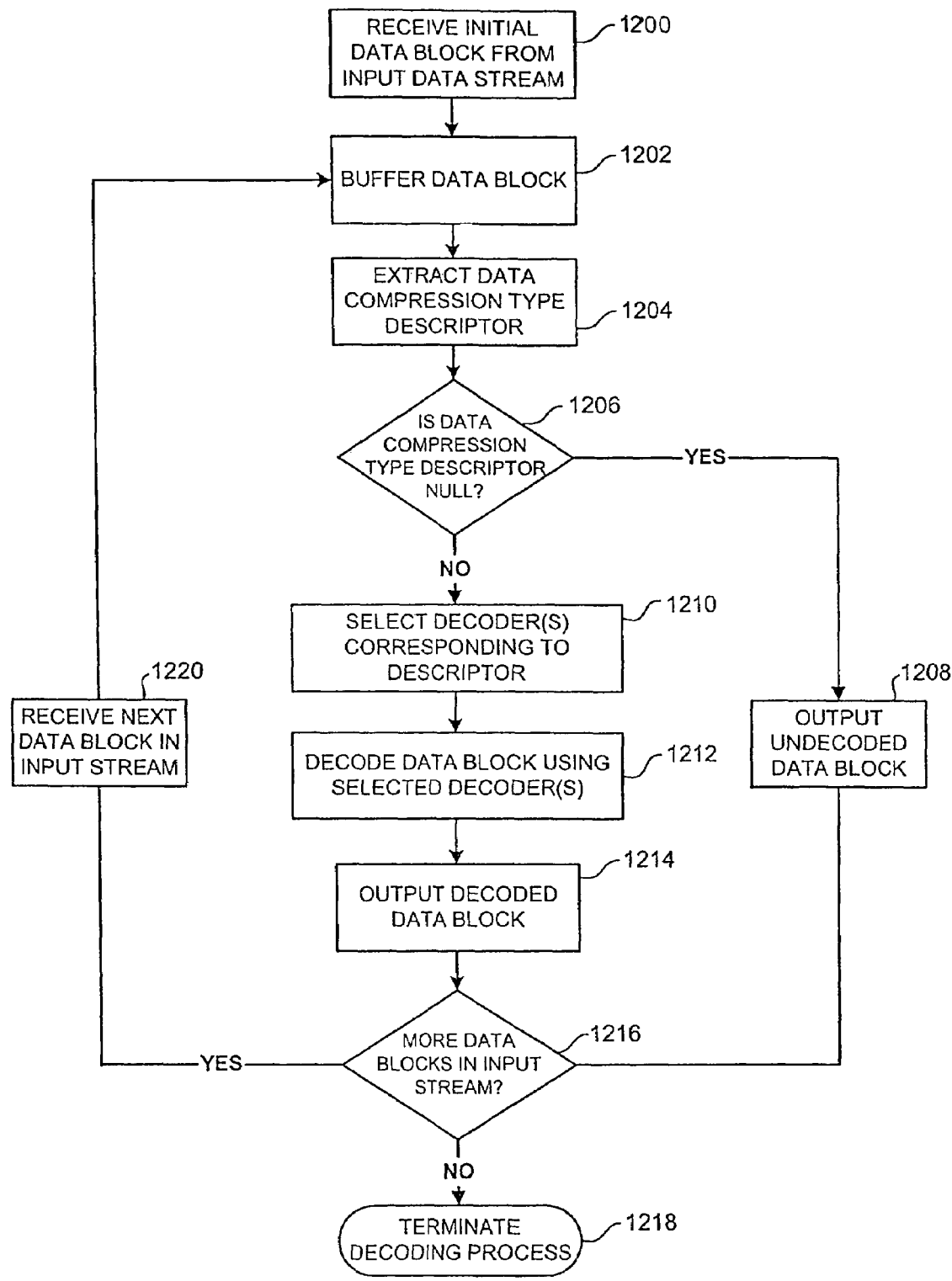
FIG. 12 is a flow diagram of a data decompression method according to one aspect of the present invention, which illustrates the operation of the data compression system of FIG. 11.

The operation of the data decompression system of FIG. 11 will be discussed in further detail with reference to the flow diagram of FIG. 12. A data stream comprising one or more data blocks of compressed or uncompressed data is input into the data decompression system and the first data block in the stream is received (step 1200) and maintained in the buffer (step 1202). As with the data compression systems discussed above, data decompression is performed on a per data block basis. The data compression type descriptor is then extracted from the input data block (step 1204). A determination is then made as to whether the data compression type descriptor is null (step 1206). If the data compression type descriptor is determined to be null (affirmative result in step 1206), then no decoding is applied to the input data block and the original undecoded data block is output (or maintained in the output buffer) (step 1208).

On the other hand, if the data compression type descriptor is determined to be any value other than null (negative result in step 1206), the corresponding decoder or decoders are then selected (step 1210) from the available set of decoders D1 . . . Dn in the decoding module 1104. It is to be understood that the data compression type descriptor may mandate the application of: a single specific decoder, an ordered sequence of specific decoders, a random order of specific decoders, a class or family of decoders, a mandatory or optional application of parallel decoders, or any combination or permutation thereof. The input data block is then decoded using the selected decoders (step 1212), and output (or maintained in the output buffer 1106) for subsequent data processing, storage, or transmittal (step 1214). A determination is then made as to whether the input data stream contains additional data blocks to be processed (step 1216). If the input data stream includes additional data blocks (affirmative result in step 1216), the next successive data block is received (step 1220), and buffered (return to step 1202). Thereafter, the data decompression process is iterated for each data block in the input data stream. Once the final input data block is processed (negative result in step 1216), data decompression of the input data stream is finished (step 1218).

Figure 13A:
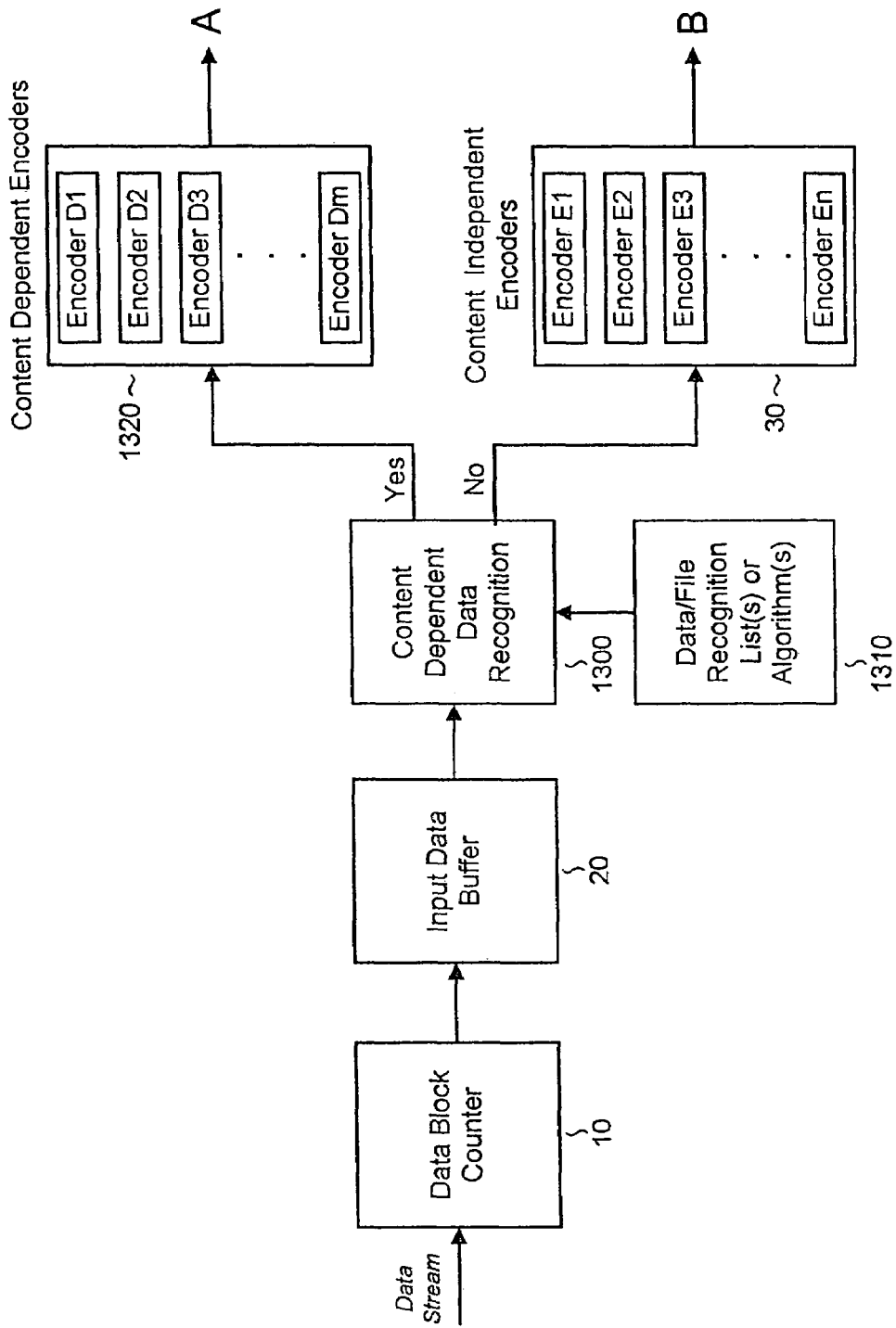
FIGS. 13a and 13b comprise a block diagram of a data compression system comprising content dependent and content independent data compression, according to an embodiment of the present invention.
Figure 13B:
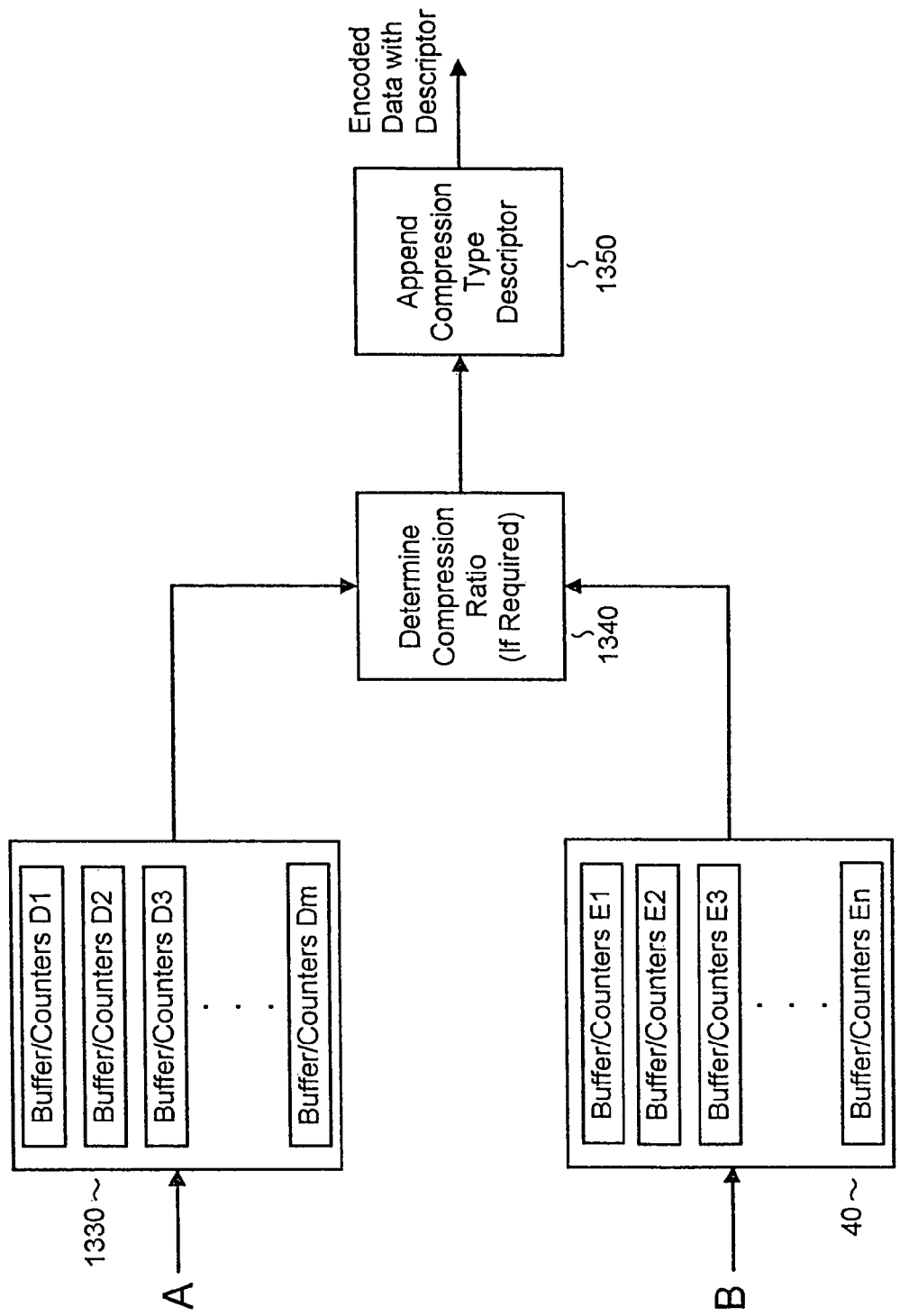
Figure 14A:
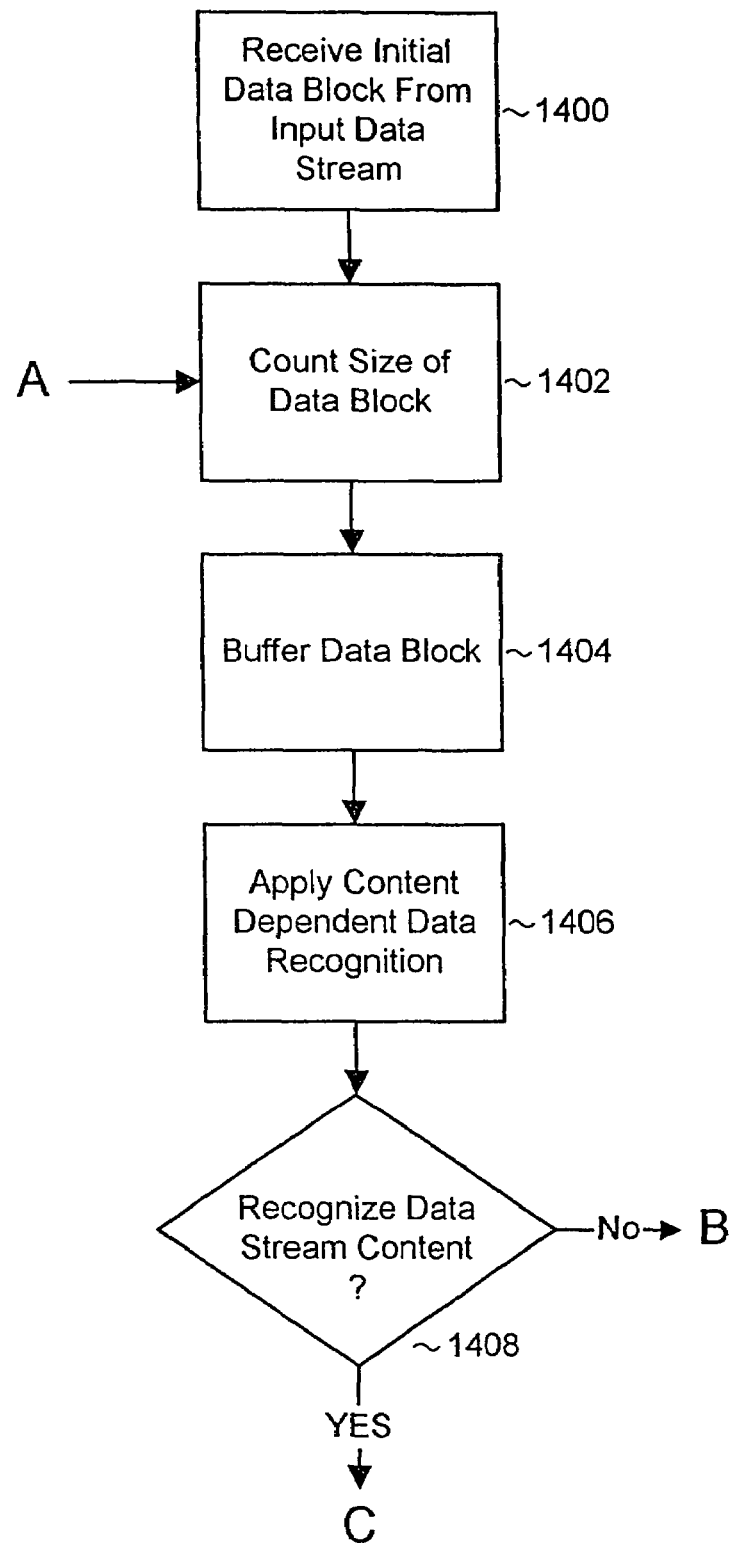
FIGS. 14a-14d comprise a flow diagram of a data compression method using both content dependent and content independent data compression, according to one aspect of the present invention.
Figure 14B:
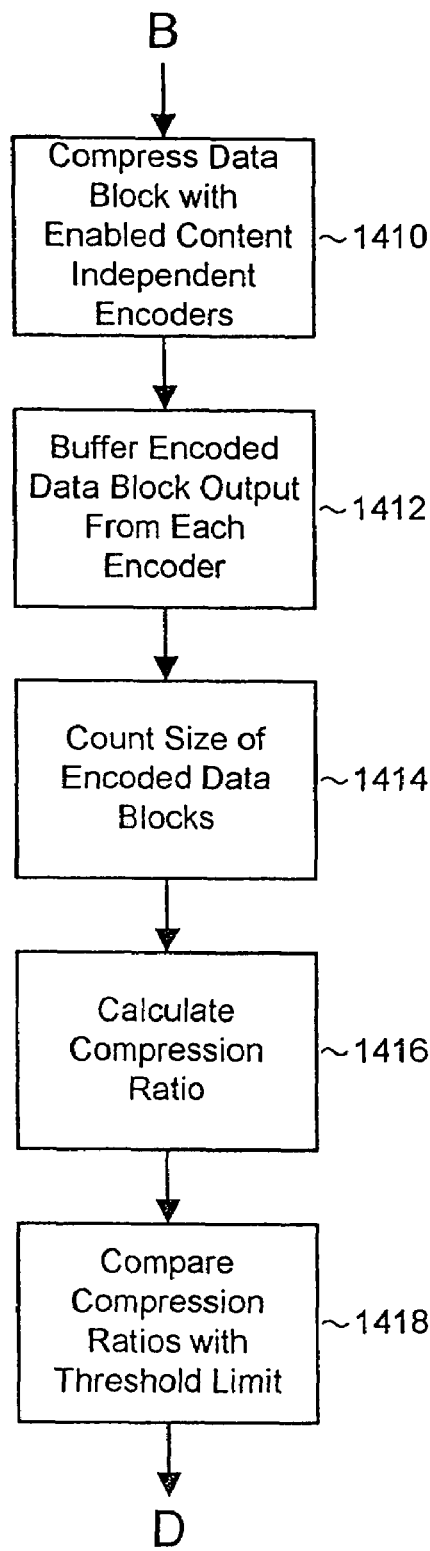
Figure 14C:
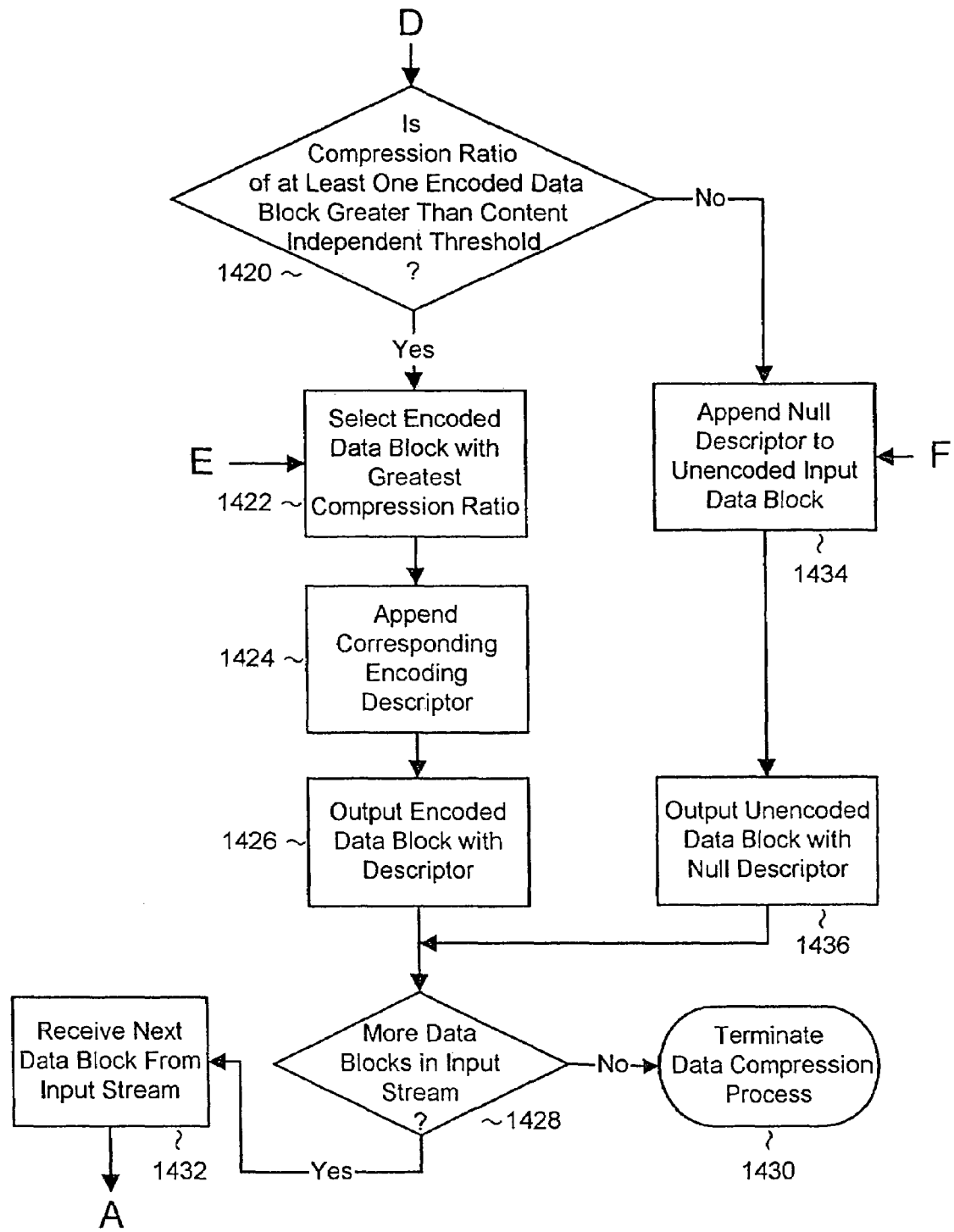
Figure 14D:
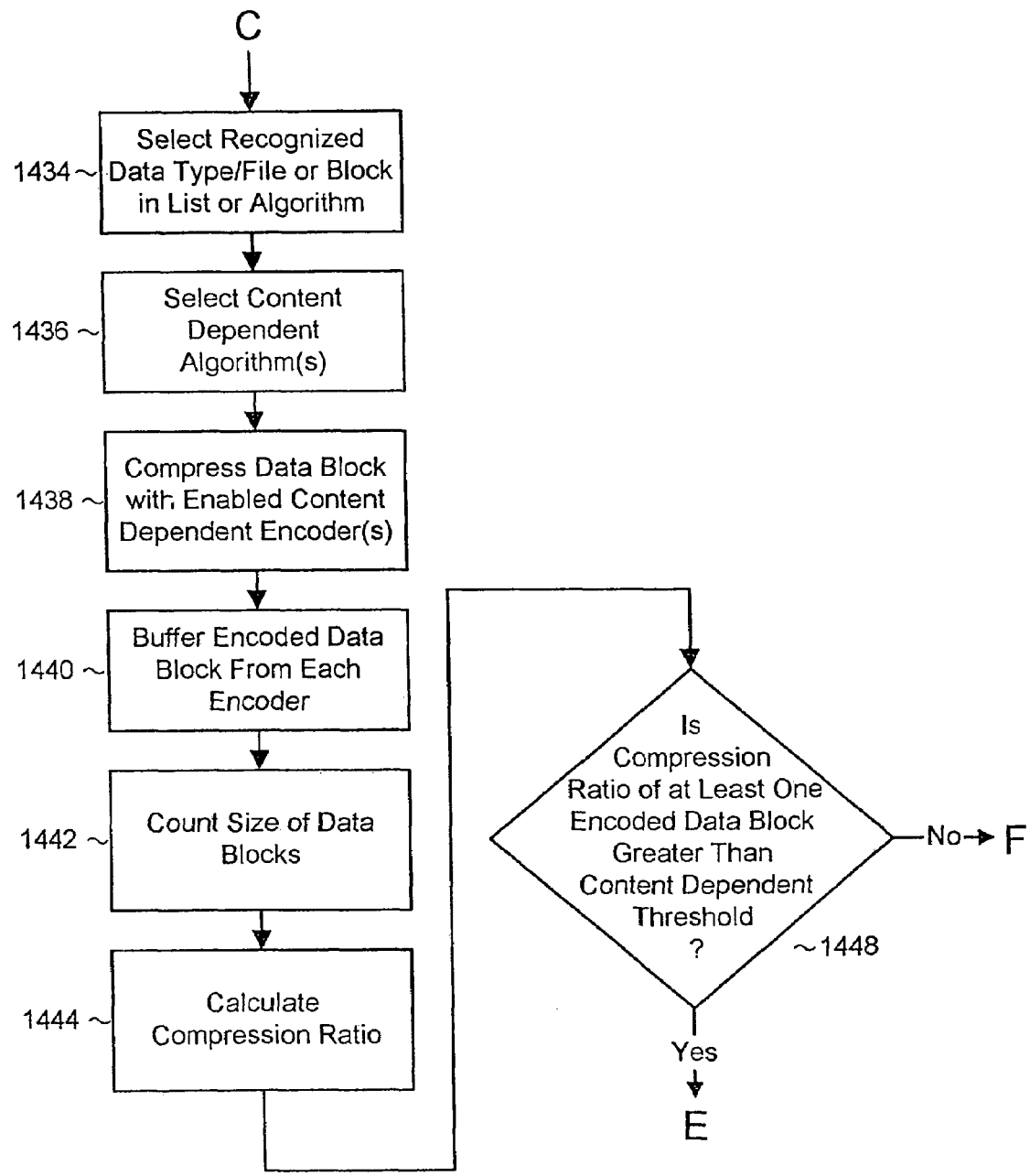

In other embodiments of the present invention described below, data compression is achieved using a combination of content dependent data compression and content independent data compression. For example, FIGS. 13a and 13b are block diagrams illustrating a data compression system employing both content independent and content dependent data compression according to one embodiment of the present invention, wherein content independent data compression is applied to a data block when the content of the data block cannot be identified or is not associable with a specific data compression algorithm. The data compression system comprises a counter module 10 that receives as input an uncompressed or compressed data stream. It is to be understood that the system processes the input data stream in data blocks that may range in size from individual bits through complete files or collections of multiple files. Additionally, the data block size may be fixed or variable. The counter module 10 counts the size of each input data block (i.e., the data block size is counted in bits, bytes, words, any convenient data multiple or metric, or any combination thereof).

An input data buffer 20, operatively connected to the counter module 10, may be provided for buffering the input data stream in order to output an uncompressed data stream in the event that, as discussed in further detail below, every encoder fails to achieve a level of compression that exceeds a priori specified content independent or content dependent minimum compression ratio thresholds. It is to be understood that the input data buffer 20 is not required for implementing the present invention.

A content dependent data recognition module 1300 analyzes the incoming data stream to recognize data types, data structures, data block formats, file substructures, file types, and/or any other parameters that may be indicative of either the data type/content of a given data block or the appropriate data compression algorithm or algorithms (in serial or in parallel) to be applied. Optionally, a data file recognition list(s) or algorithm(s) 1310 module may be employed to hold and/or determine associations between recognized data parameters and appropriate algorithms. Each data block that is recognized by the content data compression module 1300 is routed to a content dependent encoder module 1320, if not the data is routed to the content independent encoder module 30.

A content dependent encoder module 1320 is operatively connected to the content dependent data recognition module 1300 and comprises a set of encoders D1, D2, D3 . . . Dm. The encoder set D1, D2, D3 . . . Dm may include any number "n" of those lossless or lossy encoding techniques currently well known within the art such as MPEG4, various voice codecs, MPEG3, AC3, AAC, as well as lossless algorithms such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders and or codecs are preferably selected to provide a broad coverage of existing and future data types.

The content independent encoder module 30, which is operatively connected to the content dependent data recognition module 1300, comprises a set of encoders E1, E2, E3 . . . En. The encoder set E1, E2, E3 . . . En may include any number "n" of those lossless encoding techniques currently well known within the art such as run length, Huffman, Lempel-Ziv Dictionary Compression, arithmetic coding, data compaction, and data null suppression. Again, it is to be understood that the encoding techniques are selected based upon their ability to effectively encode different types of input data. It is to be appreciated that a full complement of encoders are preferably selected to provide a broad coverage of existing and future data types.

The encoder modules (content dependent 1320 and content independent 30) selectively receive the buffered input data blocks (or unbuffered input data blocks from the counter module 10) from module 1300 based on the results of recognition. Data compression is performed by the respective encoder modules wherein some or all of the encoders D1 . . . Dm or E1 . . . En processes a given input data block and outputs a corresponding set of encoded data blocks. It is to be appreciated that the system affords a user the option to enable/disable any one or more of the encoders D1 . . . Dm and E1 . . . En prior to operation. As is understood by those skilled in the art, such feature allows the user to tailor the operation of the data compression system for specific applications. It is to be further appreciated that the encoding process may be performed either in parallel or sequentially. In particular, the encoder set D1 through Dm of encoder module 1320 and/or the encoder set E1 through En of encoder module 30 may operate in parallel (i.e., simultaneously processing a given input data block by utilizing task multiplexing on a single central processor, via dedicated hardware, by executing on a plurality of processor or dedicated hardware systems, or any combination thereof). In addition, encoders D1 through Dm and E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffinan encoders for parallel processing of an input data block. It should be further noted that one or more algorithms may be implemented in dedicated hardware such as an MPEG4 or MP3 encoding integrated circuit.

Buffer/counter modules 1330 and 40 are operatively connected to their respective encoding modules 1320 and 30, for buffering and counting the size of each of the encoded data blocks output from the respective encoder modules. Specifically, the content dependent buffer/counter 1330 comprises a plurality of buffer/counters BCD1, BCD2, BCD3 . . . BCDm, each operatively associated with a corresponding one of the encoders D1 . . . Dm. Similarly the content independent buffer/counters BCE1, BCE2, BCE3 . . . BCEn, each operatively associated with a corresponding one of the encoders E1 . . . En. A compression ratio module 1340, operatively connected to the content dependent output buffer/counters 1330 and content independent buffer/counters 40 determines the compression ratio obtained for each of the enabled encoders D1 . . . Dm and or E1 . . . En by taking the ratio of the size of the input data block to the size of the output data block stored in the corresponding buffer/counters BCD1, BCD2, BCD3 . . . BCDm and or BCE1, BCE2, BCE3 . . . BCEn. In addition, the compression ratio module 1340 compares each compression ratio with an a priori-specified compression ratio threshold limit to determine if at least one of the encoded data blocks output from the enabled encoders BCD1, BCD2, BCD3 . . . BCDm and or BCE1, BCE2, BCE3 . . . BCEn achieves a compression that meets an a priori-specified threshold. As is understood by those skilled in the art, the threshold limit may be specified as any value inclusive of data expansion, no data compression or expansion, or any arbitrarily desired compression limit. It should be noted that different threshold values may be applied to content dependent and content independent encoded data. Further these thresholds may be adaptively modified based upon enabled encoders in either or both the content dependent or content independent encoder sets, along with any associated parameters. A compression type description module 1350, operatively coupled to the compression ratio module 1340, appends a corresponding compression type descriptor to each encoded data block which is selected for output so as to indicate the type of compression format of the encoded data block.

A mode of operation of the data compression system of FIGS. 13a and 13b will now be discussed with reference to the flow diagrams of FIGS. 14a-14d, which illustrates a method for performing data compression using a combination of content dependent and content independent data compression. In general, content independent data compression is applied to a given data block when the content of a data block cannot be identified or is not associated with a specific data compression algorithm. More specifically, referring to FIG. 14a, a data stream comprising one or more data blocks is input into the data compression system and the first data block in the stream is received (step 1400). As stated above, data compression is performed on a per data block basis. As previously stated a data block may represent any quantity of data from a single bit through a multiplicity of files or packets and may vary from block to block. Accordingly, the first input data block in the input data stream is input into the counter module 10 that counts the size of the data block (step 1402). The data block is then stored in the buffer 20 (step 1404). The data block is then analyzed on a per block or multi-block basis by the content dependent data recognition module 1300 (step 1406). If the data stream content is not recognized utilizing the recognition list(s) or algorithms(s) module 1310 (step 1408) the data is routed to the content independent encoder module 30 and compressed by each (enabled) encoder E1 . . . En (step 1410). Upon completion of the encoding of the input data block, an encoded data block is output from each (enabled) encoder E1 . . . En and maintained in a corresponding buffer (step 1412), and the encoded data block size is counted (step 1414).

Next, a compression ratio is calculated for each encoded data block by taking the ratio of the size of the input data block (as determined by the input counter 10 to the size of each encoded data block output from the enabled encoders (step 1416). Each compression ratio is then compared with an a priori-specified compression ratio threshold (step 1418). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1420). If there are no encoded data blocks having a compression ratio that exceeds the compression ratio threshold limit (negative determination in step 1420), then the original unencoded input data block is selected for output and a null data compression type descriptor is appended thereto (step 1434). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1436).

On the other hand, if one or more of the encoded data blocks possess a compression ratio greater than the compression ratio threshold limit (affirmative result in step 1420), then the encoded data block having the greatest compression ratio is selected (step 1422). An appropriate data compression type descriptor is then appended (step 1424). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1426).

As previously stated the data block stored in the buffer 20 (step 1404) is analyzed on a per block or multi-block basis by the content dependent data recognition module 1300 (step 1406). If the data stream content is recognized utilizing the recognition list(s) or algorithms(s) module 1310 (step 1434) the appropriate content dependent algorithms are enabled and initialized (step 1436), and the data is routed to the content dependent encoder module 1320 and compressed by each (enabled) encoder D1 . . . Dm (step 1438). Upon completion of the encoding of the input data block, an encoded data block is output from each (enabled) encoder D1 . . . Dm and maintained in a corresponding buffer (step 1440), and the encoded data block size is counted (step 1442).

Next, a compression ratio is calculated for each encoded data block by taking the ratio of the size of the input data block (as determined by the input counter 10 to the size of each encoded data block output from the enabled encoders (step 1444). Each compression ratio is then compared with an a priori-specified compression ratio threshold (step 1448). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1420). If there are no encoded data blocks having a compression ratio that exceeds the compression ratio threshold limit (negative determination in step 1420), then the original unencoded input data block is selected for output and a null data compression type descriptor is appended thereto (step 1434). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1436).

On the other hand, if one or more of the encoded data blocks possess a compression ratio greater than the compression ratio threshold limit (affirmative result in step 1420), then the encoded data block having the greatest compression ratio is selected (step 1422). An appropriate data compression type descriptor is then appended (step 1424). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1426).

After the encoded data block or the unencoded data input data block is output (steps 1426 and 1436), a determination is made as to whether the input data stream contains additional data blocks to be processed (step 1428). If the input data stream includes additional data blocks (affirmative result in step 1428), the next successive data block is received (step 1432), its block size is counted (return to step 1402) and the data compression process in repeated. This process is iterated for each data block in the input data stream. Once the final input data block is processed (negative result in step 1428), data compression of the input data stream is finished (step 1430).

Since a multitude of data types may be present within a given input data block, it is often difficult and/or impractical to predict the level of compression that will be achieved by a specific encoder. Consequently, by processing the input data blocks with a plurality of encoding techniques and comparing the compression results, content free data compression is advantageously achieved. Further the encoding may be lossy or lossless dependent upon the input data types. Further if the data type is not recognized the default content independent lossless compression is applied. It is not a requirement that this process be deterministic—in fact a certain probability may be applied if occasional data loss is permitted. It is to be appreciated that this approach is scalable through future generations of processors, dedicated hardware, and software. As processing capacity increases and costs reduce, the benefits provided by the present invention will continue to increase. It should again be noted that the present invention may employ any lossless data encoding technique.

Figure 15A:
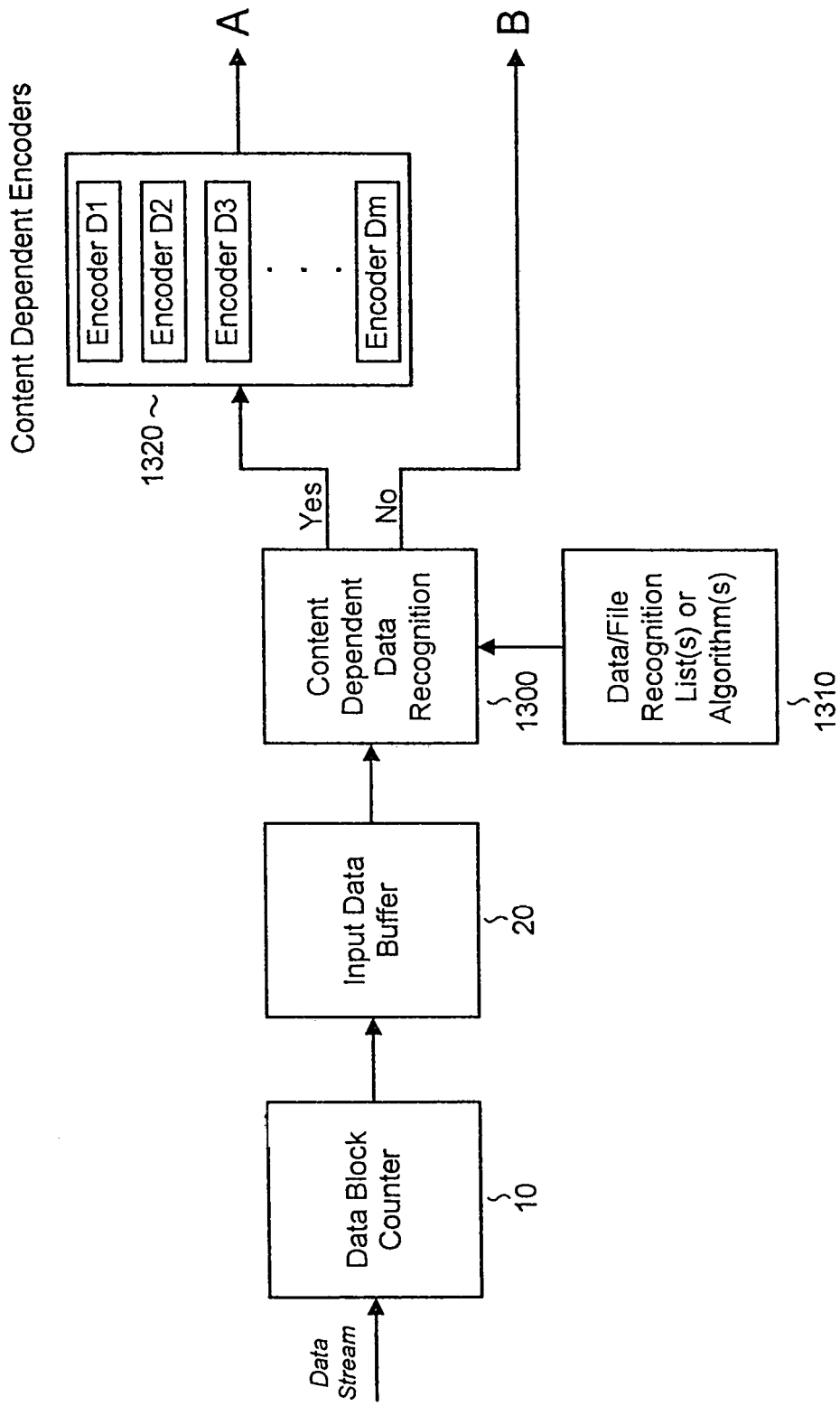
FIGS. 15a and 15b comprise a block diagram of a data compression system comprising content dependent and content independent data compression, according to another embodiment of the present invention.
Figure 15B:
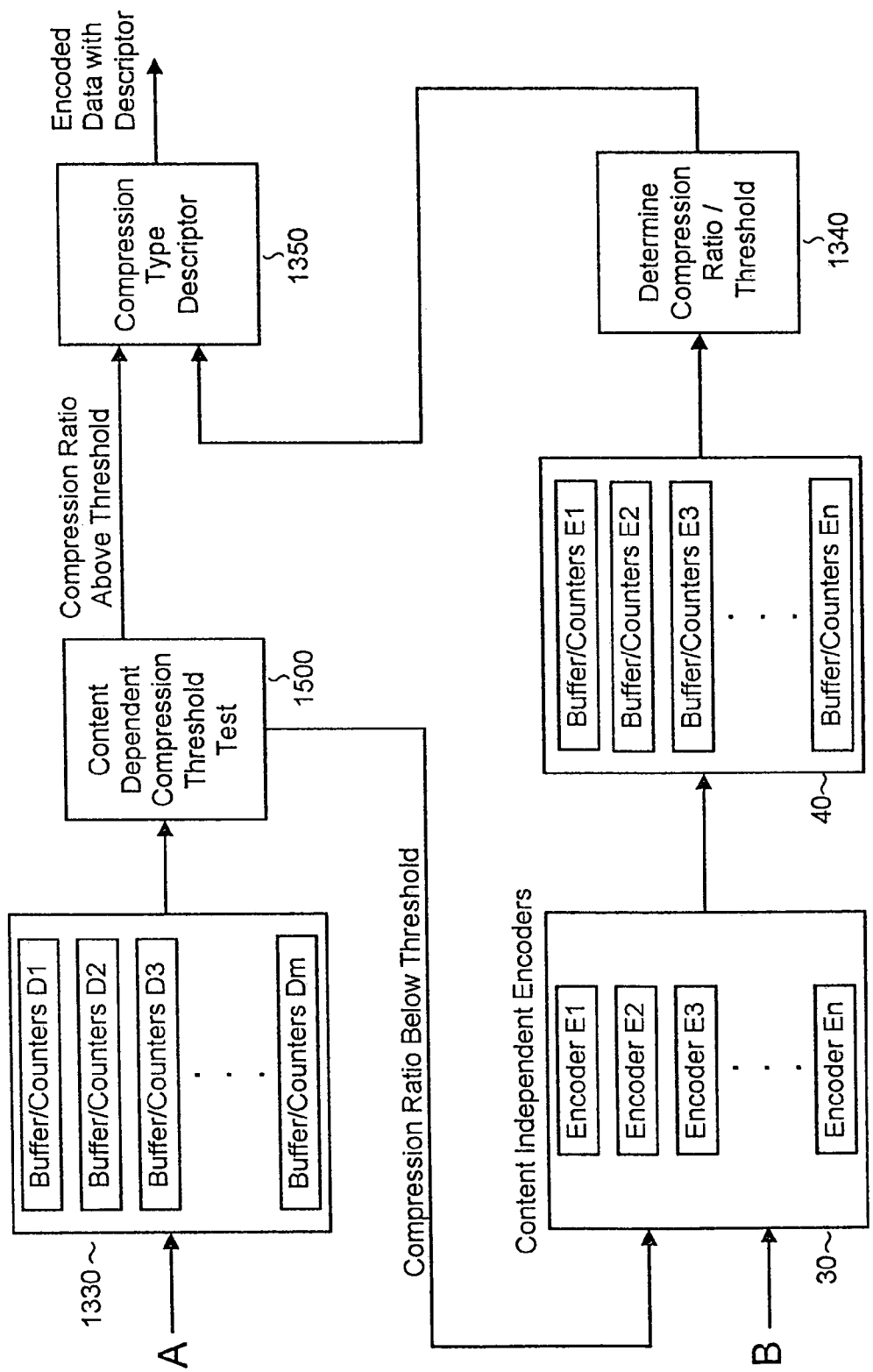
Figure 16A:
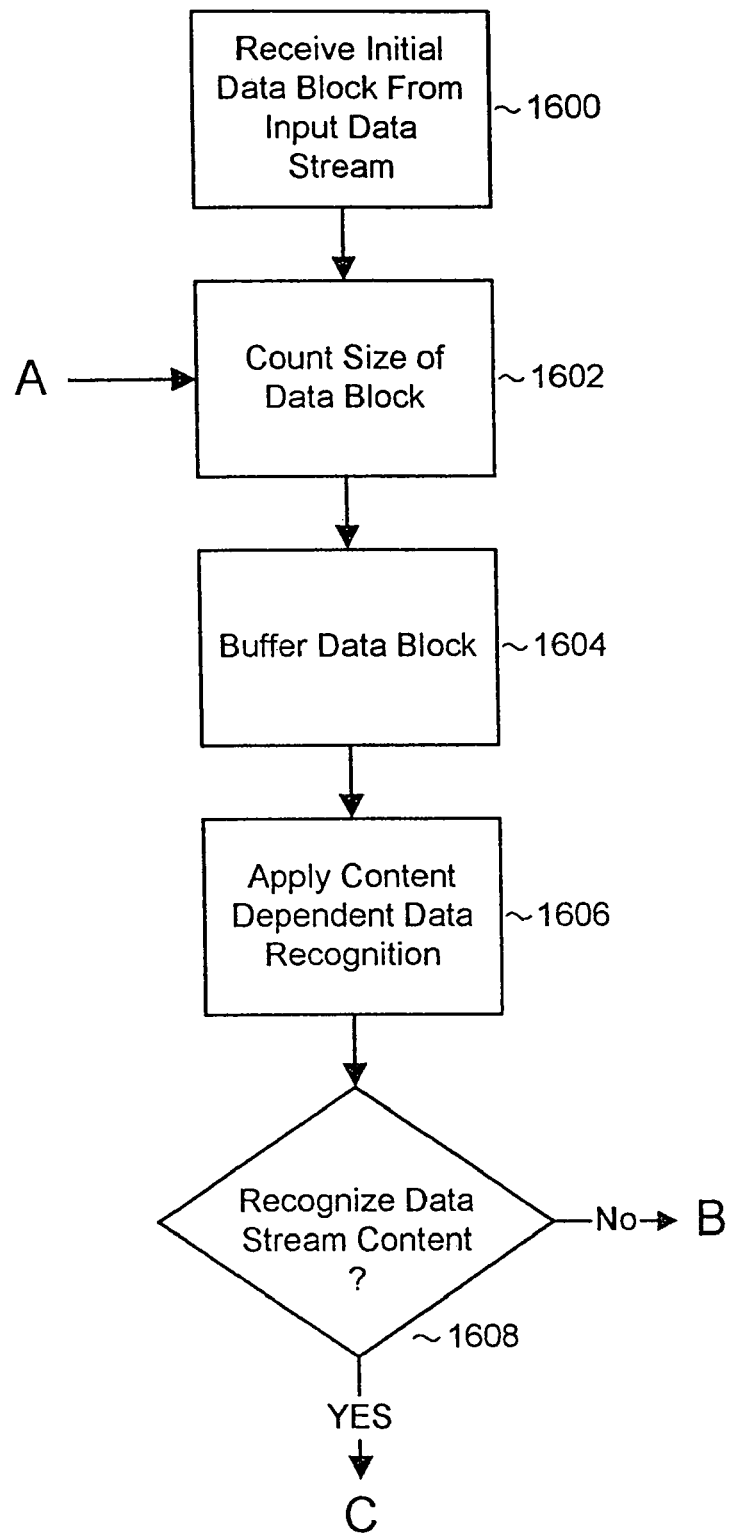
FIGS. 16a-16d comprise a flow diagram of a data compression method using both content dependent and content independent data compression, according to another aspect of the present invention.
Figure 16B:
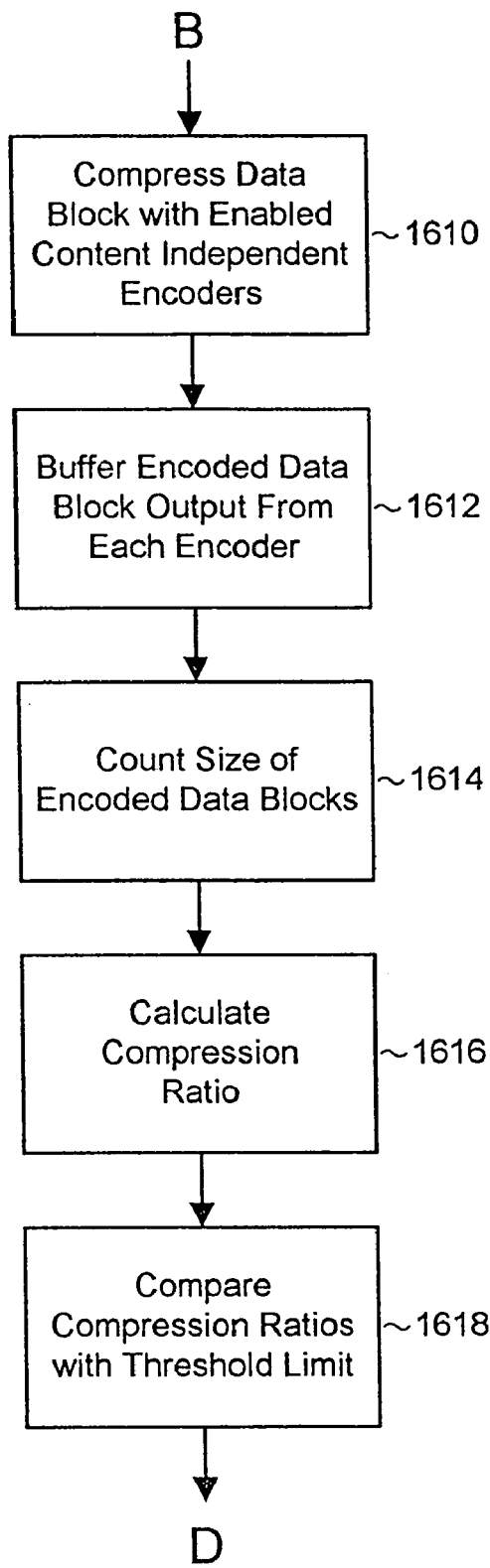
Figure 16C:
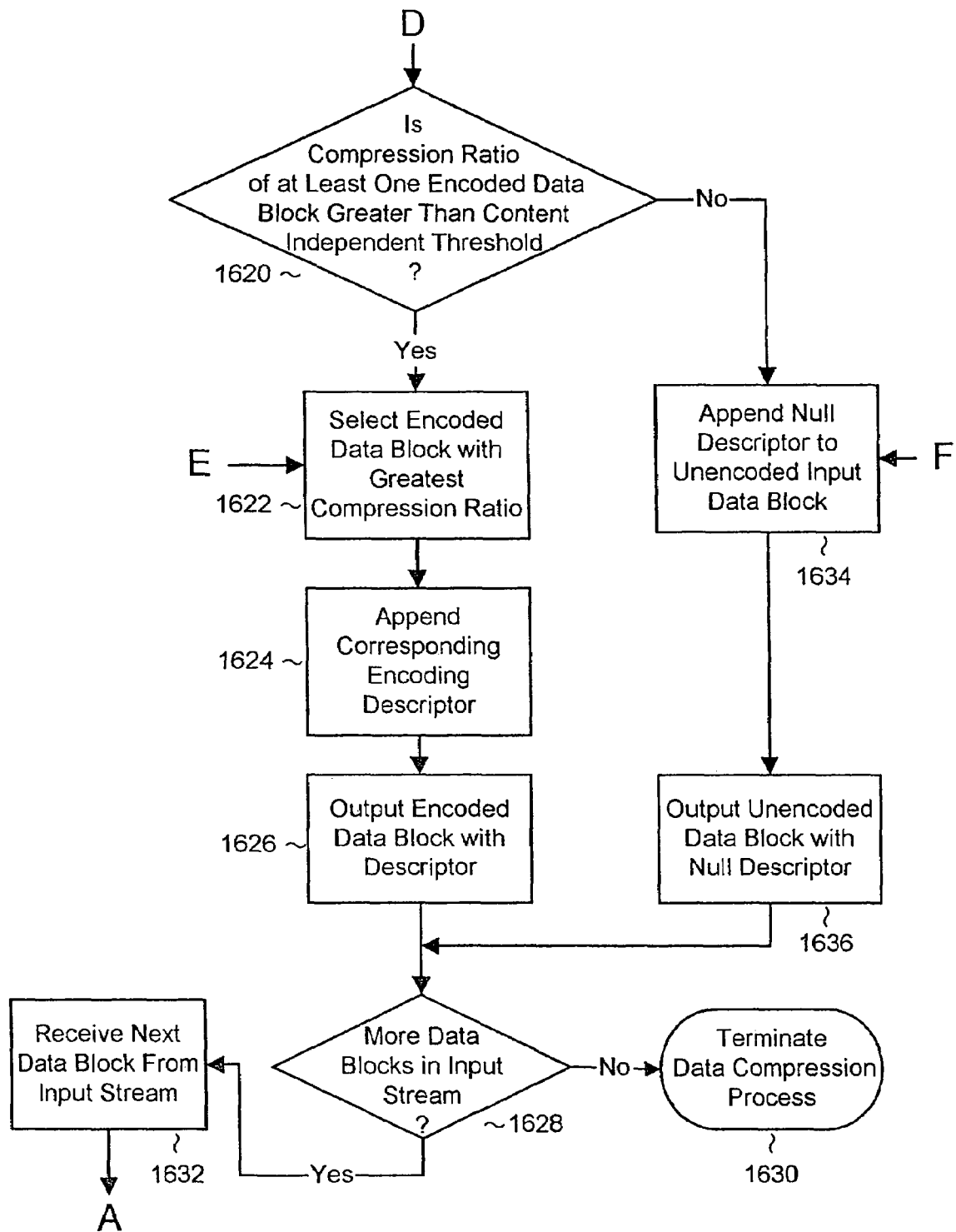
Figure 16D:
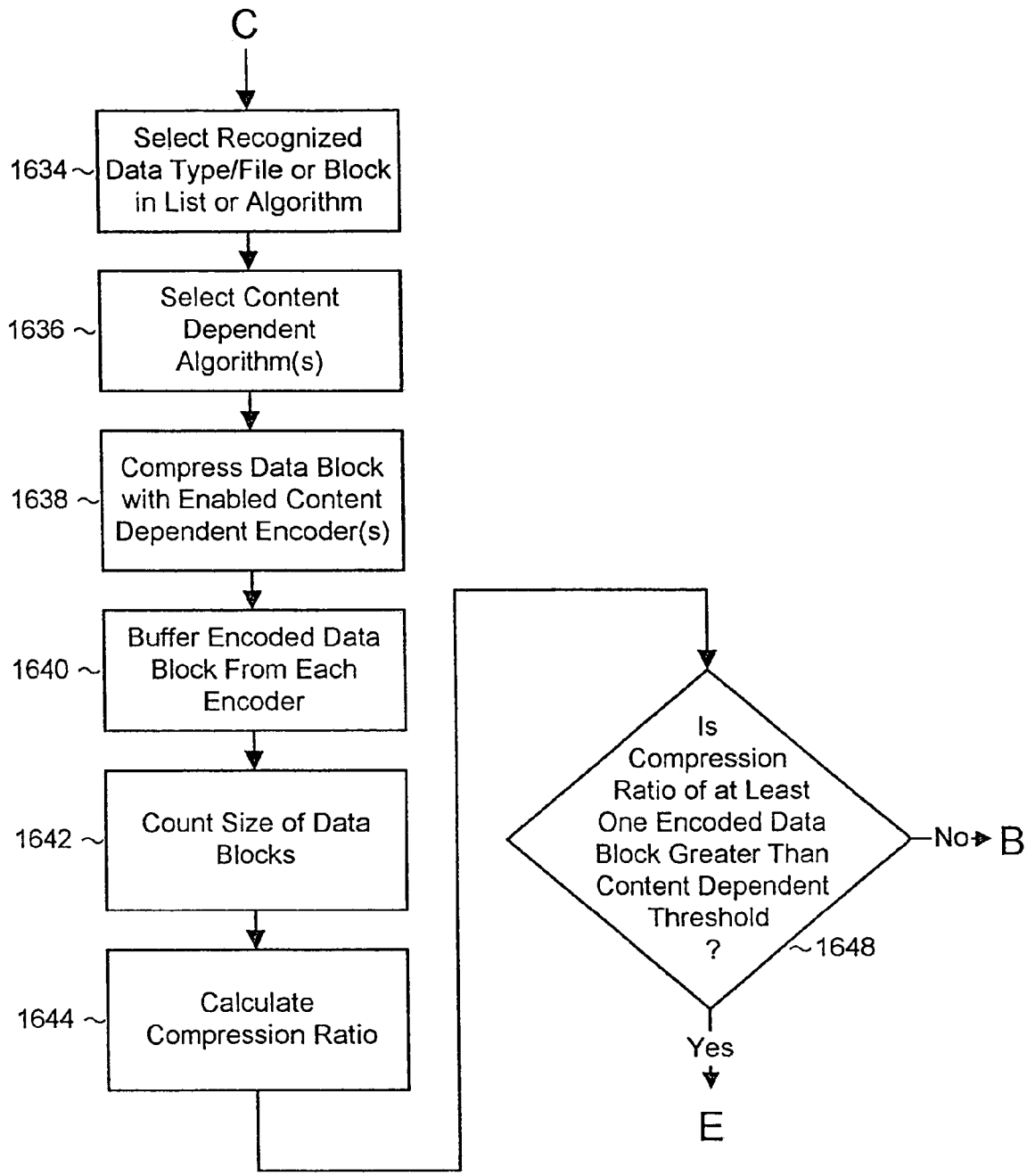

FIGS. 15*a* and 15*b* are block diagrams illustrating a data compression system employing both content independent and content dependent data compression according to another embodiment of the present invention. The system in FIGS. 15*a* and 15*b* is similar in operation to the system of FIGS. 13*a* and 13*b* in that content independent data compression is applied to a data block when the content of the data block cannot be identified or is not associable with a specific data compression algorithm. The system of FIGS. 15a and 15b additionally performs content independent data compression on a data block when the compression ratio obtained for the data block using the content dependent data compression does not meet a specified threshold.

A mode of operation of the data compression system of FIGS. 15a and 15b will now be discussed with reference to the flow diagram of FIGS. 16a-16d, which illustrates a method for performing data compression using a combination of content dependent and content independent data compression. A data stream comprising one or more data blocks is input into the data compression system and the first data block in the stream is received (step 1600). As stated above, data compression is performed on a per data block basis. As previously stated a data block may represent any quantity of data from a single bit through a multiplicity of files or packets and may vary from block to block. Accordingly, the first input data block in the input data stream is input into the counter module 10 that counts the size of the data block (step 1602). The data block is then stored in the buffer 20 (step 1604). The data block is then analyzed on a per block or multi-block basis by the content dependent data recognition module 1300 (step 1606). If the data stream content is not recognized utilizing the recognition list(s) or algorithms(s) module 1310 (Step 1608) the data is routed to the content independent encoder module 30 and compressed by each (enabled) encoder E1 . . . En (step 1610). Upon completion of the encoding of the input data block, an encoded data block is output from each (enabled) encoder E1 . . . En and maintained in a corresponding buffer (step 1612), and the encoded data block size is counted (step 1614).

Next, a compression ratio is calculated for each encoded data block by taking the ratio of the size of the input data block (as determined by the input counter 10 to the size of each encoded data block output from the enabled encoders (step 1616). Each compression ratio is then compared with an a priori-specified compression ratio threshold (step 1618). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1620). If there are no encoded data blocks having a compression ratio that exceeds the compression ratio threshold limit (negative determination in step 1620), then the original unencoded input data block is selected for output and a null data compression type descriptor is appended thereto (step 1634). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1636).

On the other hand, if one or more of the encoded data blocks possess a compression ratio greater than the compression ratio threshold limit (affirmative result in step 1620), then the encoded data block having the greatest compression ratio is selected (step 1622). An appropriate data compression type descriptor is then appended (step 1624). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1626).

As previously stated the data block stored in the buffer 20 (step 1604) is analyzed on a per block or multi-block basis by the content dependent data recognition module 1300 (step 1606). If the data stream content is recognized utilizing the recognition list(s) or algorithms(s) module 1310 (step 1634) the appropriate content dependent algorithms are enabled and initialized (step 1636) and the data is routed to the content dependent encoder module 1620 and compressed by each (enabled) encoder D1 . . . Dm (step 1638). Upon completion of the encoding of the input data block, an encoded data block is output from each (enabled) encoder D1 . . . Dm and maintained in a corresponding buffer (step 1640), and the encoded data block size is counted (step 1642).

Next, a compression ratio is calculated for each encoded data block by taking the ratio of the size of the input data block (as determined by the input counter 10 to the size of each encoded data block output from the enabled encoders (step 1644). Each compression ratio is then compared with an apriori-specified compression ratio threshold (step 1648). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1648). If there are no encoded data blocks having a compression ratio that exceeds the compression ratio threshold limit (negative determination in step 1620), then the original unencoded input data block is routed to the content independent encoder module 30 and the process resumes with compression utilizing content independent encoders (step 1610).

After the encoded data block or the unencoded data input data block is output (steps 1626 and 1636), a determination is made as to whether the input data stream contains additional data blocks to be processed (step 1628). If the input data stream includes additional data blocks (affirmative result in step 1628), the next successive data block is received (step 1632), its block size is counted (return to step 1602) and the data compression process in repeated. This process is iterated for each data block in the input data stream. Once the final input data block is processed (negative result in step 1628), data compression of the input data stream is finished (step 1630).

Figure 17A:
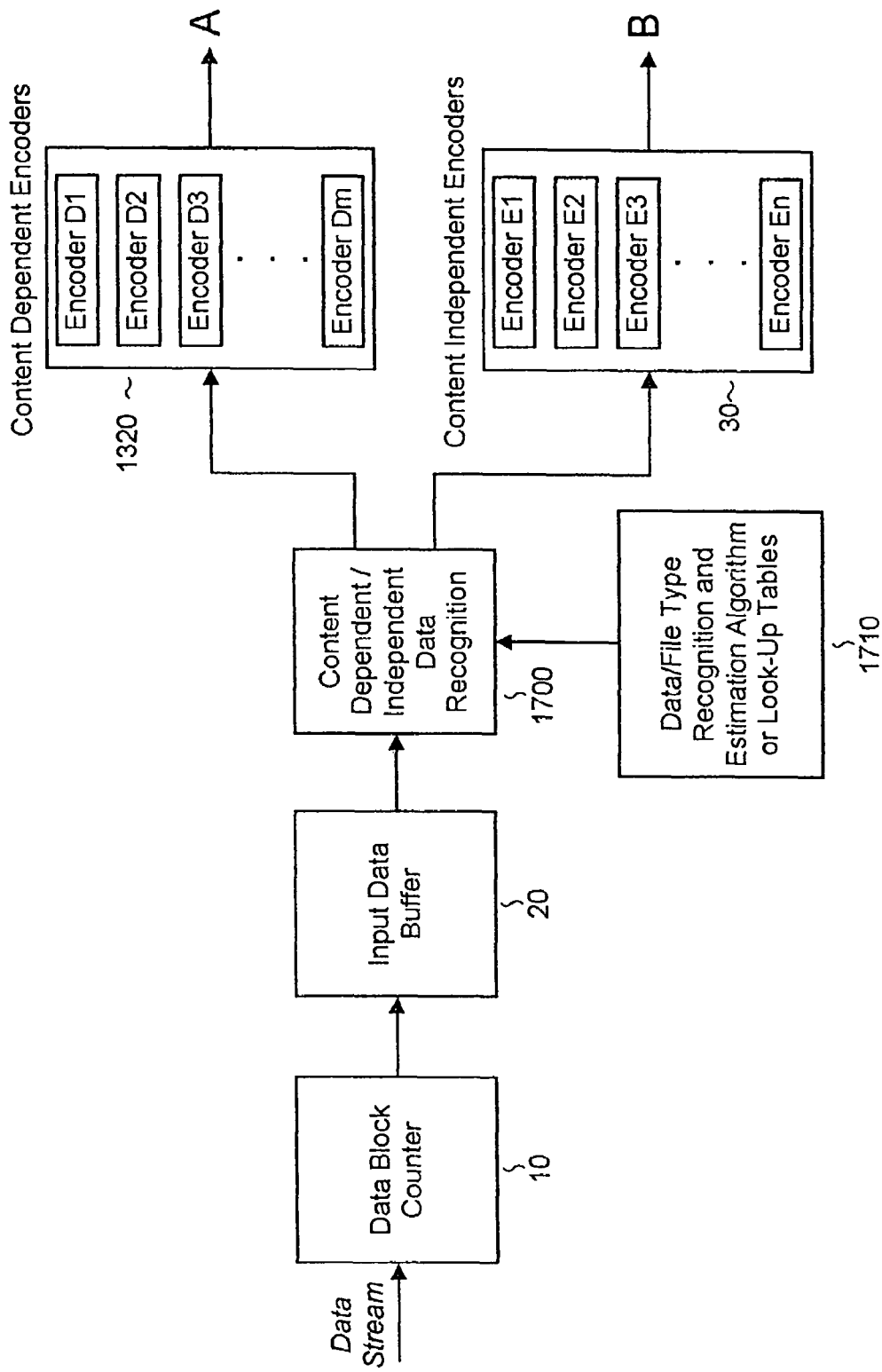
FIGS. 17a and 17b comprise a block diagram of a data compression system comprising content dependent and content independent data compression, according to another embodiment of the present invention.
Figure 17B:
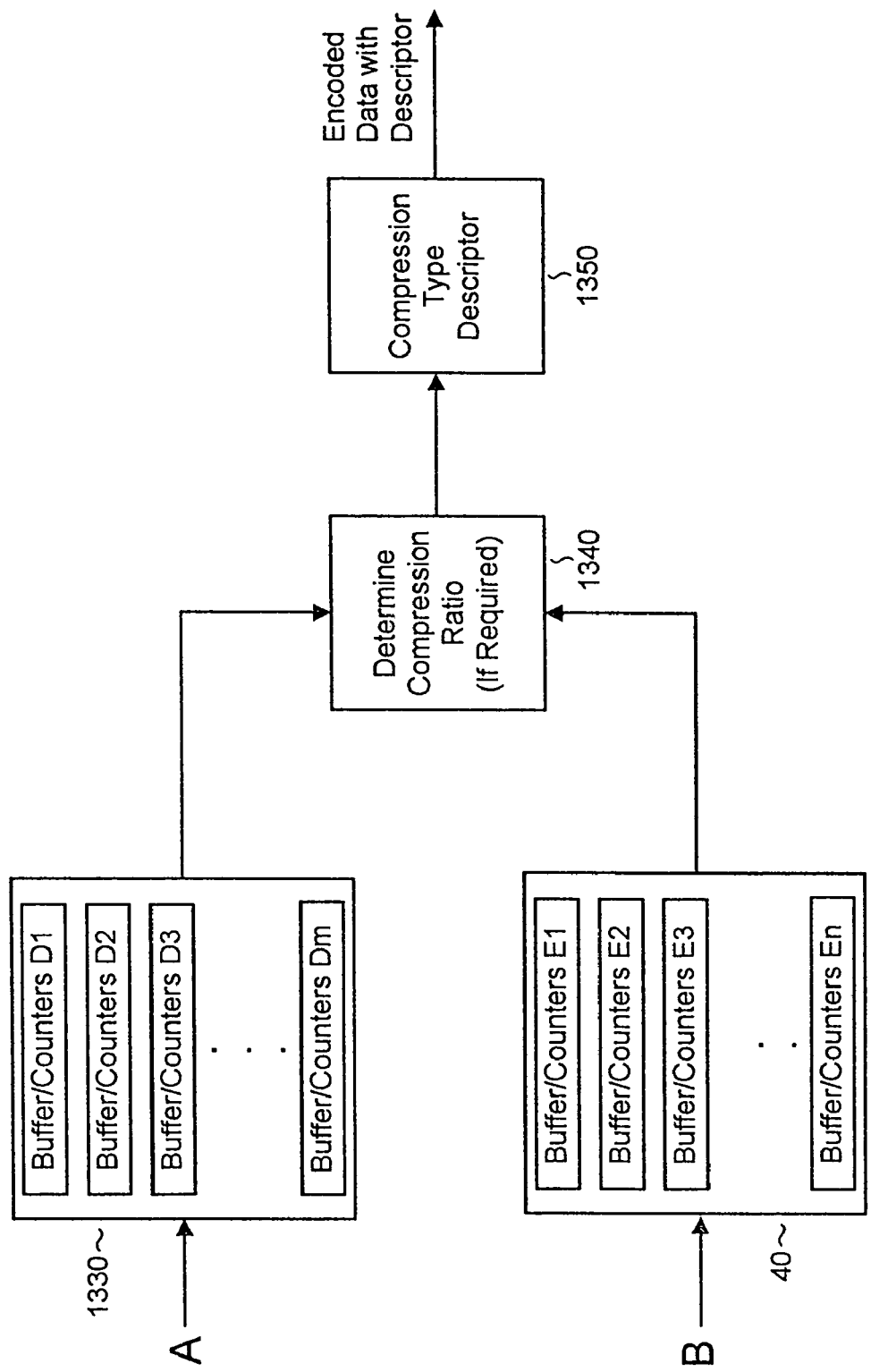
Figure 18A:
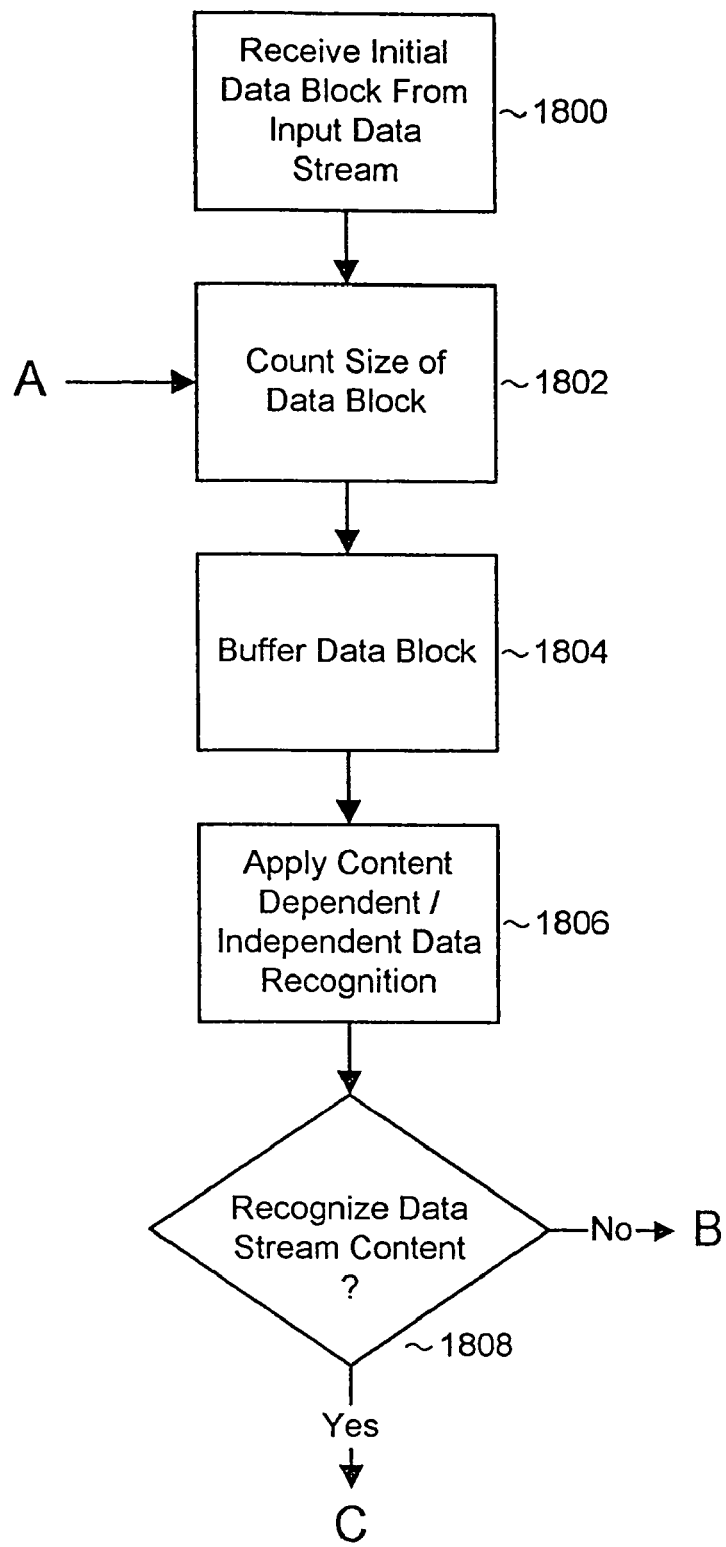
FIGS. 18a-18d comprise a flow diagram of a data compression method using both content dependent and content independent data compression, according to another aspect of the present invention.
Figure 18B:
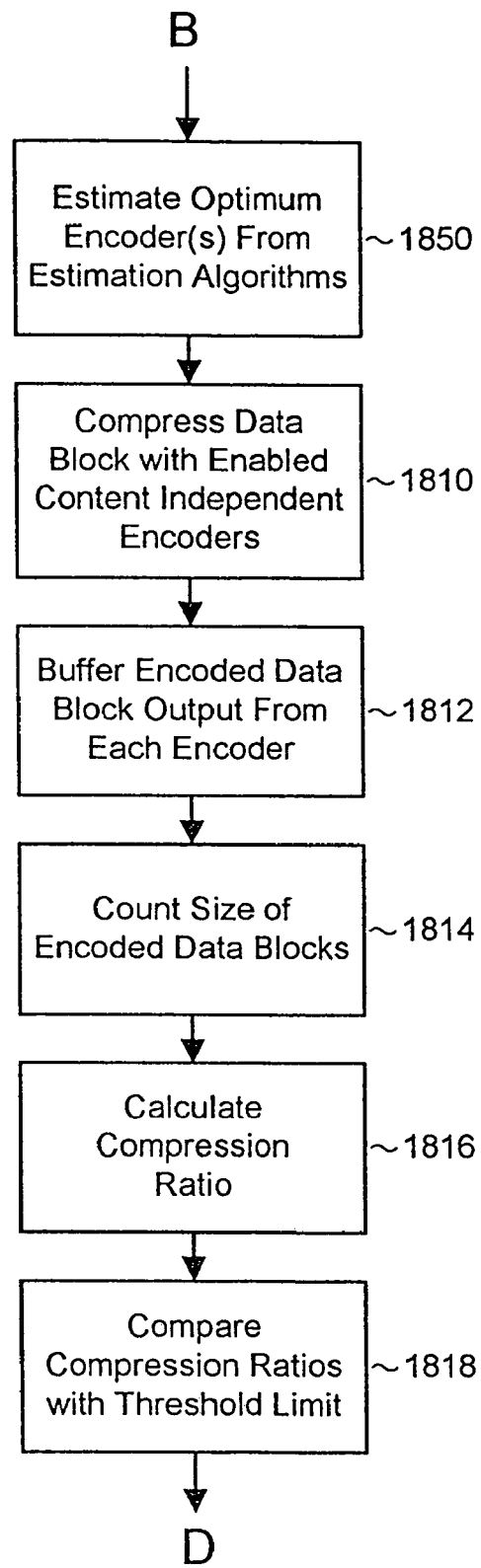
Figure 18C:
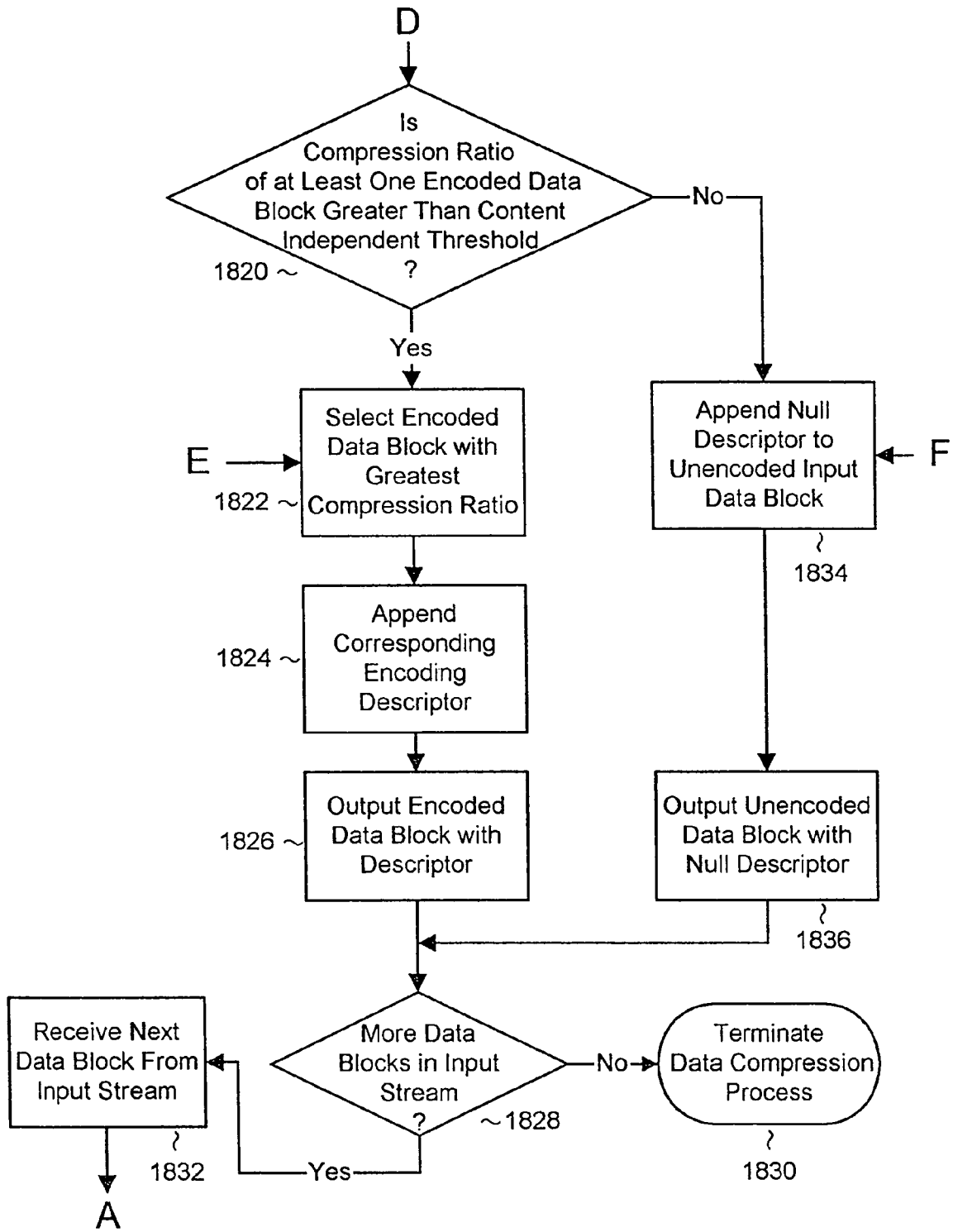
Figure 18D:
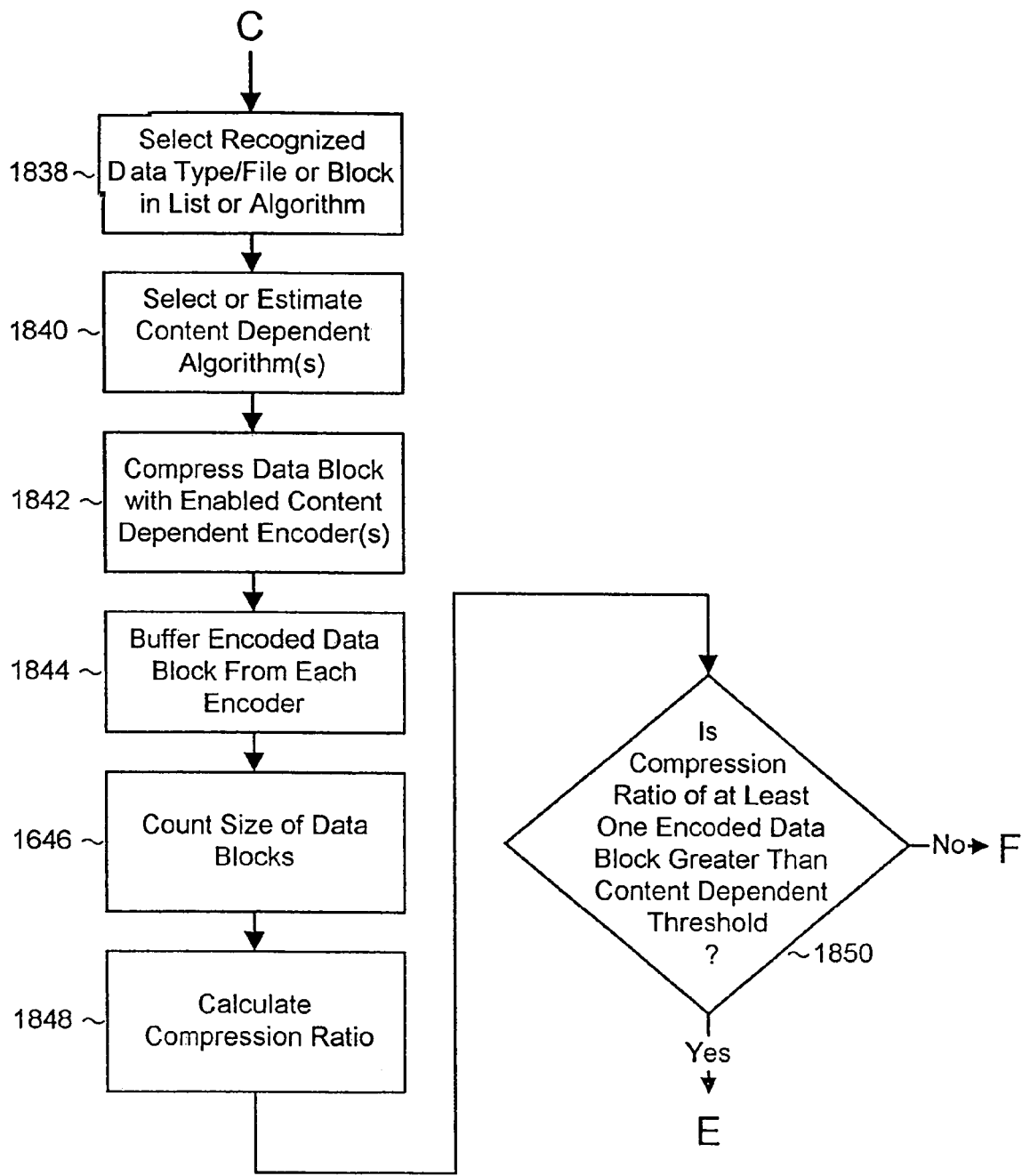

FIGS. 17*a* and 17*b* are block diagrams illustrating a data compression system employing both content independent and content dependent data compression according to another embodiment of the present invention. The system in FIGS. 17*a* and 17*b* is similar in operation to the system of FIGS. 13*a* and 13*b* in that content independent data compression is applied to a data block when the content of the data block cannot be identified or is not associable with a specific data compression algorithm. The system of FIGS. 17*a* and 17*b* additionally uses a priori estimation algorithms or look-up tables to estimate the desirability of using content independent data compression encoders and/or content dependent data compression encoders and selecting appropriate algorithms or subsets thereof based on such estimation.

More specifically, a content dependent data recognition and or estimation module 1700 is utilized to analyze the incoming data stream for recognition of data types, data structures, data block formats, file substructures, file types, or any other parameters that may be indicative of the appropriate data compression algorithm or algorithms (in serial or in parallel) to be applied. Optionally, a data file recognition list(s) or algorithm(s) 1710 module may be employed to hold associations between recognized data parameters and appropriate algorithms. If the content data compression module recognizes a portion of the data, that portion is routed to the content dependent encoder module 1320, if not the data is routed to the content independent encoder module 30. It is to be appreciated that process of recognition (modules 1700 and 1710) is not limited to a deterministic recognition, but may further comprise a probabilistic estimation of which encoders to select for compression from the set of encoders of the content dependent module 1320 or the content independent module 30. For example, a method may be employed to compute statistics of a data block whereby a determination that the locality of repetition of characters in a data stream is determined is high can suggest a text document, which may be beneficially compressed with a lossless dictionary type algorithm. Further the statistics of repeated characters and relative frequencies may suggest a specific type of dictionary algorithm. Long strings will require a wide dictionary file while a wide diversity of strings may suggest a deep dictionary. Statistics may also be utilized in algorithms such as Huffman where various character statistics will dictate the choice of different Huffman compression tables. This technique is not limited to lossless algorithms but may be widely employed with lossy algorithms. Header information in frames for video files can imply a specific data resolution. The estimator then may select the appropriate lossy compression algorithm and compression parameters (amount of resolution desired). As shown in previous embodiments of the present invention, desirability of various algorithms and now associated resolutions with lossy type algorithms may also be applied in the estimation selection process.

A mode of operation of the data compression system of FIGS. 17*a* and 17*b* will now be discussed with reference to the flow diagrams of FIGS. 18*a*-18*d*. The method of FIGS. 18*a*-18*d* use a priori estimation algorithms or look-up tables to estimate the desirability or probability of using content independent data compression encoders or content dependent data compression encoders, and select appropriate or desirable algorithms or subsets thereof based on such estimates. A data stream comprising one or more data blocks is input into the data compression system and the first data block in the stream is received (step 1800). As stated above, data compression is performed on a per data block basis. As previously stated a data block may represent any quantity of data from a single bit through a multiplicity of files or packets and may vary from block to block. Accordingly, the first input data block in the input data stream is input into the counter module 10 that counts the size of the data block (step 1802). The data block is then stored in the buffer 20 (step 1804). The data block is then analyzed on a per block or multi-block basis by the content dependent/content independent data recognition module 1700 (step 1806). If the data stream content is not recognized utilizing the recognition list(s) or algorithms(s) module 1710 (step 1808) the data is to the content independent encoder module 30. An estimate of the best content independent encoders is performed (step 1850) and the appropriate encoders are enabled and initialized as applicable. The data is then compressed by each (enabled) encoder E1 . . . En (step 1810). Upon completion of the encoding of the input data block, an encoded data block is output from each (enabled) encoder E1 . . . En and maintained in a corresponding buffer (step 1812), and the encoded data block size is counted (step 1814).

Next, a compression ratio is calculated for each encoded data block by taking the ratio of the size of the input data block (as determined by the input counter 10 to the size of each encoded data block output from the enabled encoders (step 1816). Each compression ratio is then compared with an a priori-specified compression ratio threshold (step 1818). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1820). If there are no encoded data blocks having a compression ratio that exceeds the compression ratio threshold limit (negative determination in step 1820), then the original unencoded input data block is selected for output and a null data compression type descriptor is appended thereto (step 1834). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1836).

On the other hand, if one or more of the encoded data blocks possess a compression ratio greater than the compression ratio threshold limit (affirmative result in step 1820), then the encoded data block having the greatest compression ratio is selected (step 1822). An appropriate data compression type descriptor is then appended (step 1824). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1826).

As previously stated the data block stored in the buffer 20 (step 1804) is analyzed on a per block or multi-block basis by the content dependent data recognition module 1300 (step 1806). If the data stream content is recognized or estimated utilizing the recognition list(s) or algorithms(s) module 1710 (affirmative result in step 1808) the recognized data type/file or block is selected based on a list or algorithm (step 1838) and an estimate of the desirability of using the associated content dependent algorithms can be determined (step 1840). For instance, even though a recognized data type may be associated with three different encoders, an estimation of the desirability of using each encoder may result in only one or two of the encoders being actually selected for use. The data is routed to the content dependent encoder module 1320 and compressed by each (enabled) encoder D1 . . . Dm (step 1842). Upon completion of the encoding of the input data block, an encoded data block is output from each (enabled) encoder D1 . . . Dm and maintained in a corresponding buffer (step 1844), and the encoded data block size is counted (step 1846).

Next, a compression ratio is calculated for each encoded data block by taking the ratio of the size of the input data block (as determined by the input counter 10 to the size of each encoded data block output from the enabled encoders (step 1848). Each compression ratio is then compared with an a priori-specified compression ratio threshold (step 1850). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1820). If there are no encoded data blocks having a compression ratio that exceeds the compression ratio threshold limit (negative determination in step 1820), then the original unencoded input data block is selected for output and a null data compression type descriptor is appended thereto (step 1834). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1836).

On the other hand, if one or more of the encoded data blocks possess a compression ratio greater than the compression ratio threshold limit (affirmative result in step 1820), then the encoded data block having the greatest compression ratio is selected (step 1822). An appropriate data compression type descriptor is then appended (step 1824). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1826).

After the encoded data block or the unencoded data input data block is output (steps 1826 and 1836), a determination is made as to whether the input data stream contains additional data blocks to be processed (step 1828). If the input data stream includes additional data blocks (affirmative result in step 1428), the next successive data block is received (step 1832), its block size is counted (return to step 1802) and the data compression process in repeated. This process is iterated for each data block in the input data stream. Once the final input data block is processed (negative result in step 1828), data compression of the input data stream is finished (step 1830).

It is to be appreciated that in the embodiments described above with reference to FIGS. 13-18, an a priori specified time limit or any other real-time requirement may be employed to achieve practical and efficient real-time operation.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method comprising:
   receiving a data block;
   determining whether or not a data type is identified for said data block;
   compressing, if said data type is identified, said data block with at least one encoder associated to said data type to provide a compressed data block;
   compressing, if said data type is not identified, said data block with at least one encoder associated to a non-identifiable data type to provide said compressed data block; and
   storing said compressed data block.

2. The method of claim 1, further comprising buffering said data block after said receiving of said data block and before said compressing of said data block.

3. The method of claim 1, further comprising transmitting a data compression type descriptor, indicative of the compression utilized to provide said compressed data block, with said compressed data block.

4. The method of claim 1, wherein said compressing, if a data type is not identified, occurs in real-time.

5. The method of claim 1, wherein the size of said data block is fixed.

6. The method of claim 1, wherein the size of said data block is variable.

7. The method of claim 1, wherein said at least one encoder associated with said data type is lossless.

8. The method of claim 1, wherein said at least one encoder associated to said non-identifiable data type is lossless.

9. The method of claim 1, wherein said at least one encoder associated with said data type is provided as a software module.

10. The method of claim 1, wherein at least one of said least one encoder associated with said data type is operable to be user-disabled.

11. A method comprising:
receiving a data block;
determining whether or not a data type is identified for said data block;
compressing, if said data type is identified, said data block with at least one encoder associated to said data type to provide a compressed data block;
compressing, if said data type is not identified, said data block with at least one encoder associated to a non-identifiable data type to provide said compressed data block;
storing said compressed data block;
transmitting a data compression type descriptor, indicative of the, compression utilized to provide said compressed data block, with said compressed data block;
receiving said compressed data block and said data compression type descriptor; and
decompressing said compressed data block based on said data compression type descriptor.

12. A method comprising:
receiving a first data block;
associating at least one encoder to each one of several data types;
identifying a first data type of said first data block;
compressing, if said first data type is the same as one of said several data types, said data block with said at least one encoder associated to said one of said several data types that is the same as said first data type to provide a compressed data block; and
compressing, if said first data type is not the same as one of said several data types, said data block with a default encoder to provide said compressed data block.

13. The method of claim 12, further comprising outputting said compressed data block with a data compression type descriptor indicative of the type of compression utilized to provide said compressed data block.

14. The method of claim 12, further comprising buffering said data block after said reception of said data block and before said compression of said data block.

15. The method of claim 12, wherein said default encoder is a lossless encoder.

16. The method of claim 12, wherein the size of said data block is fixed.

17. The method of claim 12, wherein the size of said data block is variable.

18. The method of claim 12, wherein said at least one encoder is provided as a software module.

19. The method of claim 12, wherein at least one of said least one encoder is operable to be user-disabled.

20. A method comprising:
receiving a first data block;
associating at least one encoder to each one of several data types;
identifying a first data type of said first data block;
compressing, if said first data type is the same as one of said several data types, said data block with said at least one encoder associated to said one of said several data types that is the same as said first data type to provide a compressed data block;
compressing, if said first data type is not the same as one of said several data types, said data block with a default encoder to provide said compressed data block;
transmitting a data compression type descriptor, indicative of the compression utilized to provide said compressed data block, with said compressed data block;
receiving said compressed data block and said data compression type descriptor; and
decompressing said compressed data block based on said data compression type descriptor.

21. A method comprising:
associating a first encoder to a first data type;
associating a second encoder to a second data type;
receiving a data block;
determining a data type of said data block;
compressing said data block with said first encoder if said data type is the same as said first data type;
compressing said data block with said second encoder if said data type is the same as said second data type; and
compressing said data block with a third encoder if said data type cannot be identified.

22. The method of claim 21, further comprising:
associating a fourth encoder to a third data type;
compressing said data block with said fourth encoder if said data type is the same as said first data type.

23. The method of claim 21, further comprising compressing said data block with a fourth encoder if said data type is the same as said first data type.

24. The method of claim 21, wherein the size of said data block is fixed.

25. The method of claim 21, wherein the size of said data block is variable.

26. The method of claim 21, wherein said first encoder is provided as a software module.

27. The method of claim 21, wherein said first encoder is operable to be user-disabled.

28. A method comprising:
associating at least one of several first encoders to each one of several data types;
associating at least one second encoder to a non-identifiable data type;
receiving a data block from an input stream of data;
determining whether a data type is identified for said data block;
compressing, if a data type is identified as being associated to said at least one of several first encoders, said data block with said at least one of several first encoders associated to said data type to provide a compressed data block;
compressing, if a data type is not identified, said data block with said at least one second encoder to provide said compressed data block; and
transmitting said compressed data block with a data compression type descriptor indicative of the compression utilized to provide said compressed data block.

29. The method of claim 28, wherein said at least one of said several first encoders is operable to be user-disabled.

30. The method of claim 28, wherein the size of said data block is fixed.

31. The method of claim 28, wherein the size of said data block is variable.

32. The method of claim 28, wherein said at least one of said several first encoders is provided as a software module.

33. A method comprising:
providing several compression techniques;
receiving a data block;
determining whether or not to compress said data block and, if said data block is to be compressed, determining which one of said several compression techniques to utilize to compress said data block and compressing said data block with said determined one of said several compression techniques to provide a compressed data block;
providing a data compression type descriptor with said compressed data block, wherein said data compression type descriptor is either indicative of said determination not to compress or said determined one of said several compression techniques; and
transmitting said data compression type descriptor with said compressed data block.

34. The method of claim 33, wherein the size of said data block is fixed.

35. The method of claim 33, wherein the size of said data block is variable.

36. The method of claim 33, wherein said determined one of said several compression techniques is provided as a software module.

37. A method comprising:
processing a data stream, having a plurality of data blocks, on a first system, wherein said processing comprises:
transmitting a first one of said plurality of data blocks of said data stream in compressed form with a first descriptor associated with a first compression technique, wherein said first one of said plurality of data blocks was identified as a first type of data and said first compression technique is associated with said first type of data;
transmitting a second compressed one of said plurality of data blocks with a second descriptor associated with a second compression technique, wherein said second one of said plurality of data blocks was not identified as having a data type; and
transmitting an third one of said plurality of data blocks in received form with a third descriptor indicative of no compression technique.

38. The method of claim 37, wherein said received form is an uncompressed form.

39. The method of claim 37, wherein said received form is a compressed form.

40. The method of claim 37, wherein the size of each one of said plurality of data blocks is fixed.

41. The method of claim 37, wherein said first compression technique comprises compression with a plurality of encoders.

42. The method of claim 37, wherein the size of each one of said plurality of data blocks is variable.

43. The method of claim 37, further comprising receiving said first, second, and third ones of said plurality of data blocks on a second system.

44. The method of claim 37, further comprising receiving said first, second, and third ones of said plurality of data blocks on a second system and decompressing said first, second, and third ones of said plurality of data blocks on said second system.

45. The method of claim 37, further comprising receiving said first, second, and third ones of said plurality of data blocks on a second system and decompressing said first one of said plurality of data blocks based on said first descriptor on said second system, decompressing said second one of said plurality of data blocks based on said second descriptor on said second system, and decompressing said third one of said plurality of data blocks based on said third descriptor on said second system.

* * * * *

(12) INTER PARTES REEXAMINATION CERTIFICATE (465th)
United States Patent
Fallon

(10) Number: US 7,378,992 C1
(45) Certificate Issued: *Oct. 4, 2012

(54) CONTENT INDEPENDENT DATA COMPRESSION METHOD AND SYSTEM

(75) Inventor: James J. Fallon, Armonk, NY (US)

(73) Assignee: Realtime Data, LLC, New York, NY (US)

Reexamination Request:
No. 95/000,478, May 21, 2009

Reexamination Certificate for:
Patent No.: 7,378,992
Issued: May 27, 2008
Appl. No.: 11/400,533
Filed: Apr. 8, 2006

(*) Notice: This patent is subject to a terminal disclaimer.

Related U.S. Application Data

(63) Continuation of application No. 10/668,768, filed on Sep. 22, 2003, now Pat. No. 7,161,506, which is a continuation of application No. 10/016,355, filed on Oct. 29, 2001, now Pat. No. 6,624,761, which is a continuation-in-part of application No. 09/705,446, filed on Nov. 3, 2000, now Pat. No. 6,309,424, which is a continuation of application No. 09/210,491, filed on Dec. 11, 1998, now Pat. No. 6,195,024.

(51) Int. Cl.
*H03M 7/34* (2006.01)

(52) U.S. Cl. .................. 341/51; 341/65; 341/67; 341/87
(58) Field of Classification Search ................. None
See application file for complete search history.

(56) References Cited

To view the complete listing of prior art documents cited during the proceeding for Reexamination Control Number 95/000,478, please refer to the USPTO's public Patent Application Information Retrieval (PAIR) system under the Display References tab.

*Primary Examiner* — Christina Y Leung

(57) ABSTRACT

Systems and methods for providing fast and efficient data compression using a combination of content independent data compression and content dependent data compression. In one aspect, a method for compressing data comprises the steps of: analyzing a data block of an input data stream to identify a data type of the data block, the input data stream comprising a plurality of disparate data types; performing content dependent data compression on the data block, if the data type of the data block is identified, performing content independent data compression on the data block, if the data type of the data block is not identified.

At the time of issuance and publication of this certificate, the patent remains subject to pending reexamination control number 95/001,928 filed Mar. 2, 2012. The claim content of the patent may be subsequently revised if a reexamination certificate issues from the reexamination proceeding.

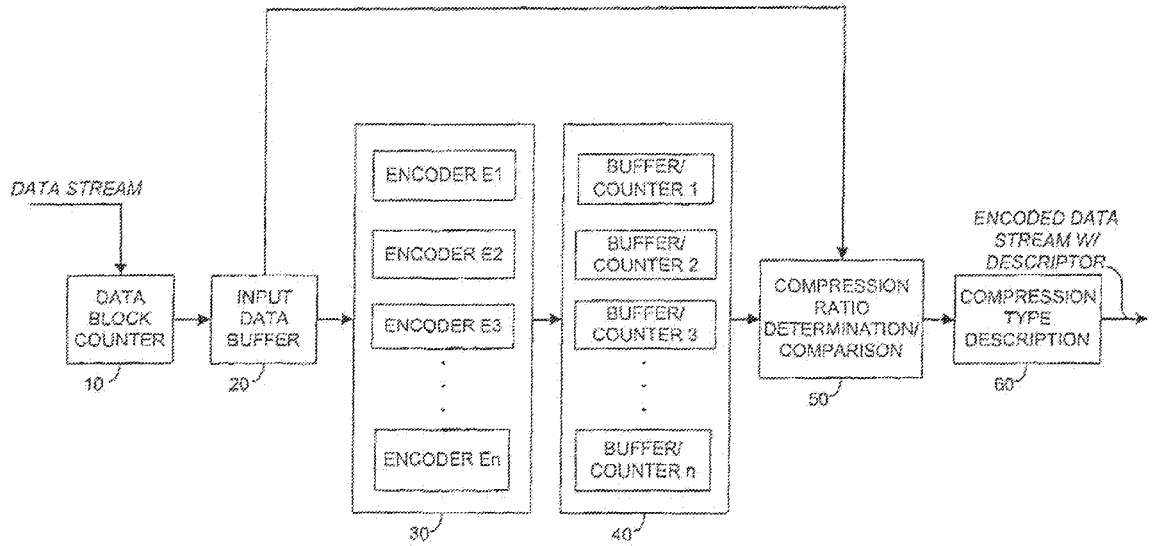

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

The patentability of claims 2, 4 and 8 is confirmed.

Claims 1, 3, 7, 9-15, 18-21, 26-29, 32, 33 and 36 are cancelled.

Claims 5, 6, 16, 17, 22-25, 30, 31, 34, 35 and 37-45 were not reexamined.

* * * * *

INTER PARTES REEXAMINATION CERTIFICATE (785th)
United States Patent
Fallon

(10) Number: US 7,378,992 C2
(45) Certificate Issued: *Jan. 8, 2014

(54) CONTENT INDEPENDENT DATA COMPRESSION METHOD AND SYSTEM

(75) Inventor: James J. Fallon, Armonk, NY (US)

(73) Assignee: Realtime Data, LLC, New York, NY (US)

Reexamination Request:
No. 95/001,928, Mar. 2, 2012

Reexamination Certificate for:
Patent No.: 7,378,992
Issued: May 27, 2008
Appl. No.: 11/400,533
Filed: Apr. 8, 2006

Reexamination Certificate C1 7,378,992 issued Oct. 4, 2012

( * ) Notice: This patent is subject to a terminal disclaimer.

Related U.S. Application Data

(63) Continuation of application No. 10/668,768, filed on Sep. 22, 2003, now Pat. No. 7,161,506, which is a continuation of application No. 10/016,355, filed on Oct. 29, 2001, now Pat. No. 6,624,761, which is a continuation-in-part of application No. 09/705,446, filed on Nov. 3, 2000, now Pat. No. 6,309,424, which is a continuation of application No. 09/210,491, filed on Dec. 11, 1998, now Pat. No. 6,195,024.

(51) Int. Cl.
*H03M 7/34* (2006.01)

(52) U.S. Cl.
USPC ............. 341/51; 341/65; 341/67; 341/87

(58) Field of Classification Search
None
See application file for complete search history.

(56) References Cited

To view the complete listing of prior art documents cited during the proceeding for Reexamination Control Number 95/001,928, please refer to the USPTO's public Patent Application Information Retrieval (PAIR) system under the Display References tab.

*Primary Examiner* — Christina Y Leung

(57) ABSTRACT

Systems and methods for providing fast and efficient data compression using a combination of content independent data compression and content dependent data compression. In one aspect, a method for compressing data comprises the steps of: analyzing a data block of an input data stream to identify a data type of the data block, the input data stream comprising a plurality of disparate data types; performing content dependent data compression on the data block, if the data type of the data block is identified, performing content independent data compression on the data block, if the data type of the data block is not identified.

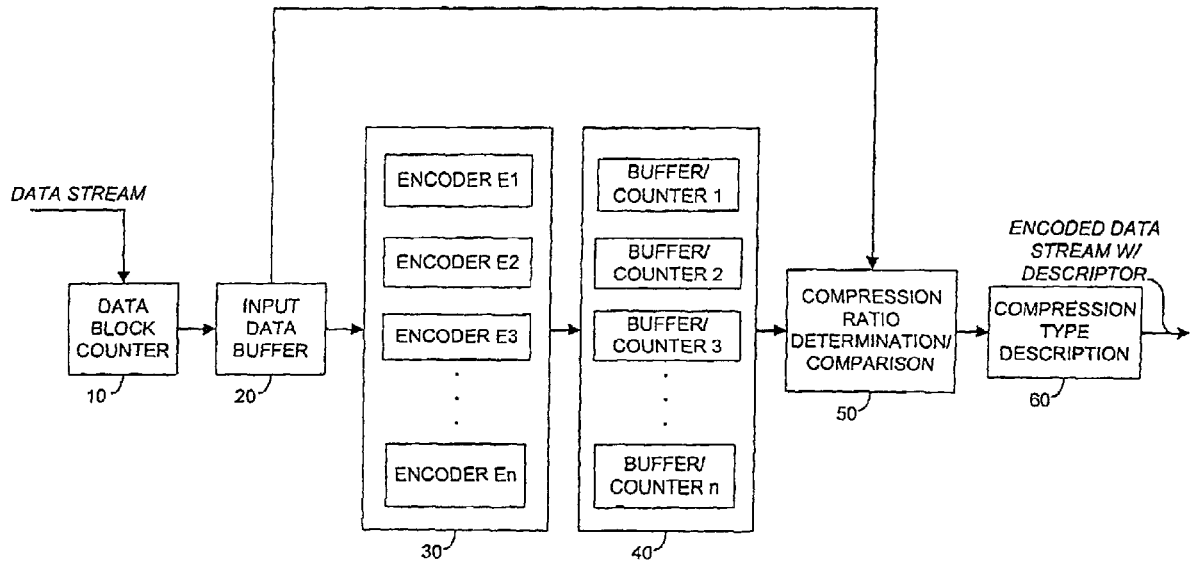

INTER PARTES
REEXAMINATION CERTIFICATE
ISSUED UNDER 35 U.S.C. 316

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3, 7, 9-15, 18-21, 26-29, 32, 33 and 36 were previously cancelled.

Claim 35 is determined to be patentable as amended.

New claims 46-51 are added and determined to be patentable.

Claims 2, 4, 5, 6, 8, 16, 17, 22-25, 30, 31, 34 and 37-45 were not reexamined.

35. The method of claim 33, [wherein the size of said data block is variable] *further comprising:*
*analyzing data within the data block to identify one or more data types of the data within the data block,*
*wherein the analyzing of the data within the data block to identify one or more data types excludes analyzing based only on a descriptor that is indicative of the data type of the data within the data block.*

*46. A computer implemented method comprising:*
*receiving a data block;*
*analyzing data within the data block to determine whether or not a data type is identified for the data within the data block;*
*compressing, if said data type is identified, said data block with at least one encoder associated with said data type to provide a compressed data block;*
*compressing, if said data type is not identified, said data block with at least one encoder associated with a non-identifiable data type to provide said compressed data block; and*
*storing said compressed data block,*
*wherein the analyzing of the data within the data block to identify one or more data types excludes analyzing based only on a descriptor that is indicative of the data type of the data within the data block.*

*47. A computer implemented method comprising:*
*receiving a data block;*
*analyzing data within the data block to determine whether or not a data type is identified for the data within the data block;*
*compressing, if said data type is identified, said data block with at least one encoder associated with said data type to provide a compressed data block;*
*compressing, if said data type is not identified, said data block with at least one encoder associated with a non-identifiable data type to provide said compressed data block;*
*storing said compressed data block;*
*transmitting a data compression type descriptor, indicative of the compression utilized to provide said compressed data block, with said compressed data block;*
*receiving said compressed data block and said data compression type descriptor; and*
*decompressing said compressed data block based on said data compression type descriptor,*
*wherein the analyzing of the data within the data block to identify one or more data types excludes analyzing based only on a descriptor that is indicative of the data type of the data within the data block.*

*48. A computer implemented method comprising:*
*receiving a data block;*
*associating at least one encoder to each one of several data types;*
*analyzing data within the data block to identify a first data type of the data within the data block;*
*compressing, if said first data type is the same as one of said several data types, said data block with said at least one encoder associated with said one of said several data types that is the same as said first data type to provide a compressed data block; and*
*compressing, if said first data type is not the same as one of said several data types, said data block with a default encoder to provide said compressed data block,*
*wherein the analyzing of the data within the data block to identify one or more data types excludes analyzing based only on a descriptor that is indicative of the data type of the data within the data block.*

*49. A computer implemented method comprising:*
*receiving a data block;*
*associating at least one encoder to each one of several data types;*
*analyzing data within the data block to identify a first data type of the data within the data block;*
*compressing, if said first data type is the same as one of said several data types, said data block with said at least one encoder associated with said one of said several data types that is the same as said first data type to provide a compressed data block;*
*compressing, if said first data type is not the same as one of said several data types, said data block with a default encoder to provide said compressed data block;*
*transmitting a data compression type descriptor, indicative of the compression utilized to provide said compressed data block, with said compressed data block;*
*receiving said compressed data block and said data compression type descriptor; and*
*decompressing said compressed data block based on said data compression type descriptor,*
*wherein the analyzing of the data within the data block to identify one or more data types excludes analyzing based only on a descriptor that is indicative of the data type of the data within the data block.*

*50. A computer implemented method comprising:*
*associating a first encoder to a first data type;*
*associating a second encoder to a second data type;*
*receiving a data block;*
*analyzing data within the data block to determine a data type of the data within the data block;*
*compressing said data block with said first encoder if said data type is the same as said first data type;*
*compressing said data block with said second encoder if said data type is the same as said second data type; and*
*compressing said data block with a third encoder if said data type cannot be identified,*
*wherein the analyzing of the data within the data block to identify one or more data types excludes analyzing based only on a descriptor that is indicative of the data type of the data within the data block.*

51. A computer implemented method comprising:
- associating at least one of several first encoders to each one of several data types;
- associating at least one second encoder to a non-identifiable data type;
- receiving a data block from an input stream of data;
- analyzing data within the data block to determine whether a data type is identified for the data within the data block;
- compressing, if a data type is identified as being associated with said at least one of several first encoders, said data block with said at least one of several first encoders associated with said data type to provide a compressed data block;
- compressing, if a data type is not identified, said data block with said at least one second encoder to provide said compressed data block; and
- transmitting said compressed data block with a data compression type descriptor indicative of the compression utilized to provide said compressed data block,
- wherein the analyzing of the data within the data block to identify one or more data types excludes analyzing based only on a descriptor that is indicative of the data type of the data within the data block.

* * * * *